US009478762B2

(12) United States Patent
Pan et al.

(10) Patent No.: US 9,478,762 B2
(45) Date of Patent: Oct. 25, 2016

(54) ORGANIC ELECTROLUMINESCENT DEVICE

(75) Inventors: Junyou Pan, Frankfurt am Main (DE); Niels Schulte, Kelkheim (DE); Joachim Kaiser, Darmstadt (DE); Herwig Buchholz, Frankfurt am Main (DE); Susanne Heun, Bad Soden (DE)

(73) Assignee: Merck Patent GmbH (DE)

( * ) Notice: Subject to any disclaimer, the term of this patent is extended or adjusted under 35 U.S.C. 154(b) by 81 days.

(21) Appl. No.: 13/996,066

(22) PCT Filed: Nov. 24, 2011

(86) PCT No.: PCT/EP2011/005916
§ 371 (c)(1),
(2), (4) Date: Jun. 20, 2013

(87) PCT Pub. No.: WO2012/084114
PCT Pub. Date: Jun. 28, 2012

(65) Prior Publication Data
US 2013/0277617 A1    Oct. 24, 2013

(30) Foreign Application Priority Data

Dec. 23, 2010   (DE) ........................ 10 2010 055 901

(51) Int. Cl.
| H01L 51/00 | (2006.01) |
|---|---|
| H01L 51/50 | (2006.01) |
| C09K 11/06 | (2006.01) |
| H05B 33/14 | (2006.01) |

(52) U.S. Cl.
CPC ........... *H01L 51/5012* (2013.01); *C09K 11/06* (2013.01); *H01L 51/004* (2013.01); *H01L 51/0039* (2013.01); *H01L 51/0043* (2013.01); *H01L 51/0085* (2013.01); *H01L 51/0094* (2013.01); *H05B 33/14* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1092* (2013.01); *C09K 2211/185* (2013.01); *H01L 51/0067* (2013.01); *H01L 51/5016* (2013.01); *H01L 51/5024* (2013.01); *Y02B 10/10* (2013.01); *Y02E 10/549* (2013.01)

(58) Field of Classification Search
CPC ............................... H01L 51/00; H01L 51/50
USPC ................ 252/500, 301.35, 301.16; 313/483
See application file for complete search history.

(56) References Cited

U.S. PATENT DOCUMENTS

| 8,610,110 | B2* | 12/2013 | Yersin | C09K 11/06 257/40 |
|---|---|---|---|---|
| 9,281,483 | B2* | 3/2016 | Knowles | C07F 15/0033 |
| 9,287,519 | B2* | 3/2016 | Jaeger | H01L 51/0078 |
| 9,334,260 | B2* | 5/2016 | Parham | C07D 403/10 |
| 9,349,954 | B2* | 5/2016 | D'Andrade | H01L 51/0025 |
| 9,349,960 | B2* | 5/2016 | Heun | C08G 61/02 |
| 9,356,245 | B2* | 5/2016 | Djurovich | H01L 51/0085 |
| 2003/0091862 | A1* | 5/2003 | Tokito et al. | 428/690 |
| 2006/0093852 | A1* | 5/2006 | Marsitzky et al. | 428/690 |
| 2006/0105201 | A1* | 5/2006 | Lee | H01L 27/3211 428/690 |
| 2006/0149022 | A1* | 7/2006 | Parham et al. | 528/102 |
| 2006/0199943 | A1* | 9/2006 | Falcou et al. | 528/422 |
| 2006/0208221 | A1* | 9/2006 | Gerhard et al. | 252/301.16 |
| 2007/0015006 | A1* | 1/2007 | Lee | C09K 11/06 428/690 |
| 2007/0231598 | A1* | 10/2007 | Busing et al. | 428/690 |
| 2007/0247061 | A1* | 10/2007 | Adamovich | H01L 51/5016 313/504 |
| 2007/0281182 | A1* | 12/2007 | Schulte et al. | 428/690 |
| 2008/0102312 | A1* | 5/2008 | Parham et al. | 428/704 |
| 2008/0103279 | A1* | 5/2008 | Heun et al. | 528/8 |
| 2008/0169756 | A1* | 7/2008 | Son et al. | 313/504 |
| 2009/0167166 | A1* | 7/2009 | Bach et al. | 313/504 |
| 2010/0033082 | A1* | 2/2010 | Liu | H01L 51/0007 313/504 |
| 2013/0099171 | A1* | 4/2013 | Breuning et al. | 252/500 |
| 2016/0072082 | A1* | 3/2016 | Brooks | H01L 51/0085 257/40 |
| 2016/0126486 | A1* | 5/2016 | Scharner | H01L 51/5203 257/40 |
| 2016/0149158 | A1* | 5/2016 | Lang | H01L 51/524 257/40 |

FOREIGN PATENT DOCUMENTS

| JP | 2005-015508 A | 1/2005 |
|---|---|---|
| JP | 2007-059939 A | 3/2007 |
| JP | 2007-070619 A | 3/2007 |
| WO | WO-2009093033 A1 | 7/2009 |
| WO | WO 2010015306 A1 * | 2/2010 |

OTHER PUBLICATIONS

Lei Wang et al., "Highly Efficient and Color-Stable Deep-Blue Oranic Light-Emitting Diodes Based on a Solution-Processible Dendrimer", Advanced Materials, 2009, 21, 4854-4858.*

(Continued)

*Primary Examiner* — Douglas McGinty
(74) *Attorney, Agent, or Firm* — Drinker Biddle & Reath LLP

(57) ABSTRACT

The present invention relates to a mixture comprising two different compounds A and B, each of which contain emitter units, where at least one of the compounds is a polymer. The present invention furthermore relates to a non-conjugated polymer or dendrimer which contains two emitting units covalently bonded as polymer building blocks, to the use of the mixture, the polymer or dendrimer in electronic devices, to electronic devices comprising the mixture, the polymer or dendrimer, and to a formulation comprising the mixture, the polymer or dendrimer in a solvent.

24 Claims, No Drawings

(56) References Cited

OTHER PUBLICATIONS

Li, Jian, et al., "Red Phosphorescent Polymer Light-Emitting Diodes Based on Iridium Complex and Poly[(9,9-Dioctylfluorene)-*alt*-(Pyridine)]", Japanese Journal of Applied Physics, vol. 45, No. 6A, (2006), pp. 5232-5237.

International Search Report for PCT/EP2011/005916 mailed Jan. 25, 2012.

* cited by examiner

ORGANIC ELECTROLUMINESCENT DEVICE

CROSS-REFERENCE TO RELATED APPLICATIONS

This application is a national stage application (under 35 U.S.C. §371) of PCT/EP2011/005916, filed Nov. 24, 2011, which claims benefit of German Application No. 10 2010 055 901.6, filed Dec. 23, 2010 which are both incorporated by reference.

The present invention relates to a mixture comprising two different compounds A and B, each of which contain emitter units, where at least one of the compounds is a polymer. The present invention furthermore relates to a non-conjugated polymer or dendrimer which contains two emitting units covalently bonded as polymer building blocks, to the use of the mixture, the polymer or dendrimer in electronic devices, to electronic devices comprising the mixture, the polymer or dendrimer, and to a formulation comprising the mixture, the polymer or dendrimer in a solvent.

Electronic devices which comprise organic, organometallic and/or polymeric semiconductors are being used ever more frequently in commercial products or are just about to be introduced onto the market. Examples which may be mentioned here are organic-based charge-transport materials (in general triarylamine-based hole transporters) in photocopiers and organic or polymeric light-emitting diodes (OLEDs or PLEDs) in display devices or organic photoreceptors in copiers. Organic solar cells (O-SCs), organic field-effect transistors (O-FETs), organic thin-film transistors (O-TFTs), organic integrated circuits (O-ICs), organic optical amplifiers or organic laser diodes (O-lasers) are also at an advanced stage of development and may achieve major importance in the future.

Many of these electronic and opto-electronic devices have, irrespective of the particular application, the following general layer structure, which can be adapted to the particular application:
(1) substrate,
(2) electrode, frequently metallic or inorganic, but also made from organic or polymeric conductive materials;
(3) charge-injection layer or interlayer for compensation of unevenness of the electrode ("planarisation layer"), frequently made from a conductive, doped polymer,
(4) organic semiconductors,
(5) possibly a further charge-transport or charge-injection or charge-blocking layer,
(6) counterelectrode, materials as mentioned under (2),
(7) encapsulation.

The above arrangement represents the general structure of an opto-electronic device, where various layers can be combined, so that, in the simplest case, an arrangement comprising two electrodes, between which an organic layer is located, results. The organic layer in this case fulfils all functions, including the emission of light. A system of this type is described, for example, in WO 90/13148 A1 based on poly(p-phenylenes).

A problem which arises in a "three-layer system" of this type is, however, the lack of a possibility to optimise the individual constituents in different layers with respect to their properties, as is solved easily, for example, in the case of SMOLEDs ("small-molecule OLEDs") through a multi-layered structure. A "small molecule OLED" consists, for example, of one or more organic hole-injection layers, hole-transport layers, emission layers, electron-transport layers and electron-injection layers as well as an anode and a cathode, where the entire system is usually located on a glass substrate. An advantage of a multilayered structure of this type consists in that various functions of charge injection, charge transport and emission can be divided into the various layers and the properties of the respective layers can thus be modified separately.

The layers in SMOLED devices are usually applied by vapour deposition in a vacuum chamber. However, this process is complex and thus expensive and is unsuitable, in particular, for large molecules, such as, for example, polymers, but also for many small molecules, which frequently decompose under the vapour-deposition conditions.

The application of layers from solution is therefore advantageous, where both small molecules and also oligomers or polymers can be processed from solution.

In the last decade, a major increase in performance occurred with respect phosphorescence in SMOLEDs since the first report by Forrest in Nature (London) (1998), 395, P151. In particular, the so-called "double doping" approach is a highly promising way of improving the overall performance of the red phosphorescent OLED. Thus, for example, Stephen R. Forrest et al. in J. Appl. Phys. (02), 92, p 87. report on an efficient polymer (PHOLED) in which poly (9-vinylcarbazole) (PVK) as host compound is doped with one or more phosphorescent cyclometallated Ir (III) complexes.

US 2002125818 has already published an electron- or hole-transporting host which are doped with two different phosphorescent compounds. US 20070247061A1 discloses a host which is doped with two phosphorescent compounds, where there is at least one voltage at which a luminous density of at least 10 $cd/m^2$ is produced from the OLED comprising the second compound with an emission efficiency of at least 95 percent.

Most of the disclosures relating to so-called "double doping" are based either on SMOLEDs which can be applied by vapour deposition or PVK (polyvinylcarbazole) processed from solution, where at least three components are present in the emitting layer (the two interacting emitter compounds and a matrix material (host)). The problems arising here are on the one hand the relatively short lifetime of devices in which PVK is used and on the other hand the fact that, on use of three components or use of a mixture for the desired solution-based mass production, phase separation of the components takes place, which impairs the desired energy transfer (by the Förster or Dexter mechanism).

A further major problem in the case of solution-based SMOLEDs is film formation. The materials used are frequently very readily soluble in a solvent and can be applied to the substrate, for example, by ink-jet printing. However, many materials do not exhibit good film-formation properties, caused by the high mobility of the small molecules in the solvent.

The object of the present invention therefore consisted in the provision of a novel mixture and a novel polymer or dendrimer, both containing two emitter molecules, which are capable of ensuring energy transfer in an efficient manner, and thus increasing the emission efficiency, and at the same time also achieving better solubility of the components for a solution-processed production process and better film-formation properties.

The term "energy transfer" in the present invention is taken to mean a physical process in which energy is transferred from an excited dye (donor) to a second dye (acceptor) with no radiation, as described, for example, by Förster (see T. Förster, "Zwischenmolekulare Energiewanderung und Fluoreszenz" [Intermolecular Energy Migration and Fluorescence], Ann. Physic. (1948), 437, 55) or Dexter (see D. L. Dexter, J. Chem. Phys., (1953) 21, 836).

The said object has been achieved by the provision of a mixture which comprises the following:
(a) a compound A which contains at least one phosphorescent emitter unit or consists of the at least one phosphorescent unit, and
(b) a compound B which contains at least one emitting unit or consists of the emitting unit,
where at least one of the two compounds A and B is a polymer or dendrimer.

The compounds A and B preferably have different emission bands.

An emitting unit in the present invention is taken to mean either a fluorescent emitter unit or a phosphorescent emitter unit.

A fluorescent emitter unit in the sense of this invention is in general terms a unit which emits light, preferably in the visible region, from an excited singlet state.

A phosphorescent emitter is generally taken to mean a unit which exhibits luminescence from an excited state having relatively high spin multiplicity, i.e. a spin state >1, such as, for example, from an excited triplet state (triplet emitter), from an MLCT mixed state or a quintet state (quintet emitter). Suitable phosphorescent emitter units are, in particular, compounds which emit light, preferably in the visible region, on suitable excitation and in addition contain at least one atom having atomic numbers >38 and <84, particularly preferably >56 and <80. Preferred phosphorescence emitters are compounds which contain copper, molybdenum, tungsten, rhenium, ruthenium, osmium, rhodium, iridium, palladium, platinum, silver, gold or europium, in particular compounds which contain iridium, platinum or copper. Examples of the emitters described above are revealed by the applications WO 00/7065, WO 01/41512, WO 2002/02714, WO 2002/15645, EP 1191613, EP 1191612, EP 1191614, WO 2005/033244. In general, all phosphorescent complexes as are used in accordance with the prior art for phosphorescent OLEDs and as are known to the person skilled in the art in the area of organic electroluminescence are suitable.

In the present application, the term polymer is taken to mean both polymeric compounds and also oligomeric compounds. The polymeric compounds according to the invention preferably have 10 to 10000, particularly preferably 20 to 5000 and in particular 50 to 2000 recurring units. The oligomeric compounds according to the invention preferably have 3 to 9 structural units. The branching factor of the polymers here is between 0 (linear polymer, no branching points) and 1 (fully branched dendrimer).

The term "dendrimer" in the present application is intended to be taken to mean a highly branched compound which is built up from a multifunctional centre (core), to which branched monomers are bonded in a regular structure, giving a tree-like structure. Both the centre and also the monomers can adopt any desired branched structures here which consist both of purely organic units and also organometallic compounds or coordination compounds. "Dendrimer" here is generally intended to be understood as described, for example, by M. Fischer and F. Vögtle (Angew. Chem., Int. Ed. 1999, 38, 885).

In the present invention, either the phosphorescent emitter unit of compound A or the emitter unit of compound B can serve as donor, and the respective other unit can serve as acceptor in the sense of the said energy transfer. In accordance with the invention, the emitter unit which emits at shorter wavelength is referred to as donor, and the emitter unit which emits at longer wavelength is referred to as acceptor.

The polymer or dendrimer of the mixture according to the invention preferably contains at least one recurring unit selected from the group of the host materials.

A recurring unit in the present application is taken to mean a unit in the polymer which originates from a monomer which was employed for the polymerisation to give the polymer.

Host materials in the present invention are taken to mean materials which, in an emission layer of an electronic device, serve as matrix material for a dopant, which is preferably then one of compounds A or B which does not represent the said polymer.

Suitable matrix materials in electronic devices are known to the person skilled in the art and can be used for the purposes of the present invention. In the present invention, these are in the form of a recurring unit, i.e. all compounds which are suitable as matrix material are divalent compounds which have two bonds to in each case a further recurring unit of the polymer. Either two hydrogen atoms of these compounds are not present and the bonds to the further recurring units occur at this position (matrix compound is part of the polymer backbone), or one hydrogen atom of these compounds is not present and a radical which contains a vinyl group is located at this position in the monomer employed for the polymerisation, so that the polymer is a polyvinyl polymer (matrix compound in the side chain of the polymer). In the first case, the polymerisation preferably takes place by Suzuki coupling, Buchwald coupling, Yamamoto coupling, in the second case preferably by acid- or free-radical-induced chain reaction of the vinyl units.

Suitable matrix materials in electronic devices for the polymer present in the mixture according to the invention are, for example, CBP (N,N-biscarbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584, JP 2005/347160), ketones (for example in accordance with WO 2004/093207 or in accordance with DE 102008033943), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with the unpublished application DE 102009023155.2 and DE 102009031021.5), diazaphosphole derivatives (for example in accordance with the unpublished application DE 102009022858.6), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, the 8-hydroxyquinoline complexes may also contain triarylaminophenol ligands (US 2007/0134514 A1), metal complex polysilane compounds and thiophene, benzothiophene and dibenzothiophene derivatives.

It is furthermore preferred for the polymer of the mixture according to the invention to contain two or more of the above-mentioned matrix materials as recurring units, in particular recurring units from an electron-transporting material and a hole-transporting material, as described below.

Examples of preferred carbazole derivatives are mCP (=1,3-N,N-dicarbazolebenzene (=9,9'-(1,3-phenylene)bis-9H-carbazole), formula (116), US 2005/0249976), CDBP (=9,9'-(2,2'-dimethyl[1,1'-biphenyl]-4,4'-diyl)bis-9H-carbazole), 1,3-bis(N,N'-dicarbazole)benzene (=1,3-bis(carbazol-9-yl)benzene), 3,5-di(9H-carbazol-9-yl)biphenyl and the further compounds having the formulae (1) to (5) depicted below (see also US 2007/0128467, US 2007/0128467).

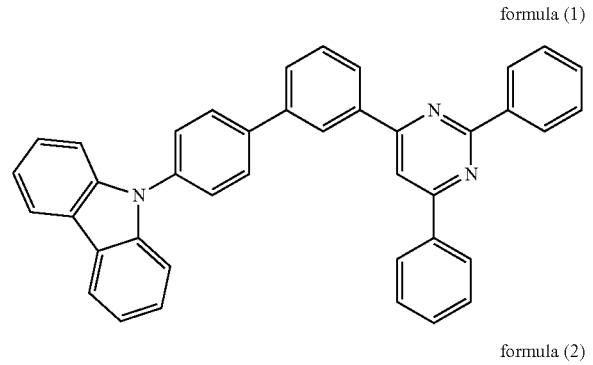

Further preferred matrix materials in the sense of the present invention are Si tetraaryl compounds as disclosed, for example, in US 004/209115, US 2004/0209116 US 2007/0087219, US 2007/0087219 and H. Gilman, E. A. Zuech, Chemistry & Industry (London, United Kingdom), 1960, 120, particular preference is given here to the compounds of the formulae (6) to (13).

formula (8)
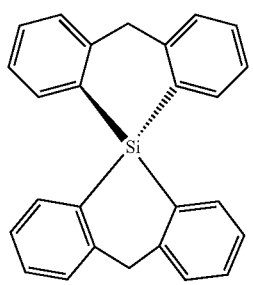
formula (9)
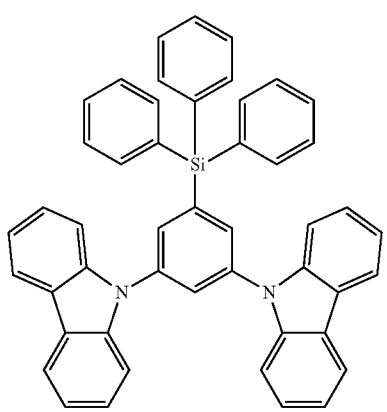
formula (10)
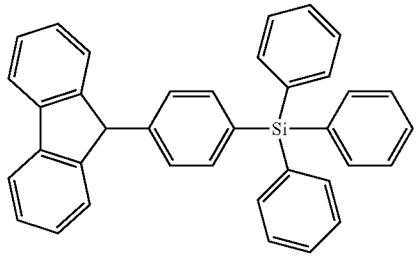
formula (11)
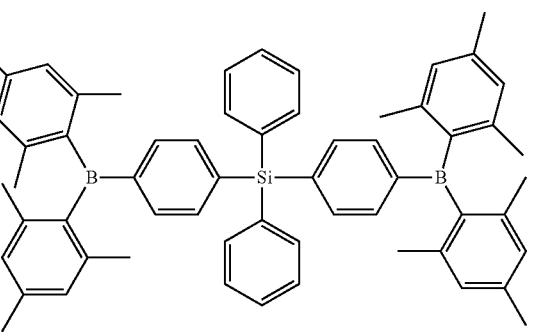
formula (12)
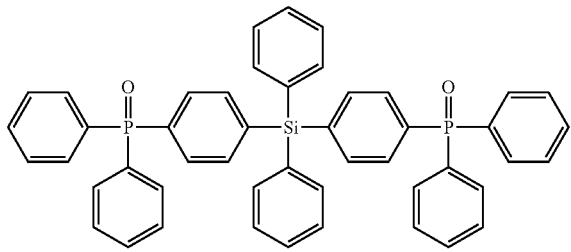
formula (13)
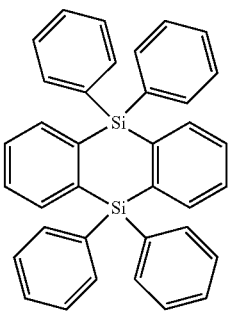
Particularly preferred matrix materials for phosphorescent dopants are compounds in EP 652273, DE 102009022858.6, DE 102009023155.2, WO 2007/063754 and WO 2008/056746, in particular the compounds of the formulae (14) to (17).
formula (14)
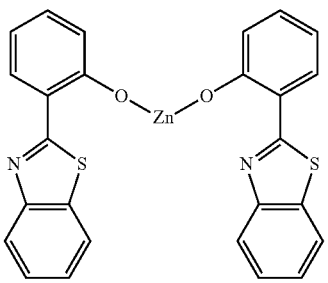
formula (15)
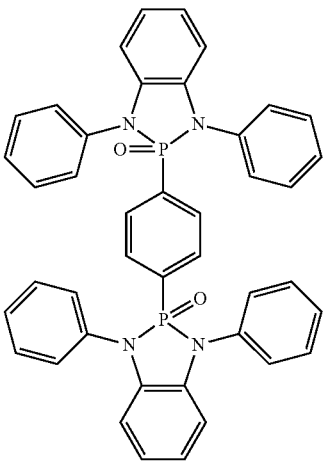
formula (16)
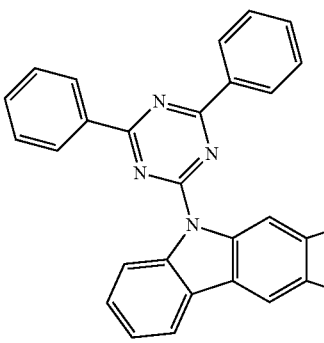

formula (17)

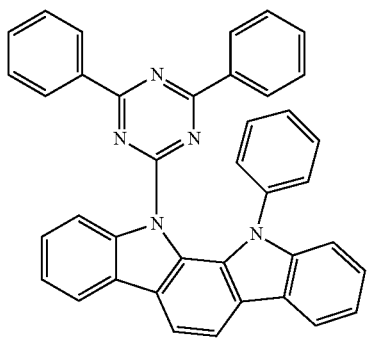

Since, as mentioned above, the matrix materials are present as recurring units in the polymer of the mixture according to the invention, the said compounds are divalent units in which two hydrogen atoms are not present and bonds to the further recurring units of the polymer are present at each of these positions.

Furthermore, it is preferred in accordance with the invention for the following vinyl group-containing monomers to be employed for the polymerisation to give the polymer of the mixture according to the invention:

formula (18)

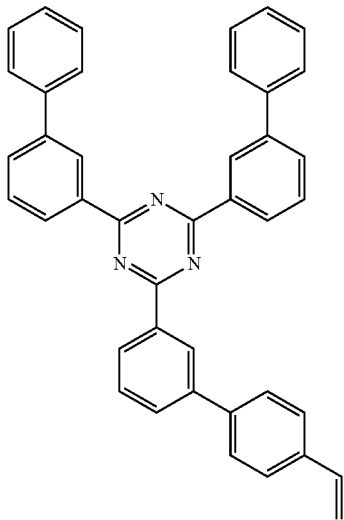

formula (19)

formula (20)

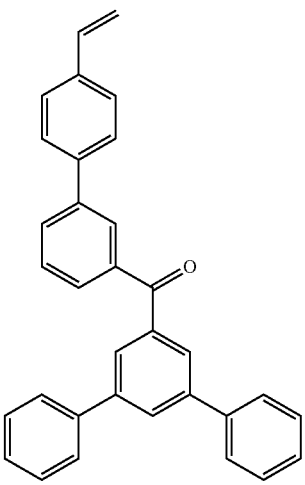

formula (21)

Furthermore, it is preferred in accordance with the invention for the following monomers to be employed for the Suzuki polymerisation to give the polymer of the mixture according to the invention:

formula (22)

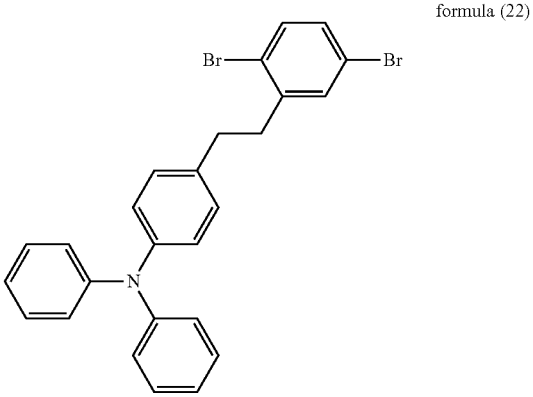

formula (23)

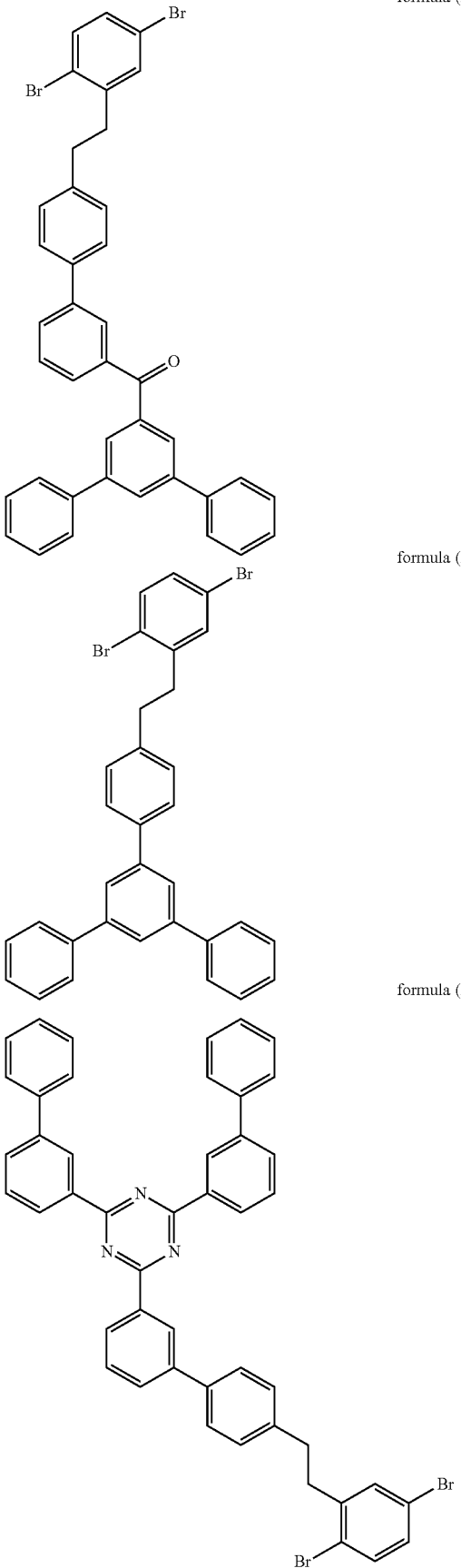

formula (24)

formula (25)

formula (26)

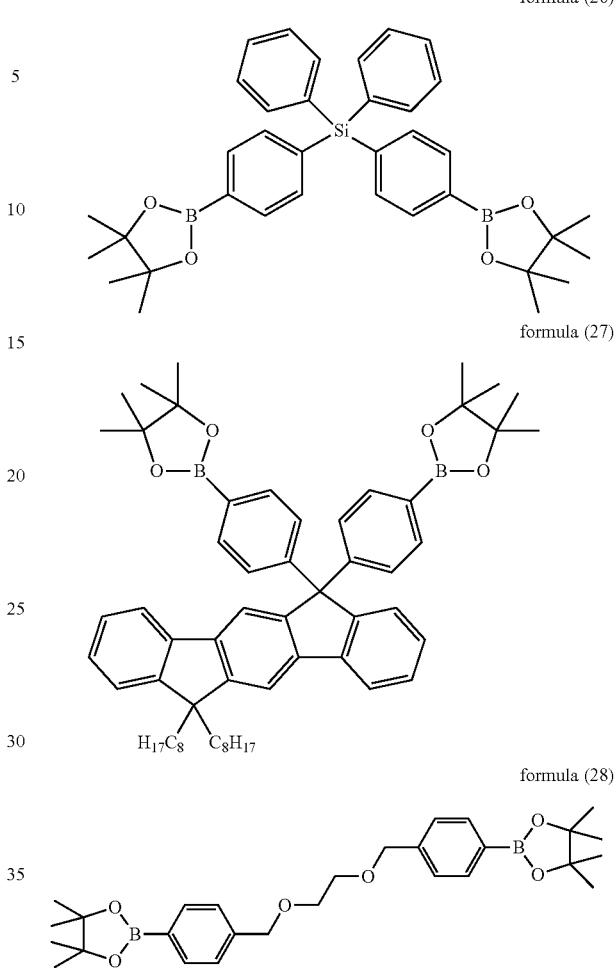

formula (27)

formula (28)

In an embodiment of the present invention, the at least one emitting unit of compound B of the mixture according to the invention is a fluorescent emitter unit. The fluorescent emitter unit encompasses the following compounds: mono- or polycyclic aromatic or heteroaromatic ring systems having 5 to 60 aromatic ring atoms or also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl) arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Furthermore, it is preferred for the fluorescent emitter unit to be selected from the group consisting of arylamines, indenofluorenamines, indenofluorenediamines and derivatives thereof.

In principle, any organic fluorescent emitter compound which is known to the person skilled in the art in the area of organic light-emitting diodes or organic light-emitting electrochemical cells can be employed in accordance with the invention as emitting unit of compound B.

The fluorescent emitter unit is preferably selected from the following: styrylamine derivatives, indenofluorene derivatives, polyaromatic compounds, anthracene derivatives, tetracene derivatives, xanthene derivatives, perylene derivatives, phenylene derivatives, fluorene derivatives, arylpyrene derivatives, arylenevinylene derivatives, rubrene derivatives, coumarine derivatives, rhodamine derivatives, quinacridone derivatives, dicyanomethylenepyran derivatives, thiopyran, polymethine derivatives, pyrylium and thiapyrylium salts, periflanthene derivatives, indenoperylene derivatives, bis(azinyl)imineboron compounds, bis(azinyl)methine compounds, carbostyryl compounds, monostyrylamines, distyrylamines, tristyrylamines, tetrastyrylamines, styrylphosphines, styryl ethers, arylamines, indenofluorenamines and indenofluorenediamines, benzoindenofluorenamines, benzoindenofluorenediamines, dibenzoindenofluorenamines, dibenzoindenofluorenediamines, substituted or unsubstituted tristilbenamines, distyrylbenzene and distyrylbiphenyl derivatives, triarylamines, naphthalene derivatives, anthracene derivatives, tetracene derivatives, fluorene derivatives, periflanthene derivatives, indenoperylene derivatives, phenanthrene derivatives, perylene derivatives, pyrene derivatives, chrysene derivatives, decacyclene derivatives, coronene derivatives, tetraphenylcyclopentadiene derivatives, pentaphenylcyclopentadiene derivatives, fluorene derivatives, spirofluorene derivatives, pyran derivatives, oxazone derivatives, benzoxazole derivatives, benzothiazole derivatives, benzimidazole derivatives, pyrazine derivatives, cinnamic acid esters, diketopyrrolopyrrole derivatives, and acridone derivatives.

Blue fluorescent emitter units can preferably be polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imineboron compounds (US 2007/0092753 A1), bis(azinyl)methene compounds and carbostyryl compounds.

Furthermore preferred blue fluorescent emitter units can be those which are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

A monostyrylamine here is a compound which contains one substituted or unsubstituted styryl group and at least one, preferably aromatic, amine. A distyrylamine is preferably a compound which contains two substituted or unsubstituted styryl groups and at least one, preferably aromatic, amine. A tristyrylamine is preferably a compound which contains three substituted or unsubstituted styryl groups and at least one, preferably aromatic, amine. A tetrastyrylamine is preferably a compound which contains four substituted or unsubstituted styryl groups and at least one, preferably aromatic, amine. The corresponding phosphines and ethers which can be employed in accordance with the invention are defined analogously to the amines. For the purposes of this invention, arylamine or aromatic amine denotes a compound which contains three substituted or unsubstituted aromatic or heteroaromatic ring systems bonded directly to a nitrogen atom. At least one of these aromatic or heteroaromatic ring systems can be a condensed ring. Preferred examples thereof are aromatic anthracenamines, aromatic anthracenediamines, aromatic pyrenamines, aromatic pyrenediamines, aromatic chrysenamines and aromatic chrysenediamines. An aromatic anthracenamine can be a compound in which one diarylamino group is bonded directly to an anthracene group, preferably in position 9. An aromatic anthracenediamine can be a compound in which two diarylamino groups are bonded directly to an anthracene group, preferably in positions 9 and 10. Aromatic pyrenamines, pyrenediamines, chrysenamines and chrysenediamines are defined analogously thereto, in which the diarylamine groups on the pyrene are preferably bonded in position 1 or in positions 1 and 6.

Furthermore preferred fluorescent emitter units are indenofluorenamines and indenofluorenediamines, for example in accordance with WO 2006/122630, benzoindenofluorenamines and benzoindenofluorenediamines, for example in accordance with WO 2008/006449, and dibenzoindenofluorenamines and dibenzoindenofluorenediamines, for example in accordance with WO 2007/140847.

Examples of further fluorescent emitter units from the class of the styrylamines which can be employed in accordance with the invention are substituted or unsubstituted tristilbenamines or those described in WO 2006/000388, WO 2006/058737, WO 2006/000389, WO 2007/065549 and WO 2007/115610. Distyrylbenzene and distyrylbiphenyl derivatives are described in U.S. Pat. No. 5,121,029. Further styrylamines can be found in US 2007/0122656 A1. Particularly preferred styrylamines and triarylamines are the compounds of the formulae 53 to 58 and those which are disclosed in U.S. Pat. No. 7,250,532 B2, DE 102005058557 A1, CN 1583691 A, JP 08053397 A, U.S. Pat. No. 6,251,531 B1, and US 2006/210830 A.

formula (29)

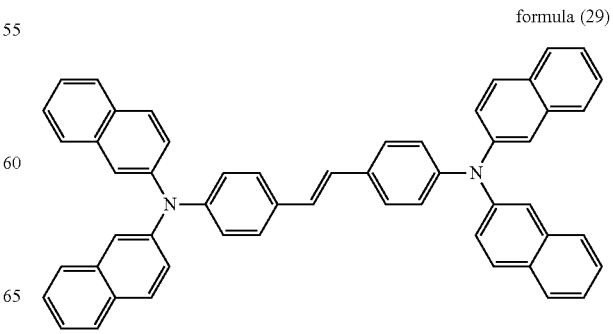

formula (30)

formula (31)

formula (32)

formula (33)

formula (34)

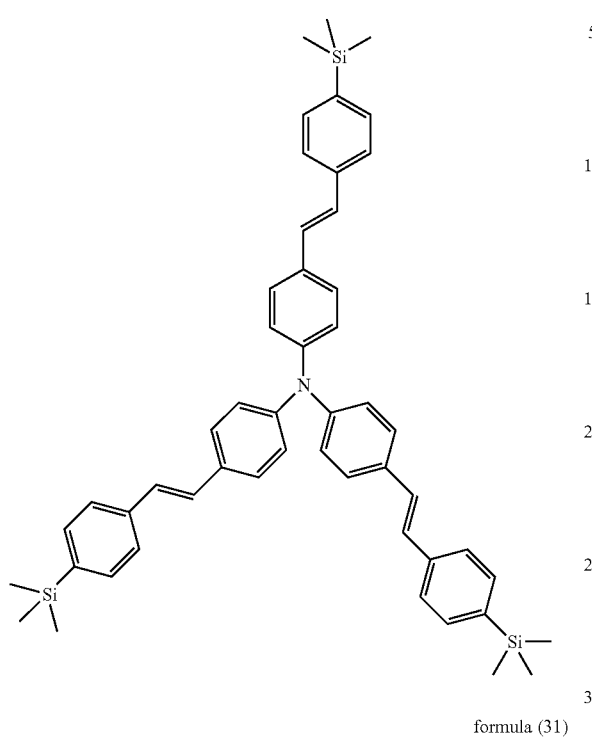

Furthermore preferred fluorescent emitter units can be taken from the group of the triarylamines as disclosed in EP 1957606 A1 and US 2008/0113101 A1.

Furthermore preferred fluorescent emitter units can be selected from the derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, the 9,10-substituted anthracenes, such as, for example, 9,10-diphenylanthracene and 9,10-bis(phenylethynyl)anthracene, are preferred. 1,4-Bis(9'-ethynylanthracenyl)benzene may also be preferred as fluorescent emitter compound.

Suitable fluorescent emitter units are furthermore the structures depicted in the following table, and the structures disclosed in JP 06/001973, WO 2004/047499, WO 2006/098080, WO 2007/065678, US 2005/0260442 and WO 2004/092111.

formula (35)
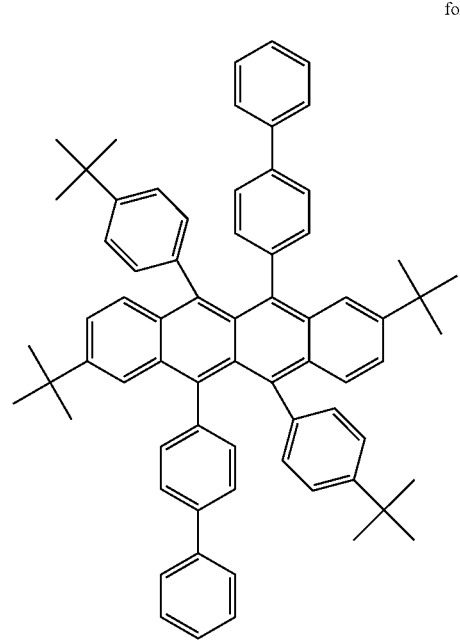
formula (38)
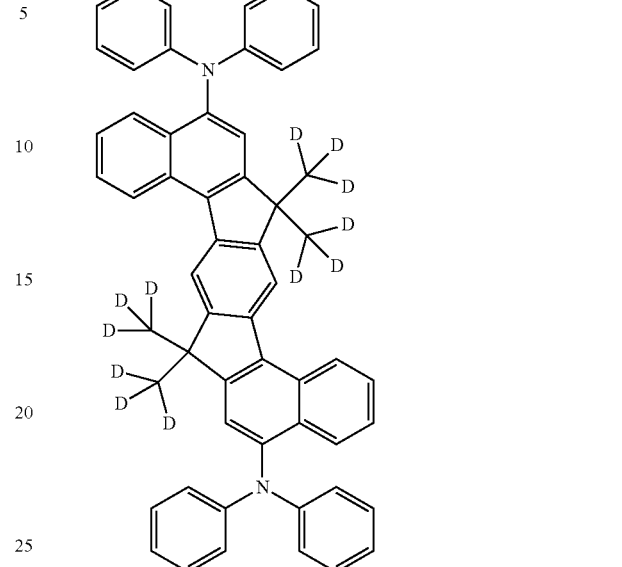
formula (36)
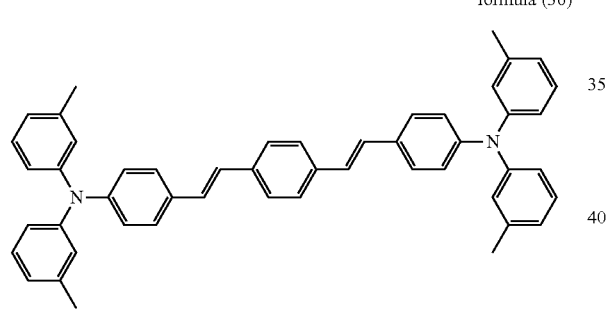
formula (39)
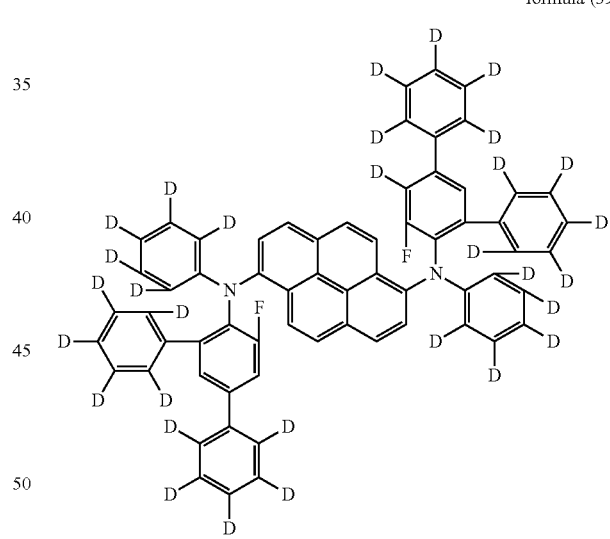
formula (37)
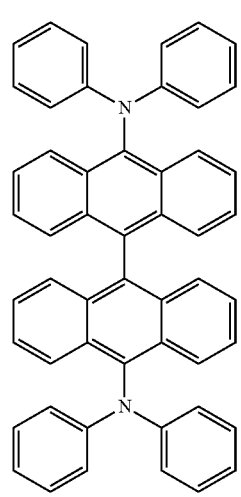
formula (40)
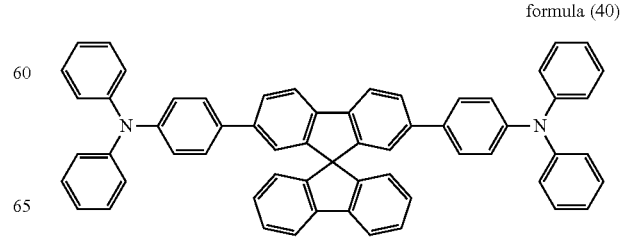

formula (41)
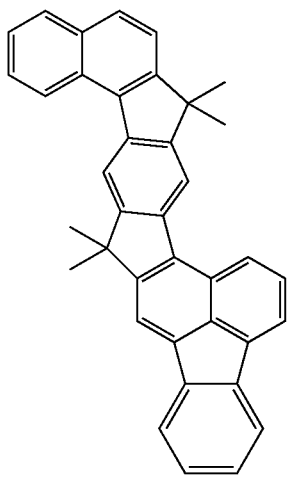
formula (44)
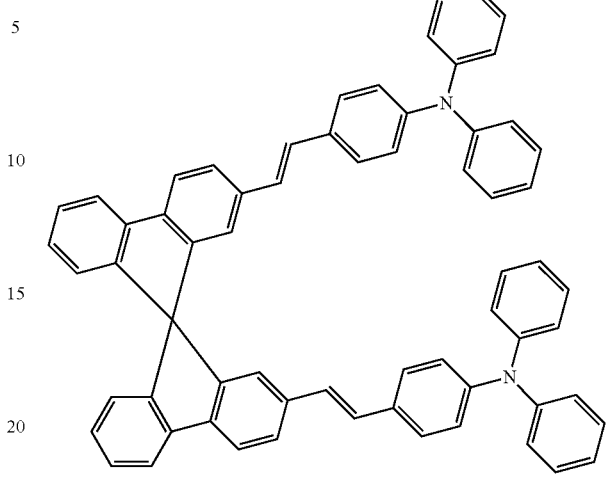
formula (42)
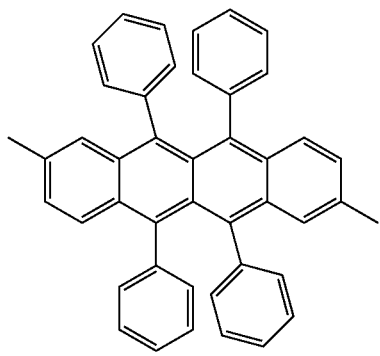
formula (45)
formula (43)
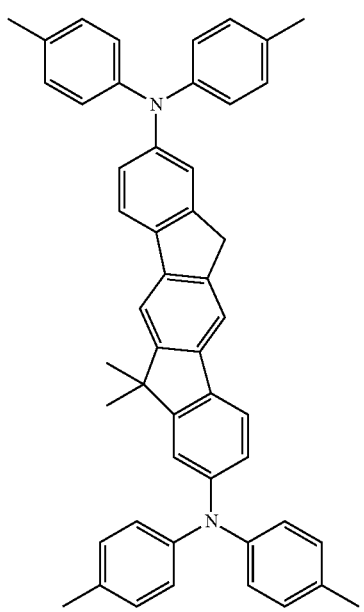
formula (46)
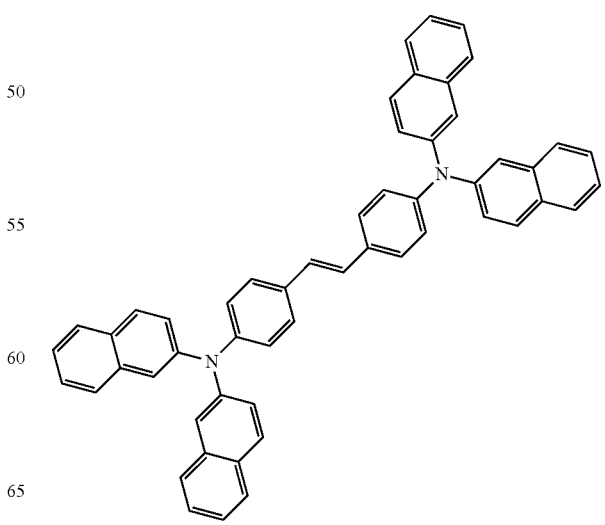

formula (47)
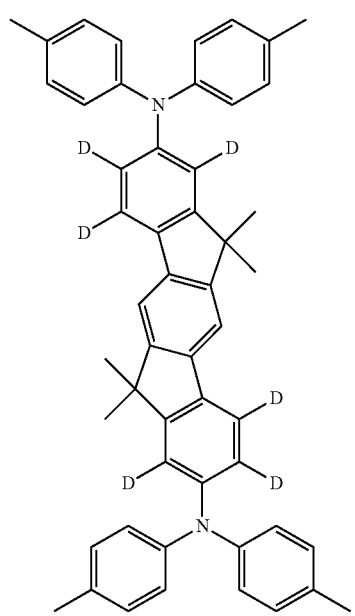
formula (48)
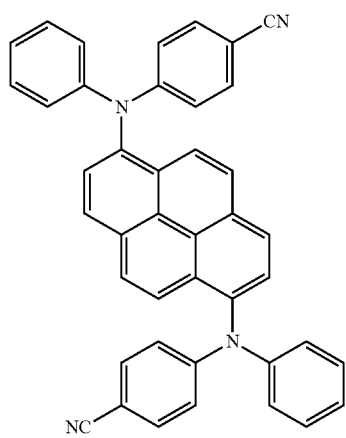
formula (49)
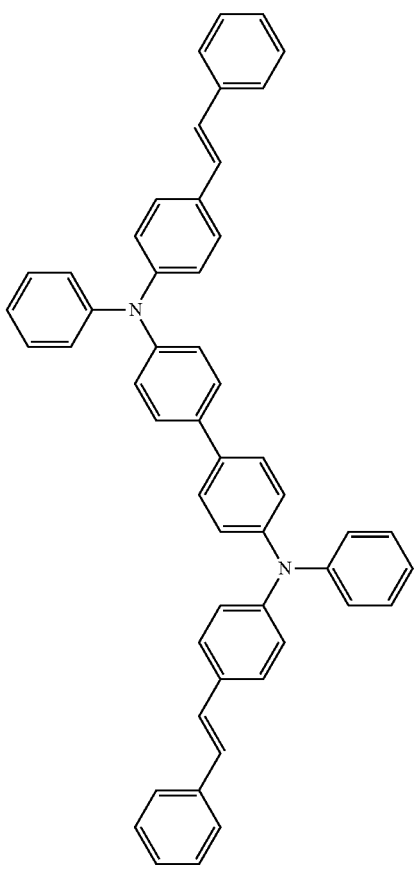
formula (50)

formula (51)
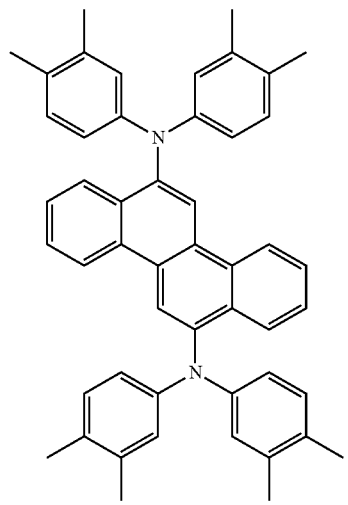
formula (52)
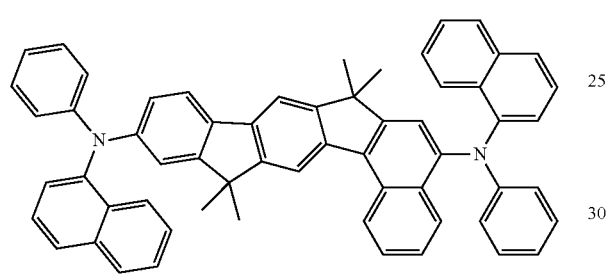
formula (53)
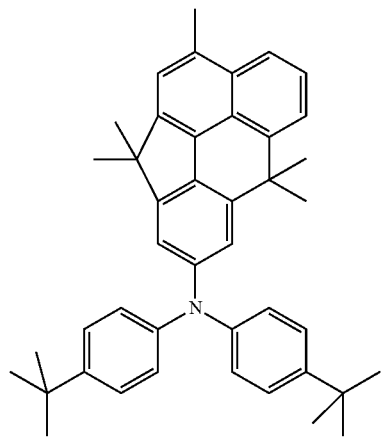
formula (54)
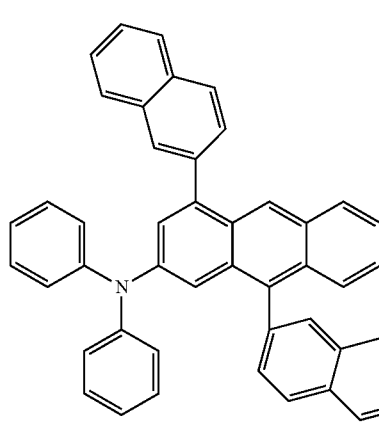
formula (55)
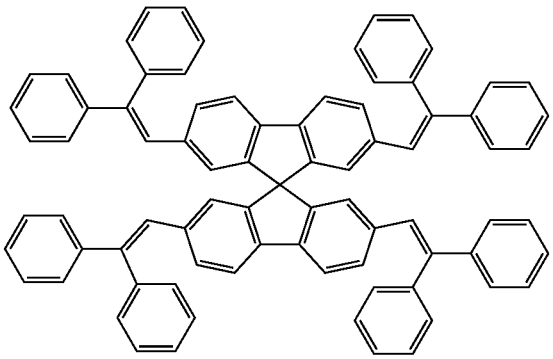
formula (56)
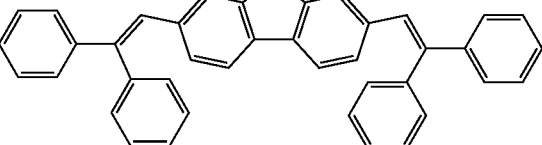
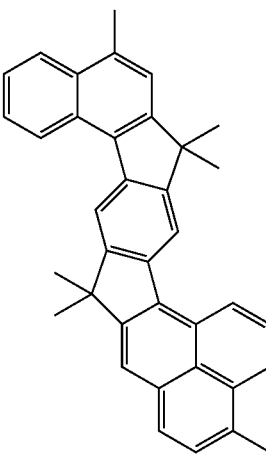
formula (57)
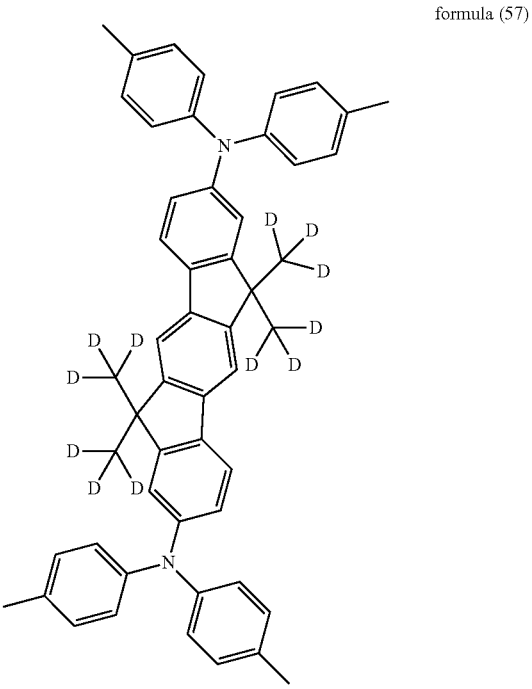

formula (58)
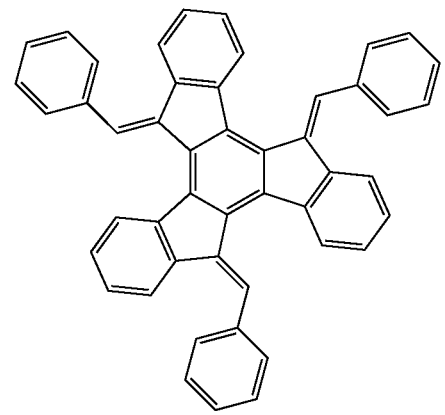
formula (59)
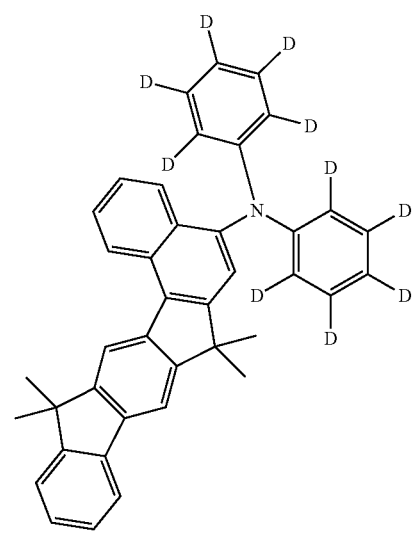
formula (60)
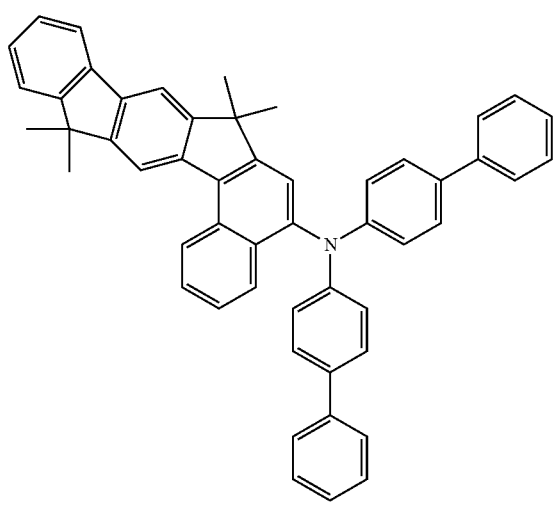
formula (61)
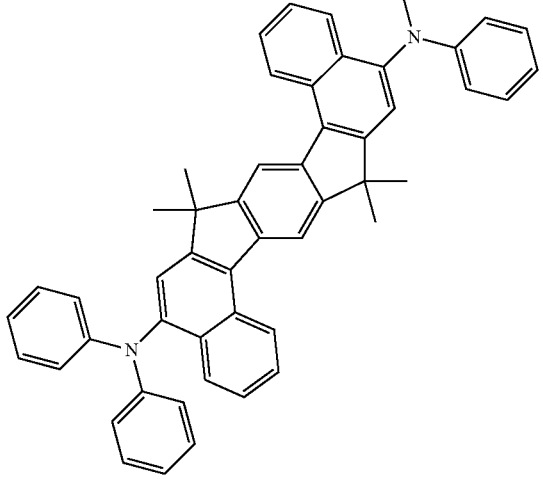
formula (62)
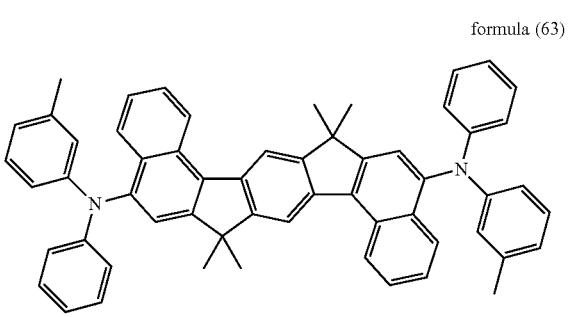
formula (63)
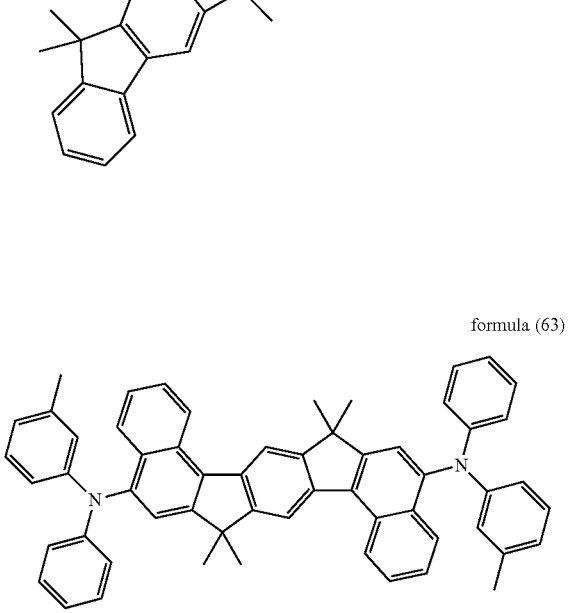

formula (64)
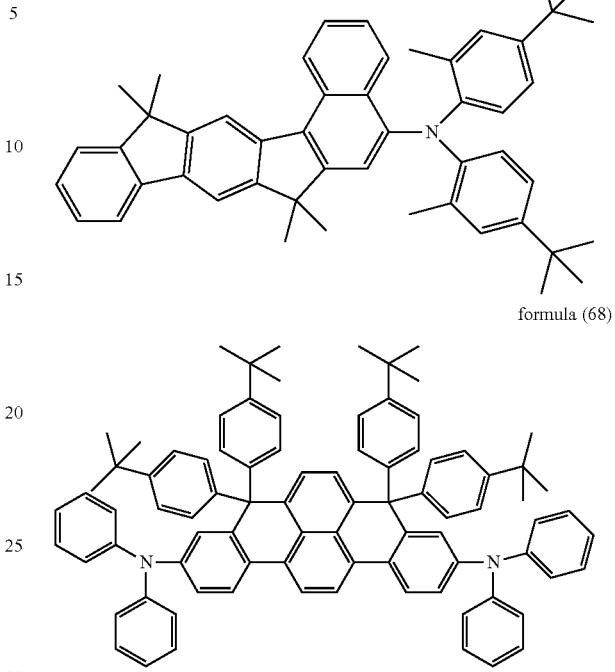
formula (65)
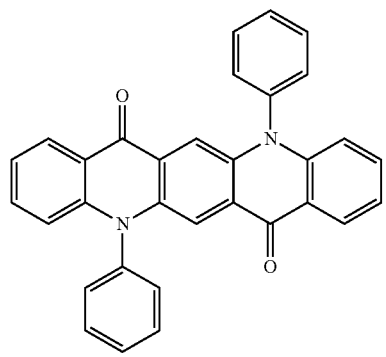
formula (66)
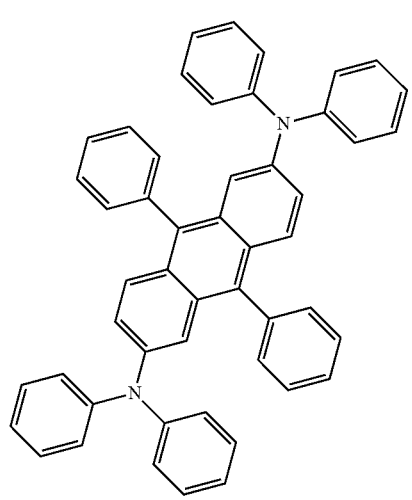
formula (67)
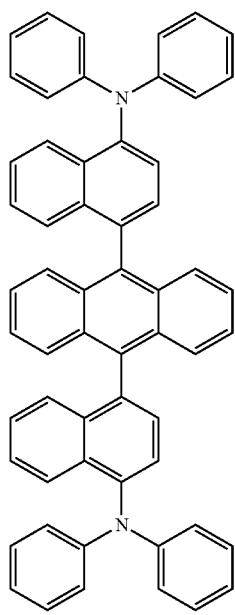
formula (68)
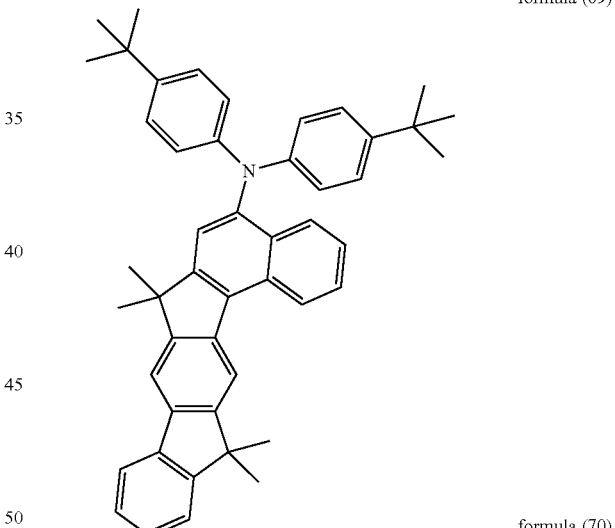
formula (69)
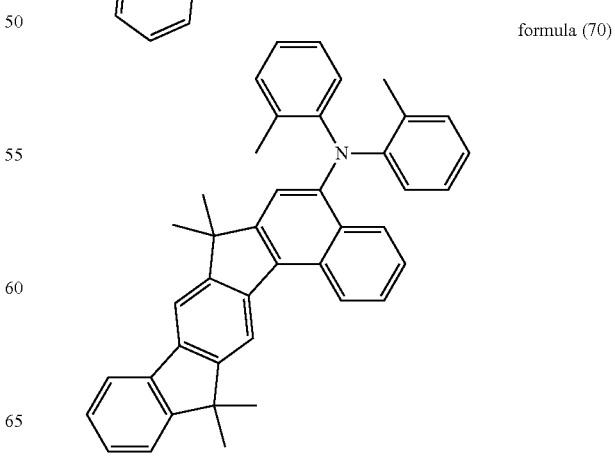
formula (70)

formula (71)
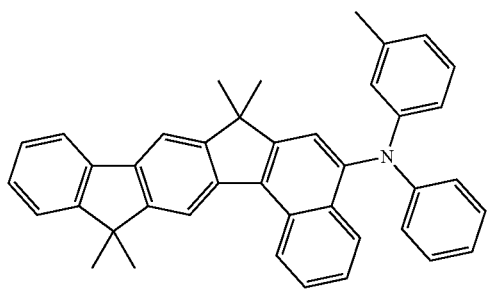
formula (72)
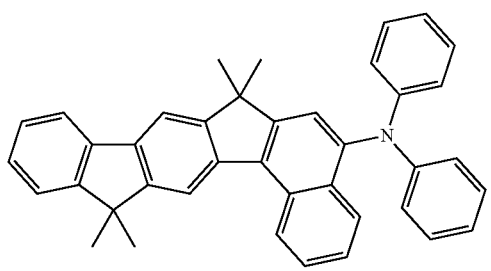
formula (73)
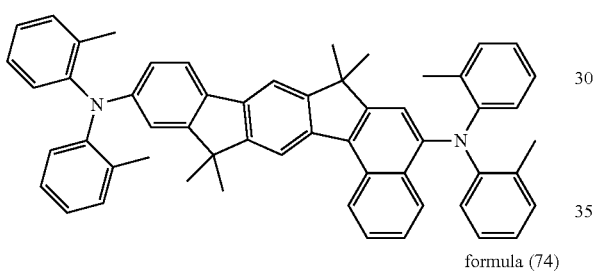
formula (74)
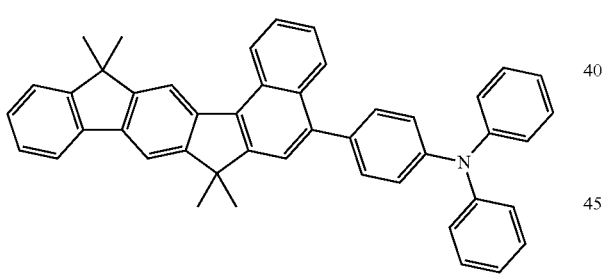
formula (75)
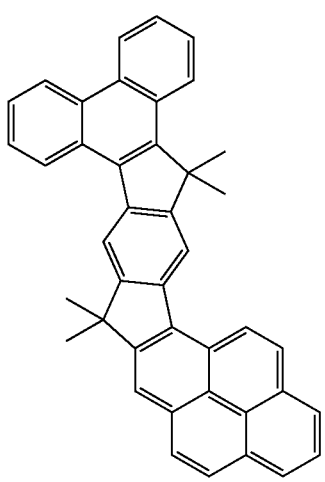
formula (76)
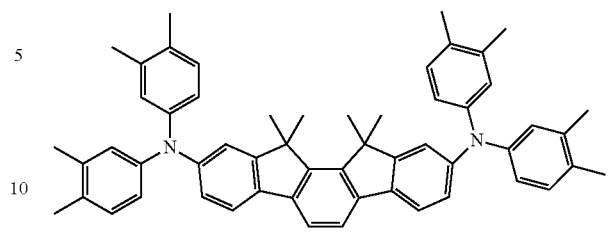
formula (77)
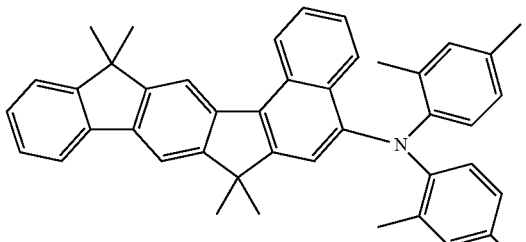
formula (78)
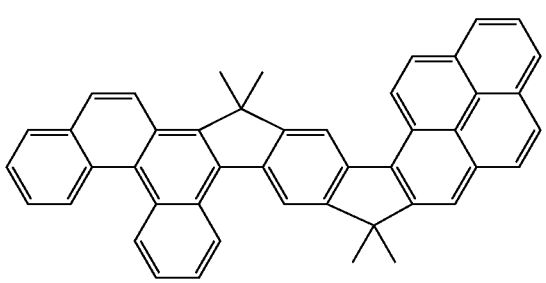
formula (79)
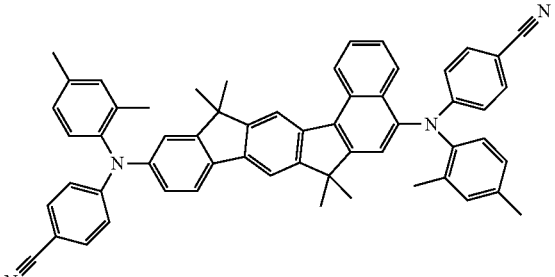
formula (80)
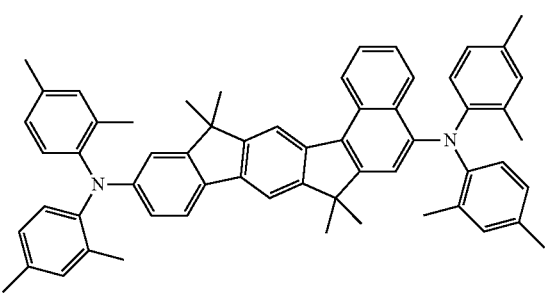

-continued formula (81)

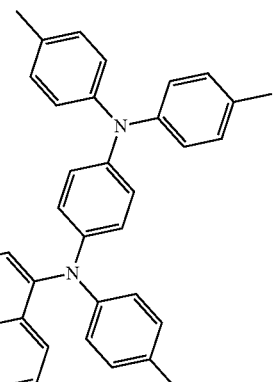

formula (82)

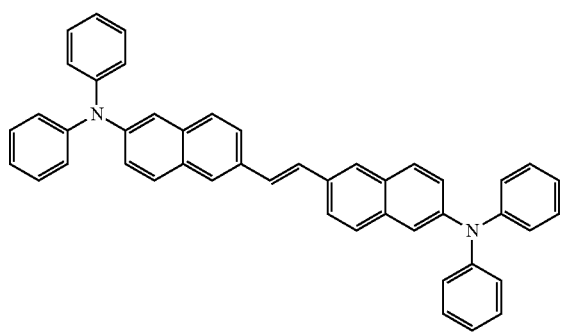

If compound B is a polymer or dendrimer, the fluorescent emitter unit may be present in the main backbone or in the side chain of the polymer. If it is present as constituent of the main backbone, two hydrogen atoms of the fluorescent emitter units/compounds mentioned in this application are not present, and the bonds to the further recurring units of the polymer occur at these positions. If it is present in the side chain, one hydrogen atom of the unit/compound is not present, and the unit/compound is bonded to the polymer via this position.

If compound B is not a polymer, it preferably consists of one of the fluorescent emitter units/compounds mentioned in this application.

In an alternative embodiment of the present invention, the at least one emitting unit of compound B of the mixture according to the invention is a phosphorescent emitter unit. The phosphorescent emitter unit of compound B is preferably a unit which comprises or consists of a metal-ligand coordination compound (metal-ligand coordination compound unit).

The metal of the metal-ligand coordination compound is preferably a transition metal, a main-group metal, a lanthanoid or an actinoid. If the metal is a main-group metal, it is then preferably a metal from the third, fourth or fifth main group, in particular tin. If the metal is a transition metal, it is then preferably Ir, Ru, Os, Pt, Zn, Mo, W, Rh and Pd. Eu is preferred as lanthanoid.

Preference is given to metal-ligand coordination compounds in which the metal is a transition metal, in particular a tetracoordinated, a pentacoordinated or a hexacoordinated transition metal, particularly preferably selected from the group consisting of chromium, molybdenum, tungsten, rhenium, ruthenium, osmium, rhodium, iridium, nickel, palladium, platinum, copper, silver and gold, in particular molybdenum, tungsten, rhenium, ruthenium, osmium, iridium, platinum, copper and gold. Very particular preference is given to iridium and platinum. The metals here can be in various oxidation states. The above-mentioned metals are preferably in the oxidation states Cr(0), Cr(II), Cr(III), Cr(IV), Cr(VI), Mo(0), Mo(II), Mo(III), Mo(IV), Mo(VI), W(O), W(II), W(III), W(IV), W(VI), Re(I), Re(II), Re(III), Re(IV), Ru(II), Ru(III), Os(II), Os(III), Os(IV), Rh(I), Rh(III), Ir(1), Ir(III), Ir(IV), Ni(0), Ni(II), Ni(IV), Pd(II), Pt(II), Pt(IV), Cu(I), Cu(II), Cu(III), Ag(1), Ag(II), Au(I), Au(III) and Au(V); very particular preference is given to Mo(0), W(O), Re(I), Ru(II), Os(II), Rh(III), Ir(III), Pt(II) and Cu(I), in particular Ir(III) and Pt(II).

In a preferred embodiment of the invention, the metal is a tetracoordinated metal having one, two, three or four ligands. In this way, the ligands can be mono-, bi-, tri- or tetradentate ligands. If the metal is coordinated to one ligand, it is a tetradentate ligand. If the metal is coordinated to two ligands, either both ligands are bidentate ligands, or one is a tridentate ligand and one is a monodentate ligand. If the metal is coordinated to three ligands, one ligand is a bidentate ligand and two are a monodentate ligand. If the metal is coordinated to four ligands, all ligands are monodentate.

In a further preferred embodiment of the invention, the metal is a hexacoordinated metal having one, two, three, four, five or six ligands. In this way, the ligands can be mono-, bi-, tri-, tetra-, penta- or hexadentate ligands. If the metal is coordinated to one ligand, it is a hexadentate ligand. If the metal is coordinated to two ligands, either both are tridentate ligands or one is a bidentate ligand and one is a tetradentate ligand or one is a monodentate ligand and one is a pentadentate ligand. If the metal is coordinated to three ligands, either all three ligands are bidentate ligands or one is a tridentate ligand, one is a bidentate ligand and one is a monodentate ligand, or one is a tetradentate ligand and two are monodentate ligands. If the metal is coordinated to four ligands, one ligand is a tridentate ligand and three are a monodentate ligand or two are bidentate ligands and two are monodentate ligands. If the metal is coordinated to five ligands, one is a bidentate ligand and four are monodentate ligands. If the metal is coordinated to six ligands, all ligands are monodentate.

The ligands of the metal-ligand coordination compounds are preferably neutral, monoanionic, dianionic or trianionic ligands, particularly preferably neutral or monoanionic ligands. A mentioned, they can be monodentate, bidentate, tridentate, tetradentate pentadentate or hexadentate, but are preferably bidentate, i.e. preferably have two coordination sites. Furthermore, it is preferred in accordance with the invention for at least one ligand to be a bidentate ligand.

Preferred neutral, monodentate ligands are selected from nitrogen monoxide, alkylcyanides, such as, for example, acetonitrile, arylcyanides, such as, for example, benzonitrile, alkylisocyanides, such as, for example, methylisonitrile, arylisocyanides, such as, for example, benzoisonitrile, amines, such as, for example, trimethylamine, triethylamine, morpholine, phosphines, in particular halophosphines, trialkylphosphines, triarylphosphines or alkylarylphosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsine, tris(pentafluorophenyl)arsine, stibines, such as, for example, trifluorostibine, trimethylstibine, tricyclohexylstibine, tri-tert-butylstibine, triphenylstibine, tris(pentafluorophenyl)stibine, nitrogen-containing heterocycles, such as, for example, pyridine, pyridazine, pyrazine, pyrimidine, triazine, and carbenes, in particular Arduengo carbenes.

Preferred monoanionic, monodentate ligands are selected from hydride, deuteride, alkylacetylides, such as, for example, methyl-C≡C⁻, tert-butylC≡C⁻, arylacetylides, such as, for example, phenyl-C≡C⁻, cyanide, cyanate, isocyanate, thiocyanate, isothiocyanate, aliphatic or aromatic alcoholates, such as, for example, methanolate, ethanolate, propanolate, isopropanolate, tert-butylate, phenolate, aliphatic or aromatic thioalcoholates, such as, for example, methanethiolate, ethanethiolate, propanethiolate, isopropanethiolate, tert-thiobutylate, thiophenolate, amides, such as, for example, dimethylamide, diethylamide, diisopropylamide, morpholide, carboxylates, such as, for example, acetate, trifluoroacetate, propionate, benzoate, aryl groups, such as, for example, phenyl, naphthyl, and anionic, nitrogen-containing heterocycles, such as pyrrolide, imidazolide, pyrazolide. The alkyl groups in these groups here are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are defined below.

Preferred di- or trianionic ligands are carbides, which result in coordination in the form R—C≡M, nitrenes, which result in coordination in the form R—N=M, where R generally stands for a substituent, and $N^{3-}$.

Preferred neutral or mono- or dianionic bidentate or polydentate ligands L' are selected from diamines, such as, for example, ethylenediamine, N,N,N',N'-tetramethylethylenediamine, propylenediamine, N,N,N',N'-tetramethylpropylenediamine, cis- or trans-diaminocyclohexane, cis- or transN,N,N', N'-tetramethyldiaminocyclohexane, imines, such as, for example, 2[1-(phenylimino)ethyl]pyridine, 2[1-(2-methylphenylimino)ethyl]pyridine, 2[1-(2,6-di-iso-propylphenylimino)ethyl]pyridine, 2[1-(methylimino)ethyl]-pyridine, 2[1-(ethylimino)ethyl]pyridine, 2[1-(iso-propylimino)ethyl]pyridine, 2[1-(tert-butylimino)ethyl] pyridine, diimines, such as, for example, 1,2-bis (methylimino)ethane, 1,2-bis(ethylimino)ethane, 1,2-bis (iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis (phenylimino)butane, 2,3-bis(2-methylphenylimino)butane, 2,3-bis(2,6-di-iso-propylphenylimino)butane, 2,3-bis(2,6-di-tertbutylphenylimino)butane, heterocycles containing two nitrogen atoms, such as, for example, 2,2'-bipyridine, o-phenanthroline, diphosphines, such as, for example, bis (diphenylphosphino)methane, bis(diphenylphosphino)ethane, bis(diphenylphosphino)propane, bis(diphenylphosphino)butane, bis(dimethylphosphino)methane, bis (dimethylphosphino)ethane, bis(dimethylphosphino) propane, bis(diethylphosphino)methane, bis (diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, such as, for example, acetylacetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol.

Preferred tridentate ligands are borates of nitrogen-containing heterocycles, such as, for example, tetrakis(1-imidazolyl)borate and tetrakis(1-pyrazolyl)borate.

Preference is furthermore given to bidentate monoanionic ligands which, with the metal, contain a cyclometallated five-membered ring or sixmembered ring having at least one metal-carbon bond, in particular a cyclometallated five-membered ring. These are, in particular, ligands as generally used in the area of phosphorescent metal complexes for organic electroluminescent devices, i.e. ligands of the phenylpyridine, naphthylpyridine, phenylquinoline, phenylisoquinoline, etc., type, each of which may be substituted by one or more radicals R. A multiplicity of ligands of this type is known to the person skilled in the art in the area of phosphorescent electroluminescent devices, and he will be able to select further ligands of this type as ligand for the metal-ligand coordination compounds. In general, the combination of two groups, as represented by the following formulae (83) to (110), is particularly suitable for this purpose, where one group is bonded via a neutral nitrogen atom or a carbene atom and the other group is bonded via a negatively charged carbon atom or a negatively charged nitrogen atom. The ligand can then be formed from the groups of the formulae (83) to (110) by these groups bonding to one another, in each case at the position denoted by #. The position at which the groups coordinate to the metal are denoted by *.

formula (83)

formula (84)

formula (85)

formula (86)

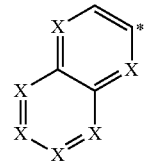

formula (87)

formula (88)

formula (89)

formula (90)

formula (91)

formula (92)

formula (93)

formula (94)

formula (95)

formula (96)

formula (97)

formula (98)

formula (99)

formula (100)

formula (101)

formula (102)

formula (103)

formula (104)

formula (105)

formula (106)

-continued

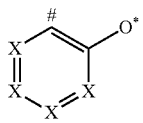
formula (107)

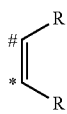
formula (108)

formula (109)

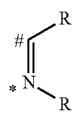
formula (110)

The symbol R here stands on each occurrence, identically or differently, for one of the following radicals: alkyl, cycloalkyl, alkylsilyl, arylsilyl, alkoxyalkyl, arylalkoxyalkyl, alkylthioalkyl, alkylene sulfone, alkylene sulfone oxide, where the alkylene group in each case has, independently of one another, 1 to 12 C atoms and where one or more H atoms may be replaced by F, Cl, Br, I, alkyl or cycloalkyl, where one or more $CH_2$ may be replaced by a heteroatom, such as NH, O or S, or an aromatic or heteroaromatic hydrocarbon radical having 5 to 40 aromatic ring atoms. X stands for N or CH. Particularly preferably a maximum of three symbols X in each group stand for N, particularly preferably a maximum of two symbols X in each group stand for N, very particularly preferably a maximum of one symbol X in each group stands for N. Especially preferably all symbols X stand for CH.

Likewise preferred ligands are $\eta^5$-cyclopentadienyl, $\eta^5$-pentamethylcyclopentadienyl, $\eta^6$-benzene and $\eta^7$-cycloheptatrienyl, each of which may be substituted by one or more radicals R, which can have the meaning mentioned above.

Likewise preferred ligands are 1,3,5-cis-cyclohexane derivatives, in particular of the formula (111), 1,1,1-tri (methylene)methane derivatives, in particular of the formula (112), and 1,1,1-trisubstituted methanes, in particular of the formulae (113) and (114),

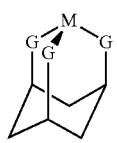
formula (111)

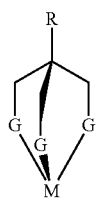
formula (112)

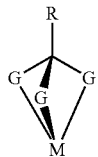
formula (113)

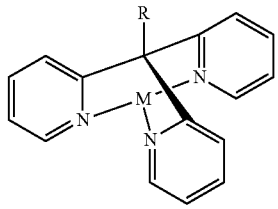
formula (114)

where, in the formulae, in each case the coordination to the metal M is depicted, R has the meaning mentioned above, and G stands, identically or differently on each occurrence, for $O^-$, $S^-$, $COO^-$, $P(R)_2$ or $N(R)_2$, in which R has the same meaning as indicated above Examples of preferred phosphorescent emitter units are shown in the following table:

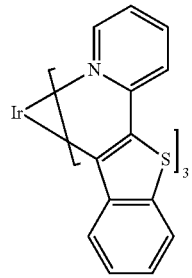
formula (115)

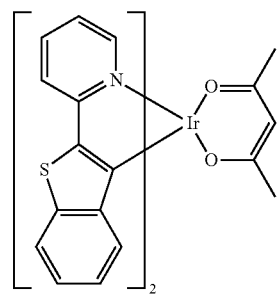
formula (116)

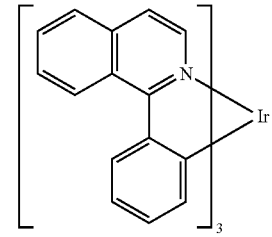
formula (117)

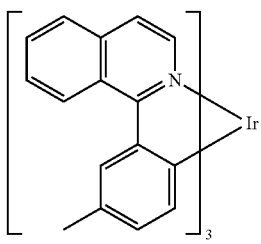 formula (118)
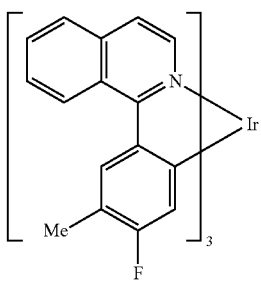 formula (119)
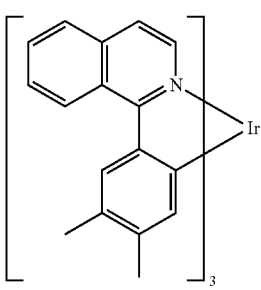 formula (120)
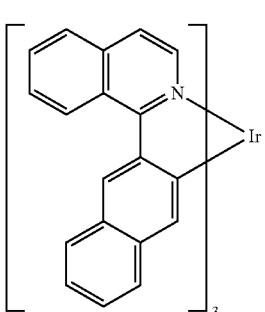 formula (121)
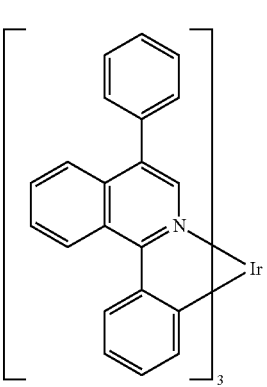 formula (122)
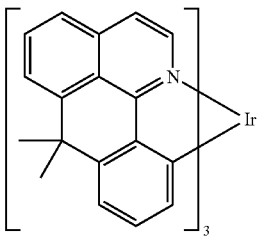 formula (123)
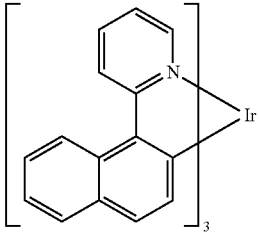 formula (124)
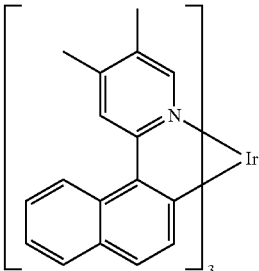 formula (125)
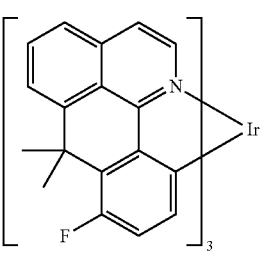 formula (126)
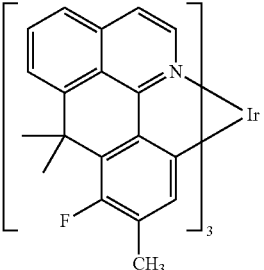 formula (127)
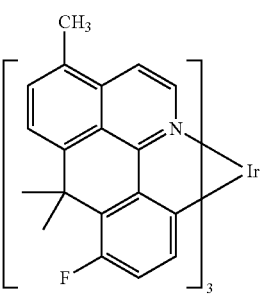 formula (128)

-continued
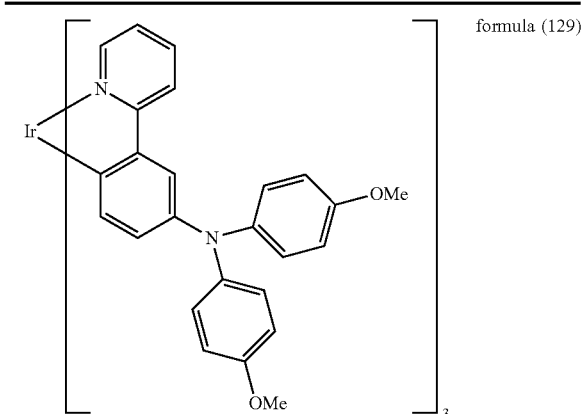
formula (129)
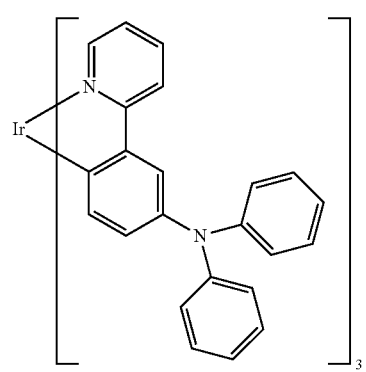
formula (130)
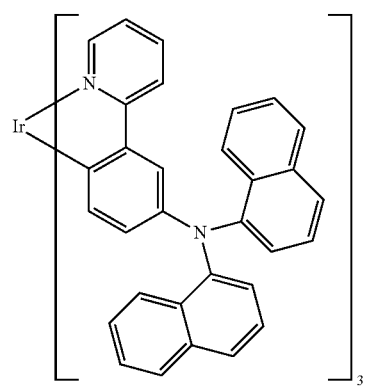
formula (131)
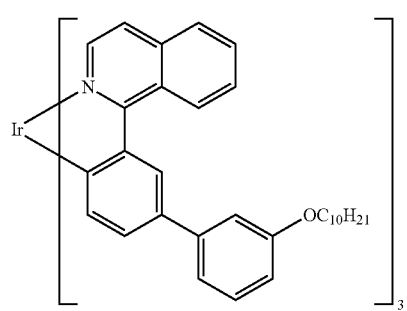
formula (132)
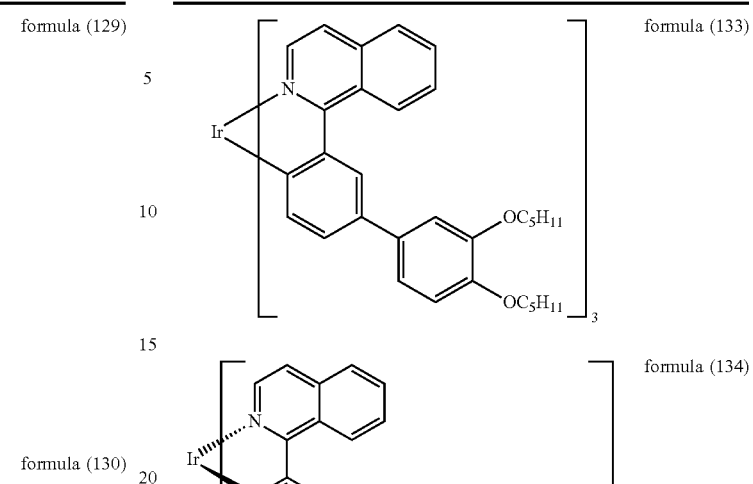
formula (133)
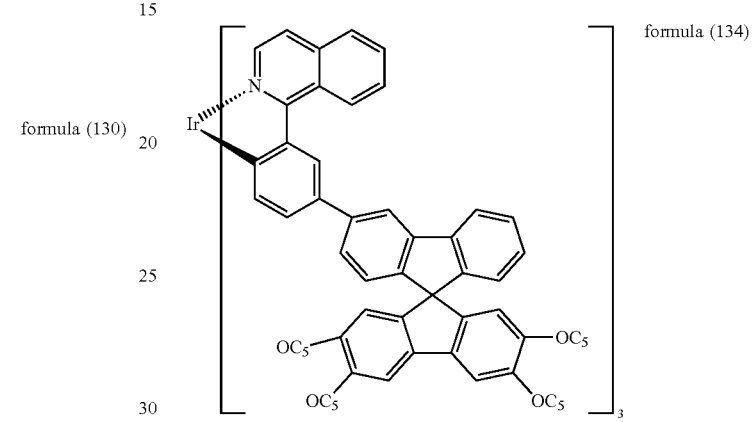
formula (134)
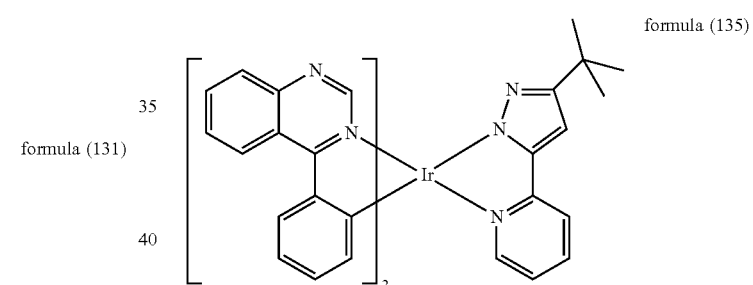
formula (135)
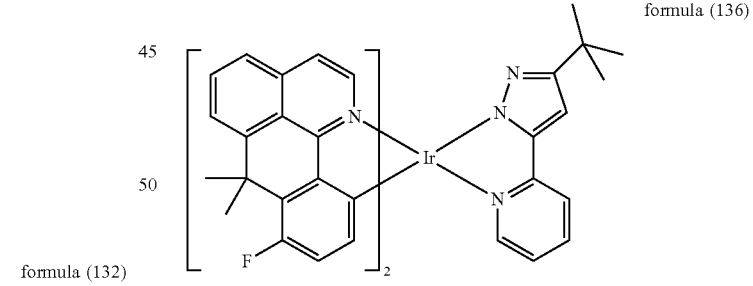
formula (136)
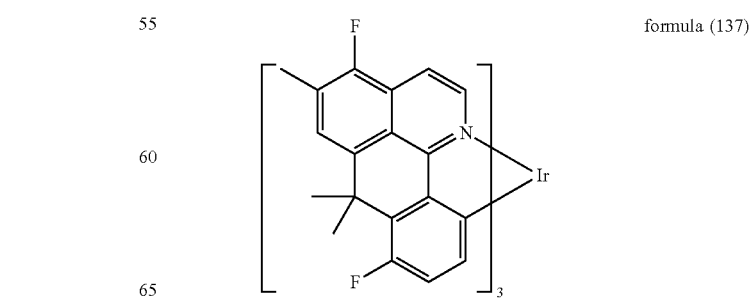
formula (137)

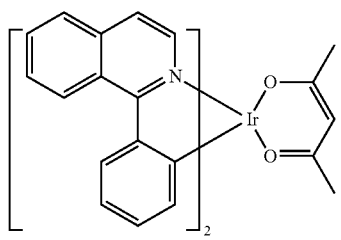
formula (138)
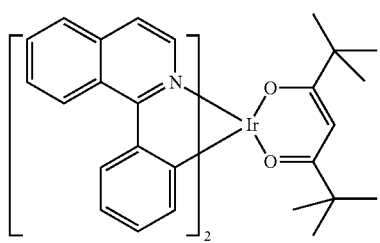
formula (139)
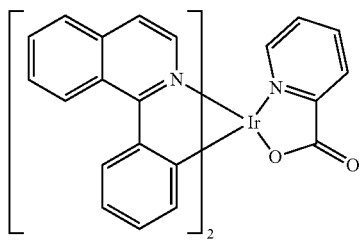
formula (140)
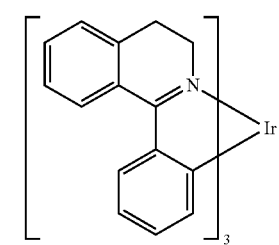
formula (141)
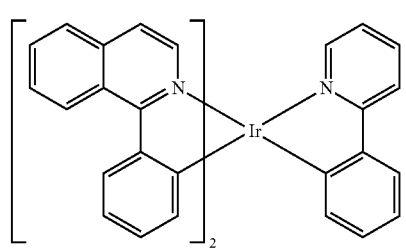
formula (142)
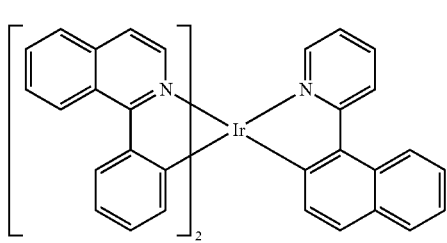
formula (143)
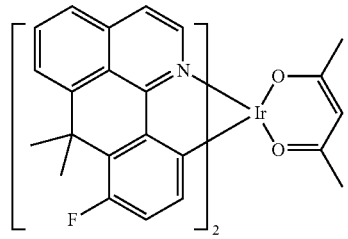
formula (144)
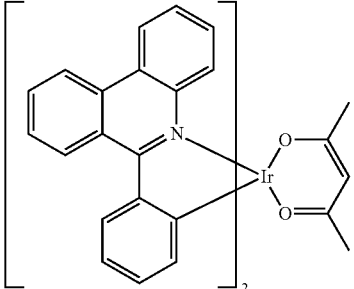
formula (145)
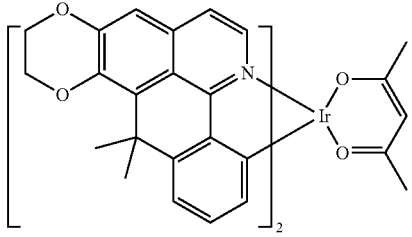
formula (146)
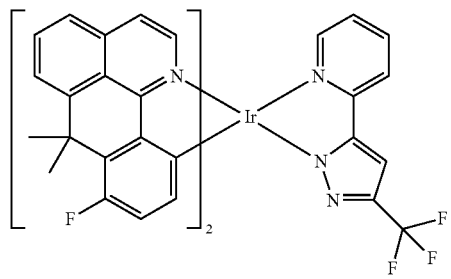
formula (147)
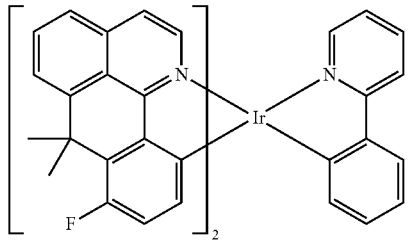
formula (148)
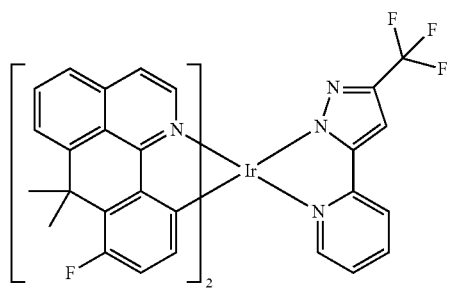
formula (149)

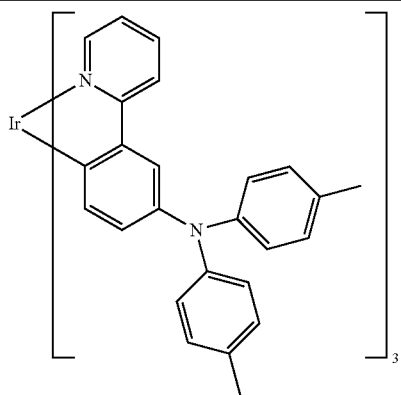
formula (150)
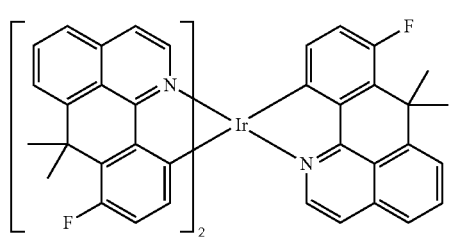
formula (151)
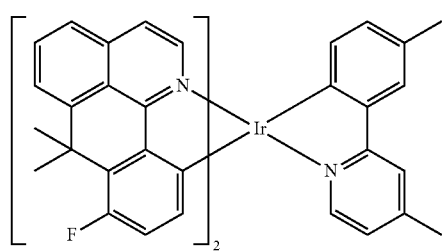
formula (152)
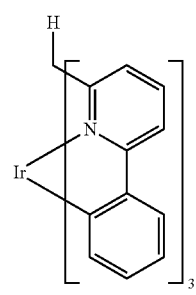
formula (153)
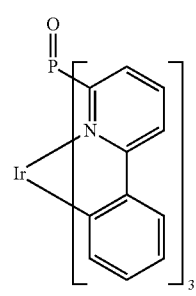
formula (154)
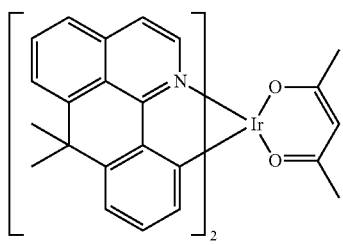
formula (155)
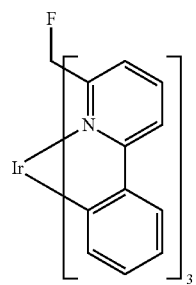
formula (156)
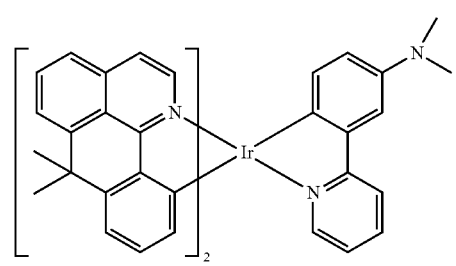
formula (157)
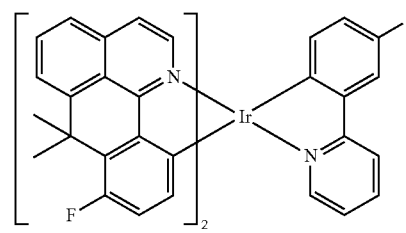
formula (158)
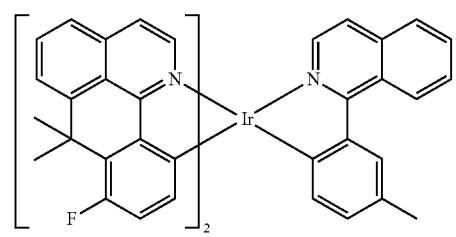
formula (159)
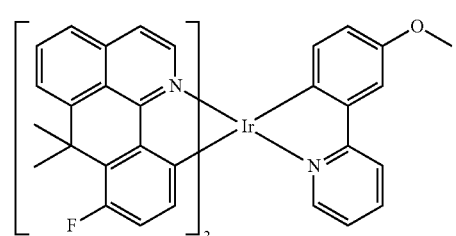
formula (160)

formula (161)
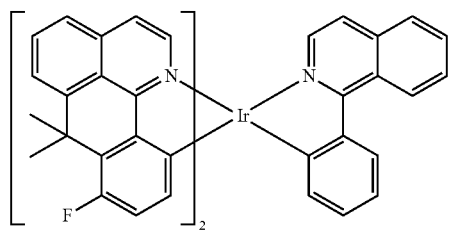
formula (162)
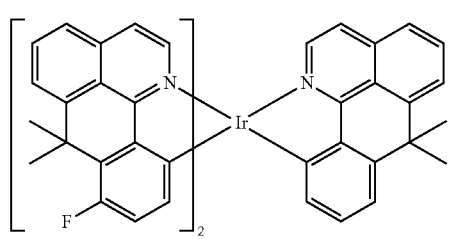
formula (163)
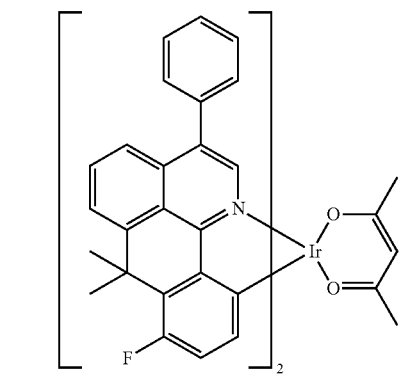
formula (164)
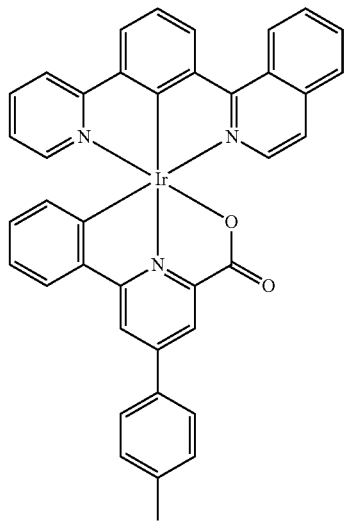
formula (165)
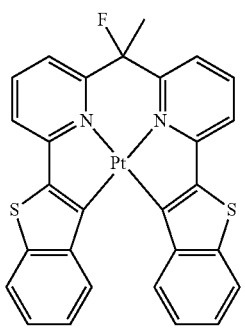
formula (166)
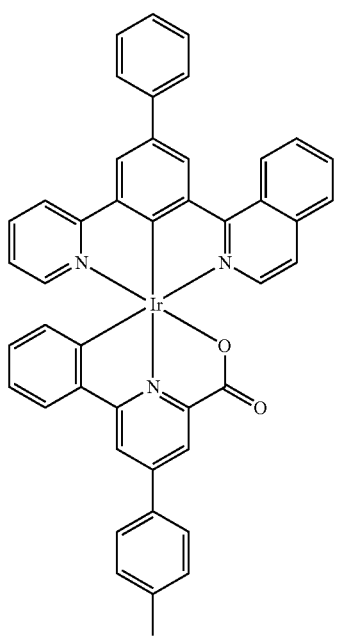
formula (167)
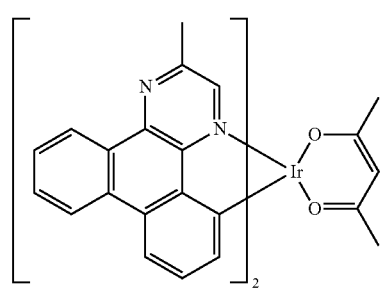
formula (168)
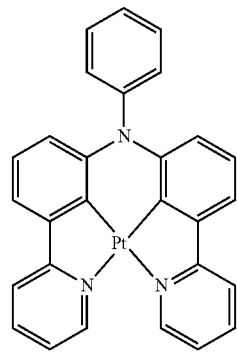

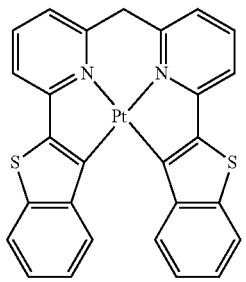
formula (169)
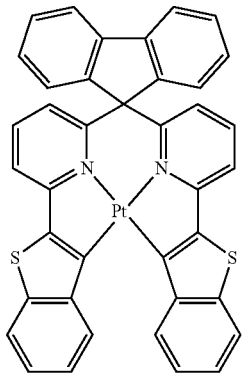
formula (170)
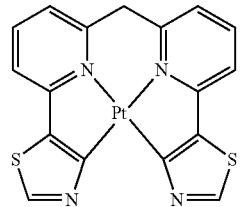
formula (171)
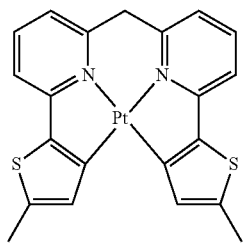
formula (172)
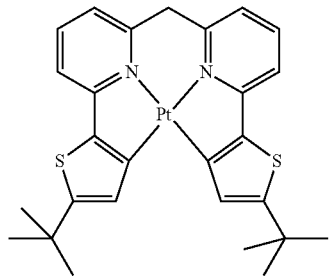
formula (173)
formula (174)
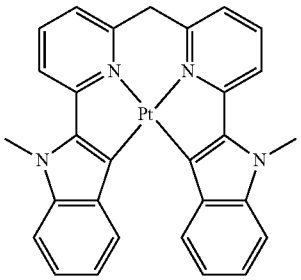
formula (175)
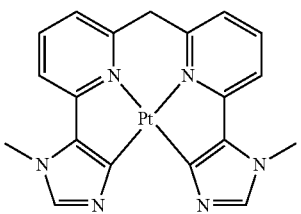
formula (176)
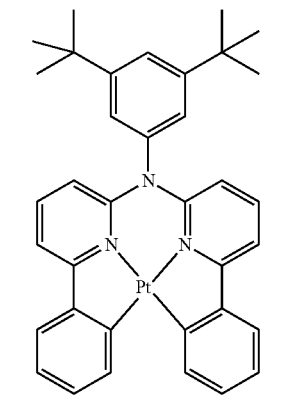
formula (177)
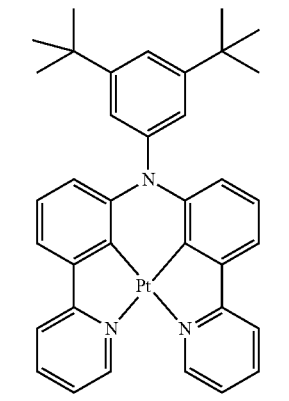
formula (178)
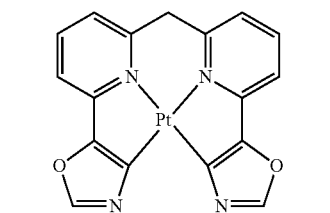

-continued
formula (179)
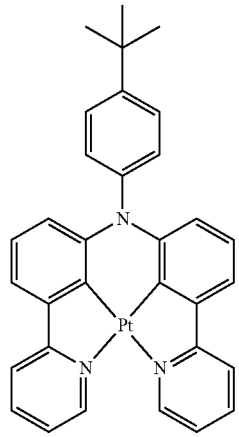
formula (180)
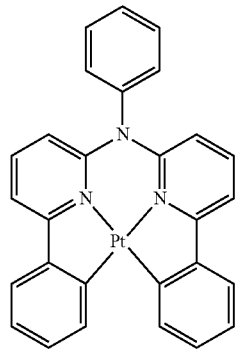
formula (181)
formula (182)
-continued
formula (183)
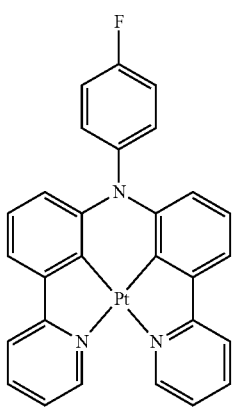
formula (184)
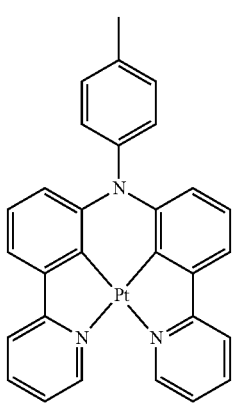
formula (185)
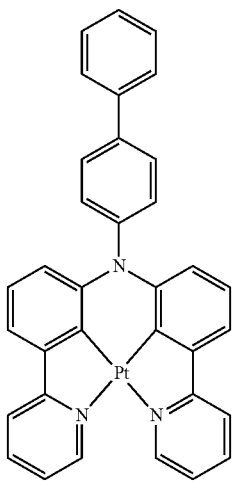

formula (186)
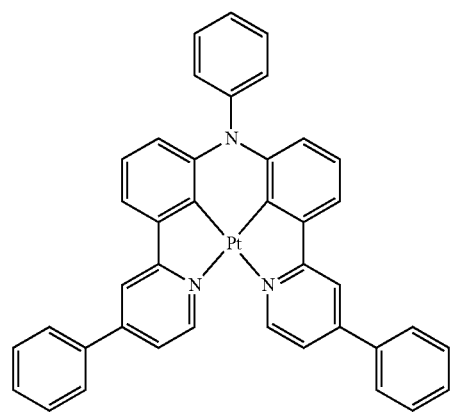
formula (187)
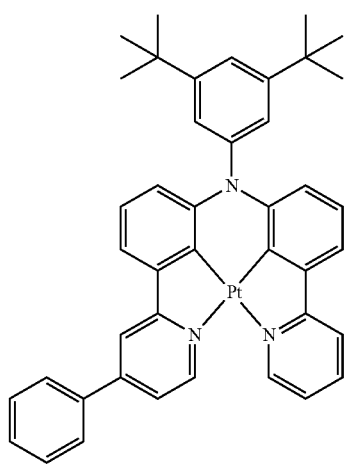
formula (188)
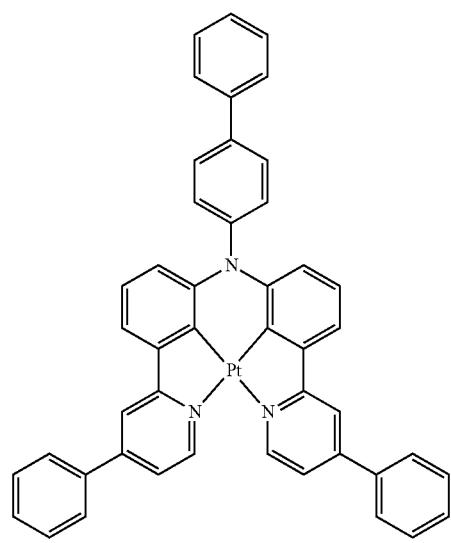
formula (189)
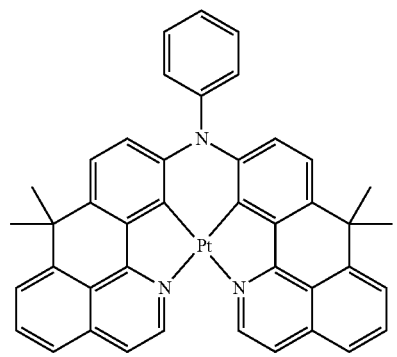
formula (190)
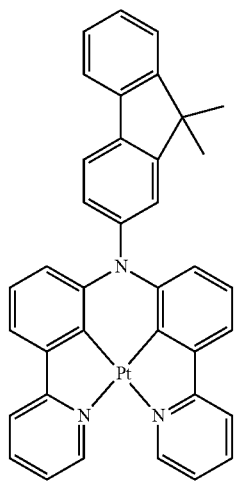
formula (191)
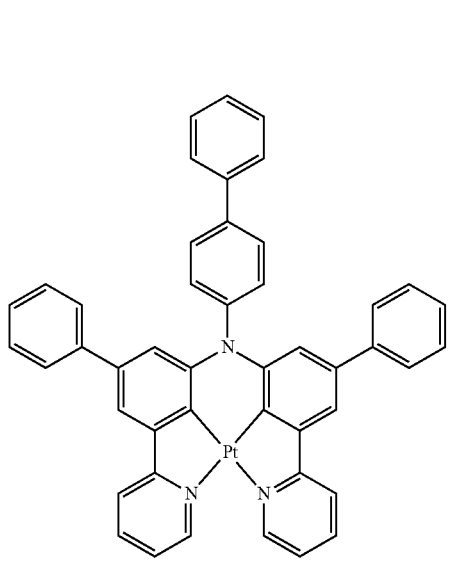

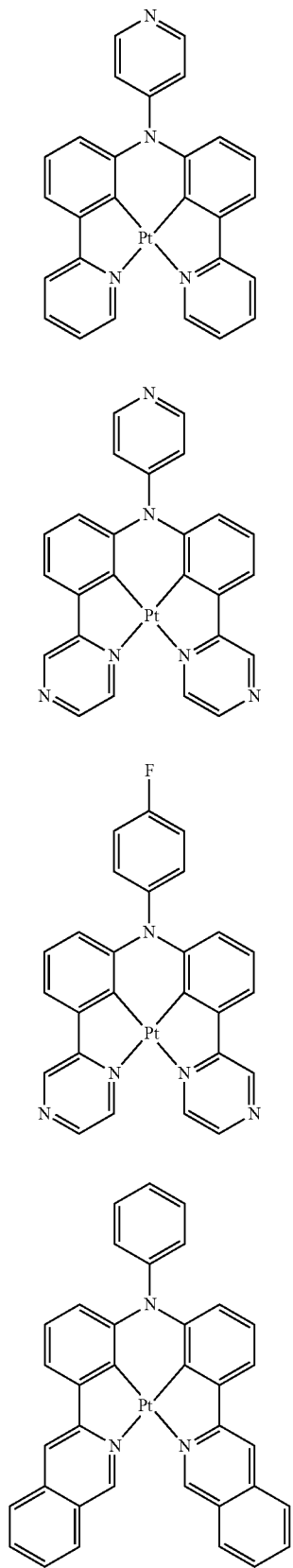
formula (192)
formula (193)
formula (194)
formula (195)
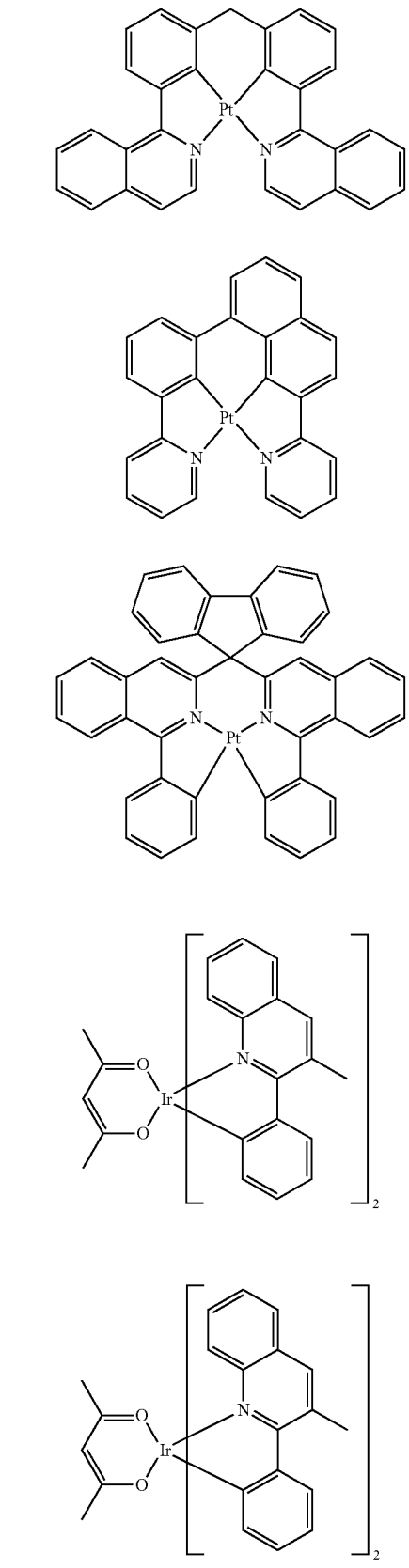
formula (196)
formula (197)
formula (198)
formula (199)
formula (200)

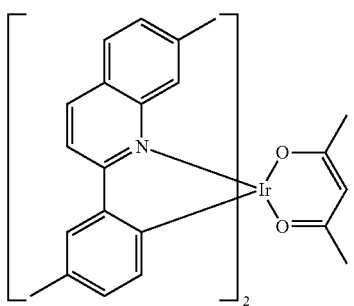
formula (201)
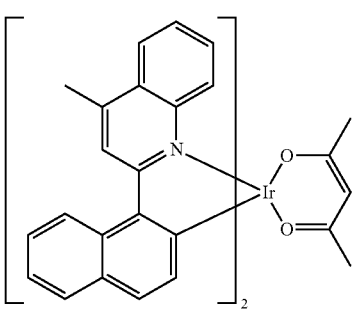
formula (202)
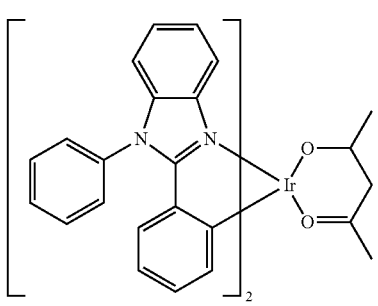
formula (203)
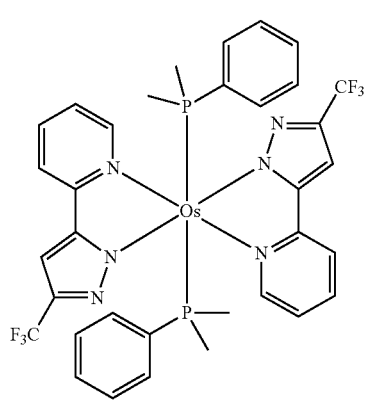
formula (204)
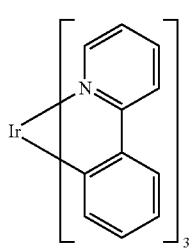
formula (205)
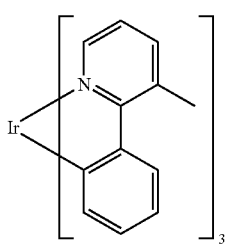
formula (206)
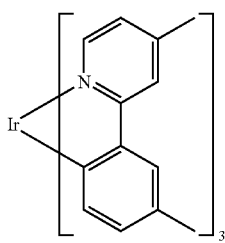
formula (207)
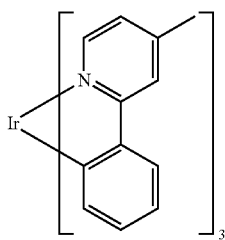
formula (208)
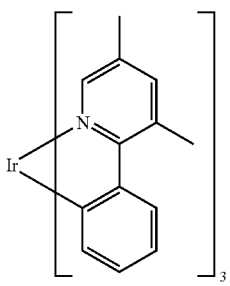
formula (209)
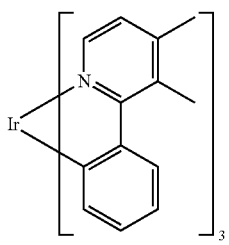
formula (210)
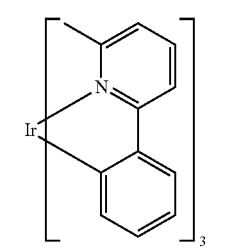
formula (211)

formula (212)
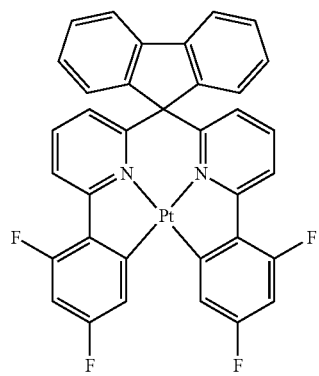
formula (213)
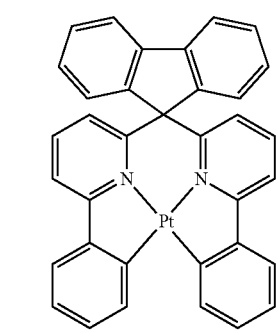
formula (214)
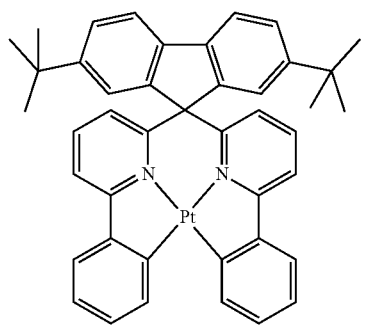
formula (215)
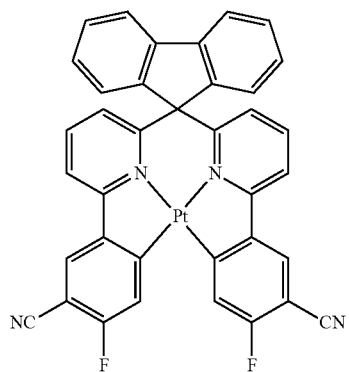
formula (216)
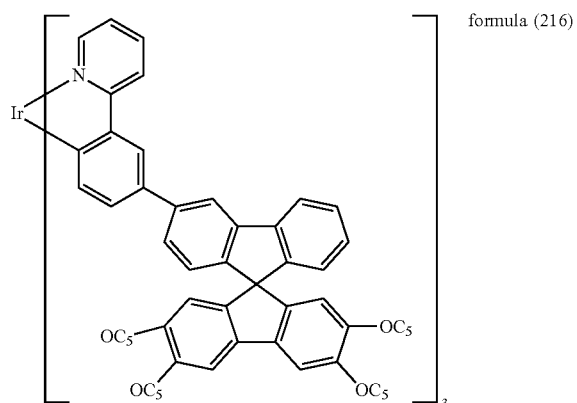
formula (217)
formula (218)
formula (219)
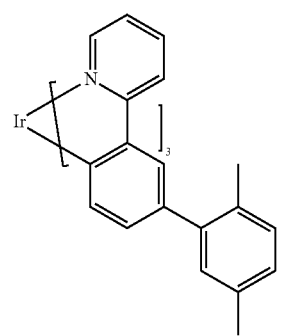

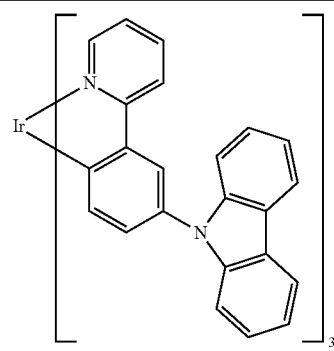
formula (220)
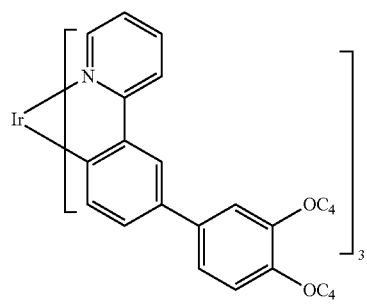
formula (221)
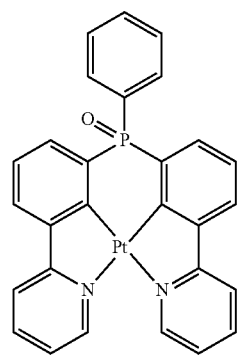
formula (222)
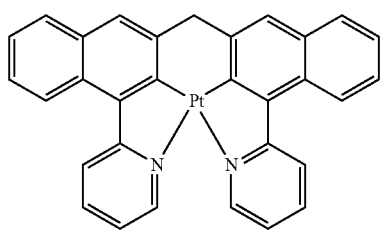
formula (223)
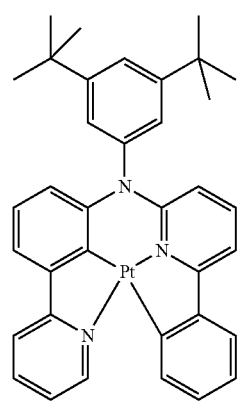
formula (224)
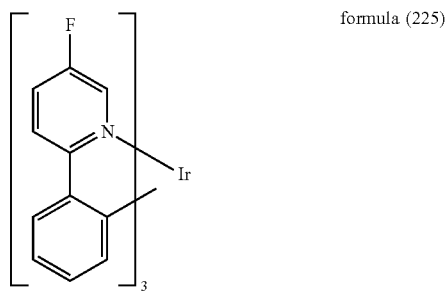
formula (225)
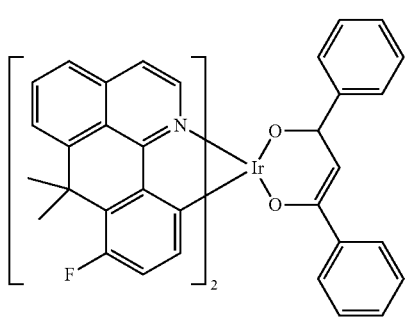
formula (226)
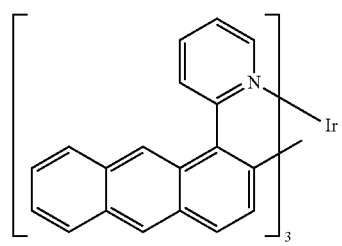
formula (227)
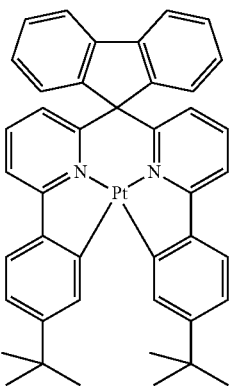
formula (228)
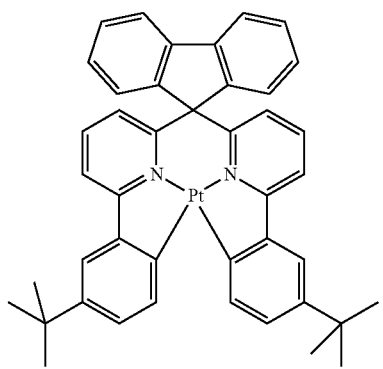
formula (229)

formula (230)
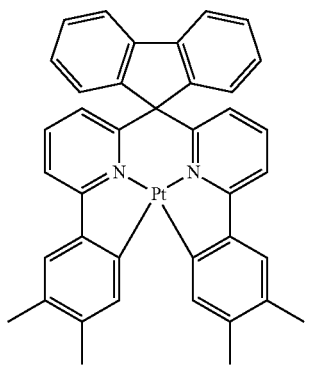
formula (231)
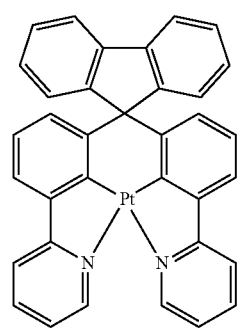
formula (232)
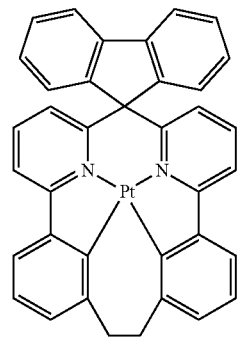
formula (233)
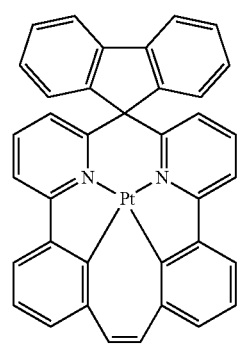
formula (234)
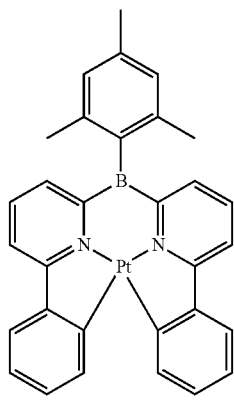
formula (235)
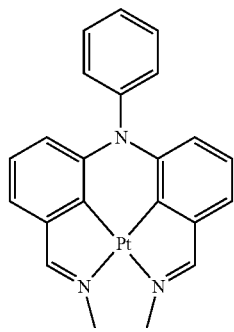
formula (236)
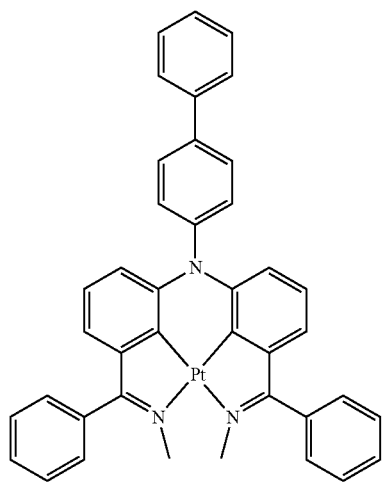
formula (237)
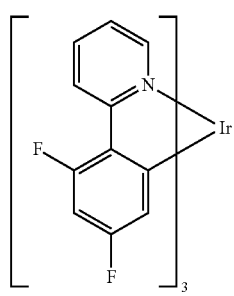

formula (238)
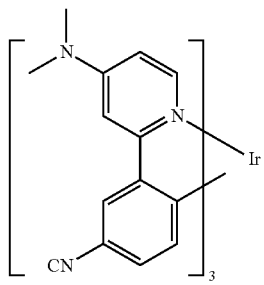
formula (239)
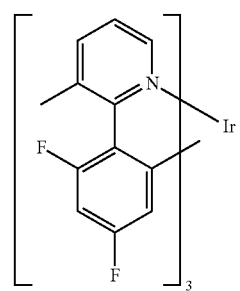
formula (240)
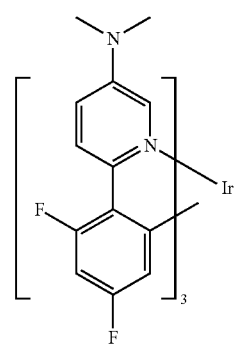
formula (241)
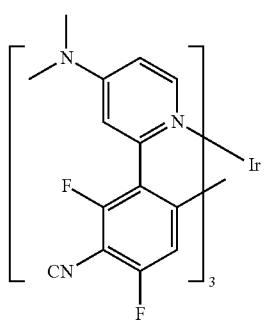
formula (242)
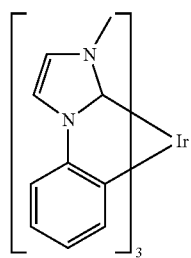
formula (243)
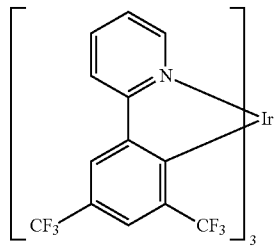
formula (244)
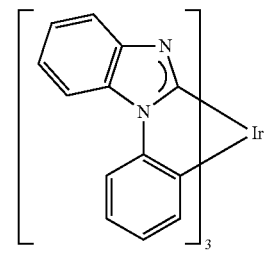
formula (245)
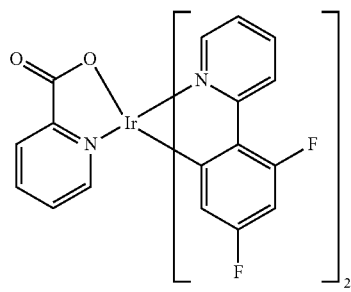
formula (246)
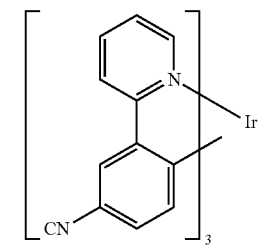
formula (247)
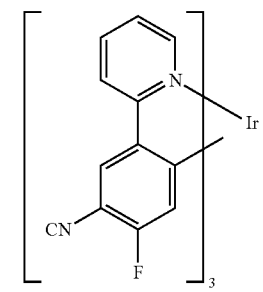
formula (248)
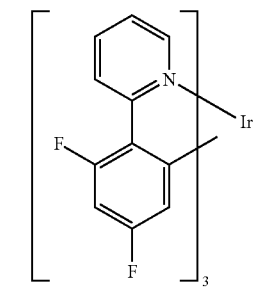

formula (249)
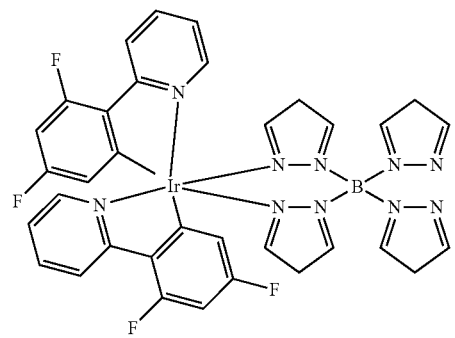
formula (250)
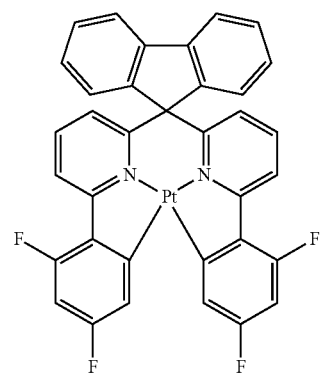
formula (251)
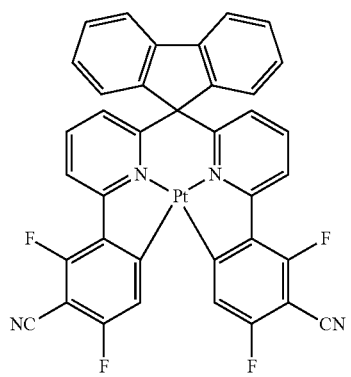
formula (252)
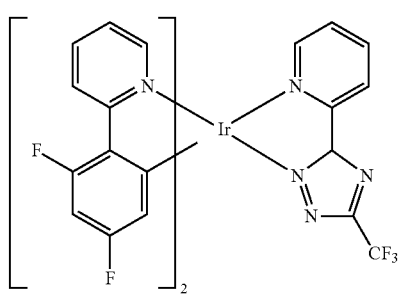
formula (253)
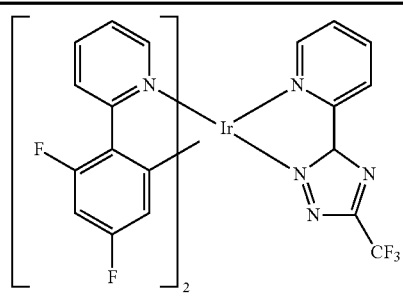
formula (254)
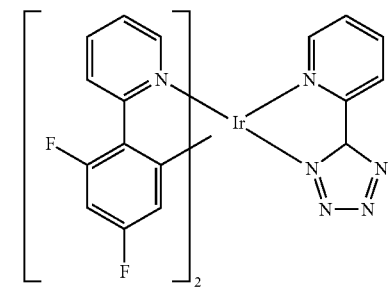
formula (255)
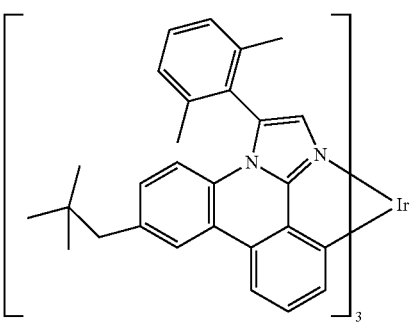
formula (256)
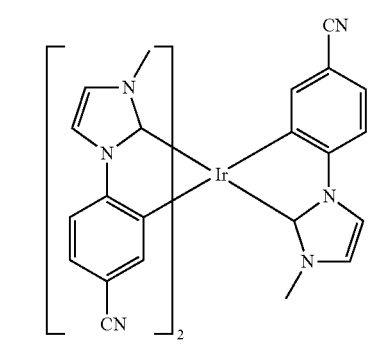
formula (257)
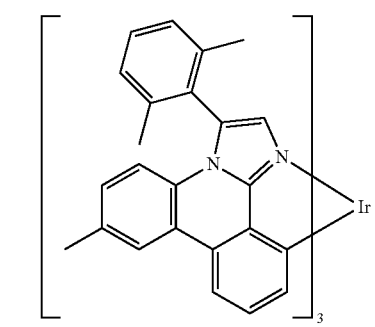
If compound B is a polymer or dendrimer, the phosphorescent emitter unit may be present in the main backbone, in the side chain or at the end of the polymer. If it is present as constituent of the main backbone, two hydrogen atoms of the phosphorescent emitter units/compounds mentioned in this application are not present, and the bonds to the further recurring units of the polymer occur at these positions. If it is present in the side chain or terminally, one hydrogen atom of the unit/compound is not present, and the unit/compound is bonded to the polymer via this position.

If compound B is not a polymer, it preferably consists of one of the phosphorescent emitter units/compounds mentioned in this application.

Particular preference is given in accordance with the invention to the two following phosphorescent emitter compounds (258) and (259):

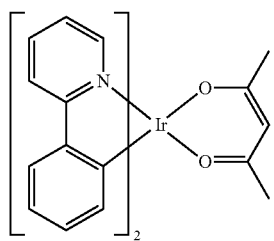

formula (258)

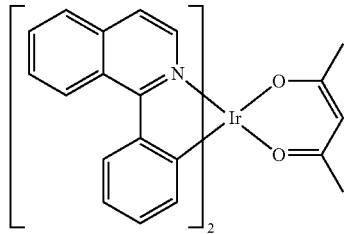

formula (259)

If compound (258) or (259) are bonded into the polymer in the side chain, in the main chain or terminally, this preferably takes place by chain polymerisation of vinyl groups or by Suzuki coupling. In the first case, the monomer used is preferably compounds (260) and (261), and in the second case compounds (262) and (263):

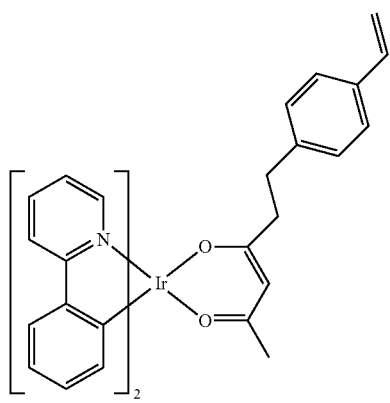

formula (260)

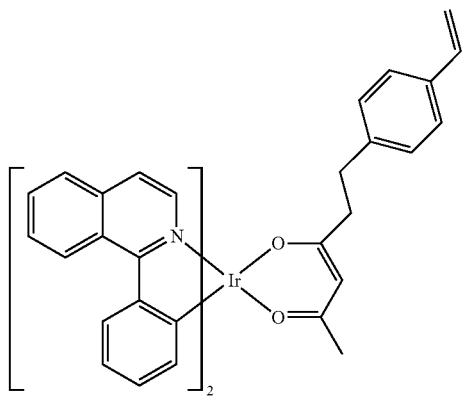

formula (261)

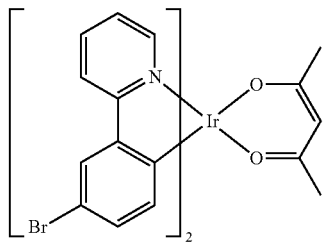

formula (262)

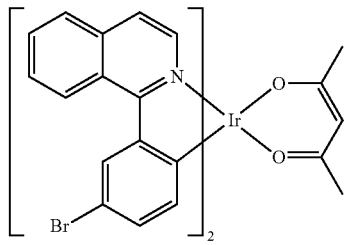

formula (263)

Like the emitting unit of compound B, the phosphorescent unit of compound A can also be a metal-ligand coordination compound unit, as described in greater detail below. All definitions and preferred embodiments of the metal-ligand coordination compound unit of compound B also apply to the metal-ligand coordination compound unit of compound A. If both emitter units, i.e. those of compound A and of compound B, are metal-ligand coordination compound units, these can have identical or different central metals. If both central metals are the same element, the donor and acceptor properties are crucially determined by the influence of the ligands, which are then very generally not identical in the case of both central metals, at least with respect to the overall coordination sphere, i.e. also with respect to tautomerism in the case of identical ligands.

In the mixture according to the invention, one of compounds A or B can be a polymer or dendrimer and the other can be a compound having a molecular weight of less than or equal to 4000 g/mol, more preferably less than or equal to 3500 g/mol and most preferably less than or equal to 3000 g/mol. In a preferred possibility, compound A is a compound having the said low molecular weight and compound B is a polymer or dendrimer. In a further preferred possibility, compound B is a compound having the said low molecular weight and compound A is a polymer or dendrimer.

If compound B and/or A is a polymer, this contains a main-chain backbone. This main-chain backbone may be composed of recurring units which do not have side chains.

However, the polymer may likewise also contain one or more side chains, which may be identical to or different from one another. In this case, the polymer can be a homopolymer comprising identical recurring units which have the same side chains, but it may also be a copolymer comprising two or more different recurring units, in which the main-chain backbone may be identical, but the side chains are different. However, the recurring units may also be different with respect to the main-chain backbone, and the side chains may be identical, or different. The copolymer is preferably a random copolymer comprising two or three different recurring units.

The polymer can be a conjugated or non-conjugated polymer. A conjugated polymer is taken to mean a polymer in which all atoms of some adjacent recurring units (partially conjugated polymer) or all atoms of the main chain (fully conjugated polymer) are in conjugation with one another. A non-conjugated polymer is taken to mean a polymer in which the conjugation of the main chain is preferably interrupted within a recurring unit, or the individual recurring units are not in conjugation with one another with respect to the linking atoms. This is preferably achieved by a so-called conjugation-interrupting unit. A conjugation-interrupting unit is taken to mean a unit which interferes with or preferably interrupts the conjugation, i.e. a possible conjugation within the main-chain backbone of the polymer is interfered with or preferably interrupted. Conjugation in chemistry is taken to mean the overlap of a π orbital (π=PI) with a p orbital of an sp$^2$-hybridised (carbon) atom or further π orbitals. By contrast, a conjugation-interrupting unit in the sense of this application is taken to mean a unit which interferes with or preferably completely prevents such an overlap. This can take place, for example, through a unit in which the conjugation is interfered with by at least one sp$^3$-hybridised atom, preferably carbon. Likewise, the conjugation may be destroyed by a non-sp$^3$-hybridised atom, for example by N, P or Si. It is particularly preferred in accordance with the invention for the polymer to be a non-conjugated polymer.

In a particularly preferred embodiment, the polymer is a polymer which contains a functional group, as well as host or matrix material units and the emitting unit, in the main chain and which is not conjugated in the main chain, in which the polymer contains at least one conjugation-interrupting unit. The conjugation interruption is accompanied by the advantage that the polymer has a high triplet level.

Preferred recurring units which result in a non-conjugated polymer are units such as of the general formula (264)

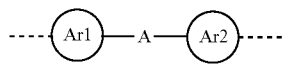

(264)

in which A is selected from the group consisting of linear or branched alkylene, cycloalkylene, alkylsilylene, silylene, arylsilylene, alkylalkoxyalkylene, arylalkoxyalkylene, alkylthioalkylene, sulfone, alkylene sulfone, sulfone oxide, alkylene sulfone oxide, where the alkylene group in each case has, independently of one another, 1 to 12 C atoms and where one or more H atoms may be replaced by F, Cl, Br, I, alkyl, heteroalkyl, cycloalkyl, aryl or heteroaryl.

A particularly preferably denotes a linear or branched alkylene or alkoxyalkylene having 1 to 12 C atoms, where one or more H atoms may be replaced by F.

Recurring units which result in a non-conjugated polymer furthermore preferably conform to the general formulae (265) to (279),

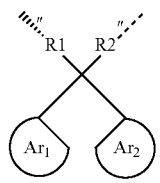

formula (265)

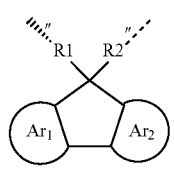

formula (266)

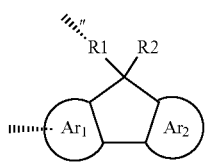

formula (267)

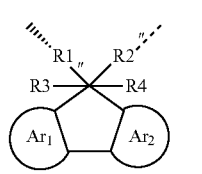

formula (268)

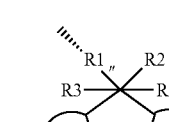

formula (269)

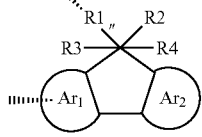

formula (270)

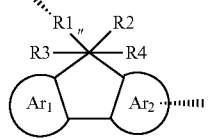

formula (271)

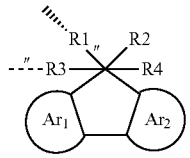

formula (272)

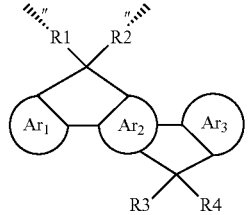

-continued

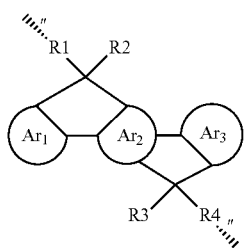
formula (273)

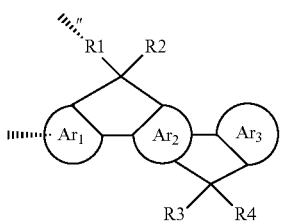
formula (274)

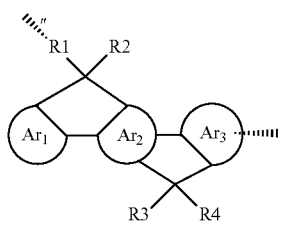
formula (275)

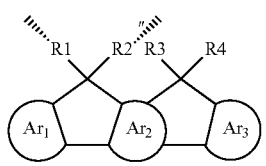
formula (276)

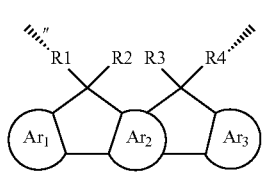
formula (277)

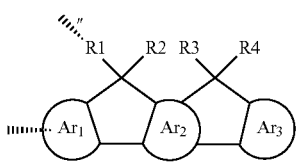
formula (278)

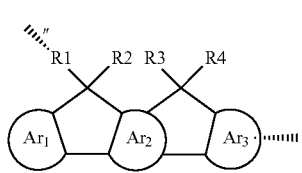
formula (279)

where $Ar_1$, $Ar_2$ and $Ar_3$ each, independently of one another, denote an aromatic or heteroaromatic group having 5 to 60 ring atoms, R1, R2, R3, and R4 each, independently of one another, denote alkyl(ene), cycloalkyl(ene), alkylsilyl(ene), silyl(ene), arylsilyl(ene), alkylalkoxyalkyl(ene), arylalkoxyalkyl(ene), alkylthioalkyl(ene), phosphine, phosphine oxide, sulfone, alkylene sulfone, sulfone oxide, alkylene sulfone oxide, where the alkyl(ene) group in each case has, independently of one another, 1 to 12 C atoms and where one or more H atoms may be replaced by F, Cl, Br, I, alkyl, heteroalkyl, cycloalkyl, an aryl or heteroaryl group.

The substituents R1 to R4 may either be adjacent on the respective $Ar_1$, $Ar_2$ or $Ar_3$ or one or more ring atoms may lie in between. The atoms to which the substituents R1 to R4 are bonded are ring atoms of the aromatic or heteroaromatic group.

Preference is given, in particular, to the following recurring units:

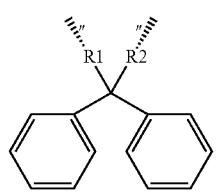
formula (280)

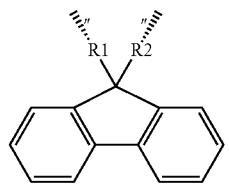
formula (281)

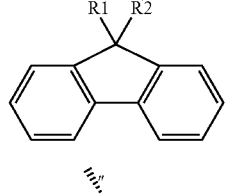
formula (282)

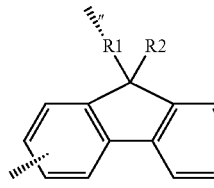
formula (283)

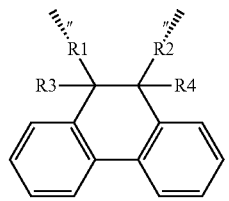
formula (284)

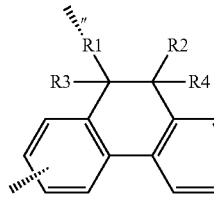
formula (285)

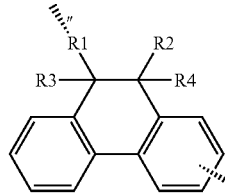
formula (286)

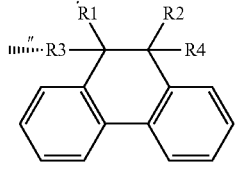

formula (287)
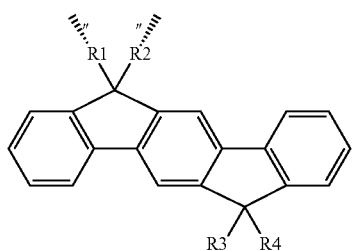

formula (288)
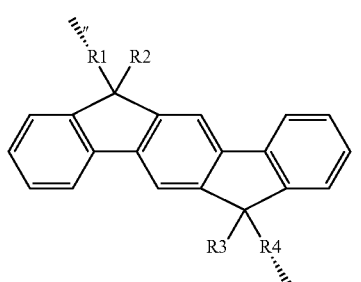

formula (289)
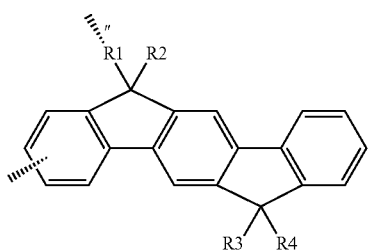

formula (290)
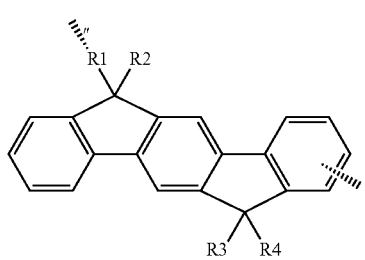

formula (291)
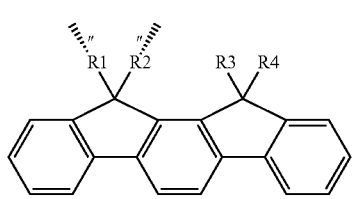

formula (292)
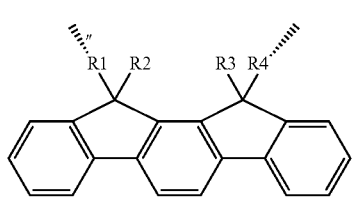

formula (293)
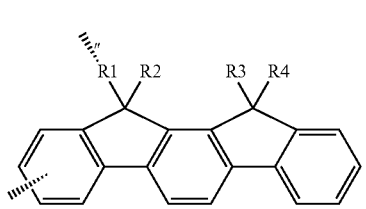

formula (294)
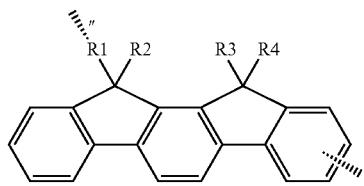

where the symbols and indices have the meaning indicated in the case of structures (265) to (279).

Preference is given, in particular, to the following recurring units, as disclosed, for example, in DE 102009023156:

formula (295)
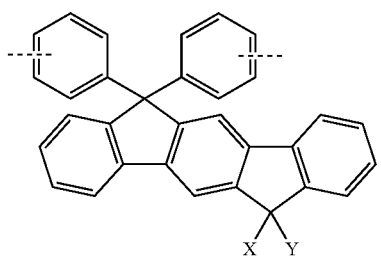

formula (296)
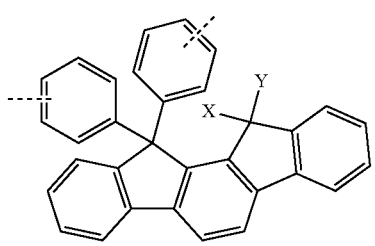

In the formulae (295) and (296), X and Y are each selected, independently of one another, from H, F, an alkyl group having 1 to 40 carbon atoms, an alkenyl group having 2 to 40 carbon atoms, an alkynyl group having 2 to 40 carbon atoms, a substituted or unsubstituted aromatic hydrocarbon radical having 6 to 40 ring atoms and a substituted or unsubstituted heteroaromatic hydrocarbon radical having 5 to 25 ring atoms.

In a further particularly preferred embodiment, the polymer is a polymer (hereinafter side-chain polymer) which contains the emitting unit, as well as host or matrix material units and optionally further emitting units, charge-transport units and electron-transport units, as described below, in the side chain. The side-chain polymer is accompanied by the advantage that the polymer has a high triplet level, which is advantageous, in particular, for phosphorescent OLEDs.

In a preferred embodiment, the side-chain polymer conforms to the following formula (297):

formula (297)
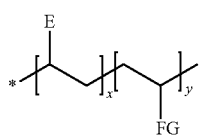

in which E is the emitting unit, FG is a functional group selected from a host or matrix material unit, a further emitting unit, a charge-transport unit and an electron-transport unit, x is greater than zero and x+y is equal to 1. The groups FG in the various recurring units of the formula (297) in the polymer may have different meanings. It is particularly preferred for all functional groups mentioned above to be present in the polymer.

As already mentioned, side-chain polymers of this type can generally be achieved by free-radical copolymerisation of vinyl compounds. The polymer preferably contains at least one phosphorescent emitter unit and at least one charge-transport unit in the side chains, as disclosed in U.S. Pat. No. 7,250,226 B2. Further examples of phosphorescent side-chain polymers of this type are disclosed, for example, in JP 2007/211243 A2, JP 2007/197574 A2, U.S. Pat. No. 7,250,226B2, JP 2007/059939A.

In a further embodiment, the polymer may also be a side-chain polymer containing a fluorescent emitter unit. The fluorescent emitter unit is particularly preferably selected from antracenes, benzanthracenes and derivatives thereof, as published in JP 2005/108556, JP 2005/285661 JP 2003/338375 etc.

Compound B is preferably a polymer or dendrimer in which the emitting unit is either present within a recurring unit in the main-chain backbone or within one of the side chains. It is particularly preferred for the emitting unit to be present in the side chain of the polymer, or for the emitting unit itself to represent the side chain. In this case, it is particularly preferred for the emitting unit to be a metal-ligand coordination compound unit. It is likewise preferred for the emitting unit of compound B not to be in conjugation with the recurring unit of the main-chain backbone to which it is bonded, i.e. for a conjugation-interrupting unit to be located between the emitting unit and the main-chain backbone.

Like compound B can be a polymer or dendrimer, compound A can also be a dendrimer or polymer. All general definitions of polymers mentioned above and the definitions of the polymers and dendrimers for compound B likewise apply to the polymers and dendrimers of compound A. The preferred embodiments of the polymer or dendrimer of compound B likewise apply to the polymer or dendrimer of compound A, with the proviso that examples of units which contain fluorescent emitter units are excluded.

Thus, it is preferred for the polymer of compound A to contain a main chain with one or more side chains thereon. This is preferably not in conjugation with the main-chain backbone.

It is particularly preferred for the polymer of compound A to contain a charge-transport unit, as described below, in a side chain. This may be a further side chain if the emitting unit is likewise present in the or as side chain. However, the emitting unit may also be present in or as a recurring unit in the main-chain backbone of the polymer, so that the polymer does not contain the emitting unit in the side chain, but instead the charge-transport unit in the side chain. The charge-transport unit is preferably a hole-transport unit or an electron-transport unit. However, it may also be a hole-injection or electron-injection unit. It is particularly preferred for the polymer of compound A to contain at least two (different) charge-transport units in the side chains. It is preferred here for one charge-transport unit to be a hole-transport unit and the other charge-transport unit to be an electron-transport unit. The two charge-transport units here may be attached to different side chains, but they may also occur jointly linked to one another in a side chain, or form the latter.

Recurring units which have hole-injection and/or hole-transport properties are or contain, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the host compound of greater than −5.8 eV (against vacuum level), particularly preferably of greater than −5.5 eV.

Recurring units which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O—, S- or N-containing heterocycles having a low LUMO (LUMO=lowest unoccupied molecular orbital). These units preferably result in an LUMO in the host compound of less than −1.5 eV (against vacuum level), particularly preferably of less than −2.0 eV.

The polymer of compound B and/or of compound A is preferably a chargeneutral polymer. It is thus also preferred, if the emitter units of compounds A and B are present as metal-ligand coordination compound units, for these to be neutral coordination compounds, i.e. the valence of the central metals and the valence of the ligands is selected so that the charge within each coordination compound is compensated.

In the mixture according to the invention, both compounds A and B may also each be a polymer or dendrimer.

It is additionally preferred in accordance with the invention for the main-chain backbone of the polymer of compound A to contain recurring units having a triplet level having a higher energy than the triplet level of the phosphorescent emitter unit of compound A and the emitter unit of compound B.

If compound B is a polymer, it is likewise preferred for the main-chain backbone of the polymer of compound B to contain recurring units having a triplet level having a higher energy than the triplet level of the phosphorescent emitter unit of compound A and the emitter unit of compound B.

In addition, it is preferred in accordance with the invention for the maximum of the emission band of compound B in the mixture according to the invention to be at a shorter wavelength than the maximum of the emission band of compound A. These are preferably the maxima of the emission bands of the emitting unit of compound B and the phosphorescent unit of compound A.

It is furthermore preferred for the maximum of the emission band of compound A to be at a shorter wavelength than the maximum of the emission band of compound B. These are preferably taken to mean the maxima of the emitting unit, or of the phosphorescent unit.

In addition, it is also preferred in accordance with the invention for the emission band of compound A in the mixture according to the invention to be in a wavelength range which overlaps with the wavelength range of the absorption band of compound B.

The maximum of the emission band of compound A can be in the wavelength region of blue light and the maximum of the emission band of compound B can be in the wavelength region of green or red light. Alternatively, the maximum of the emission band of compound A can be in the wavelength region of green light and the maximum of the emission band of compound B can be in the wavelength region of red light.

Besides compounds A and B, the mixture according to the invention may preferably also comprise at least one further organic functional compound.

These are selected from hole-transport materials (HTM), hole-injection materials (HIM), electron-transport materials (ETM) and electron-injection materials (EIM).

Suitable hole-transport materials and hole-injection materials for, for example, hole-transporting layers are the following: phenylenediamine derivatives (U.S. Pat. No. 3,615, 404), arylamine derivatives (U.S. Pat. No. 3,567,450), amino-substituted chalcone derivatives (U.S. Pat. No. 3,526, 501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717,462), acylhydrazones, stilbene derivatives (JP-A-61-210363), silazane derivatives (U.S. Pat. No. 4,950,950), polysilanes (JP-A-2-204996), aniline copolymers (JP-A-2-282263), thiophene oligomers (JP Heisei 1 (1989) 211399), polythiophenes, poly(N-vinylcarbazole) (PVK), polypyrroles, polyanilines and other electrically conducting macromolecules, as well as further copolymers, such as, for example, PEDOT/PSS (=an aqueous dispersion of poly(3, 4-ethylenedioxythiophene) with polystyrene (PSS)). Plasma-deposited fluorocarbon polymers (U.S. Pat. No. 6,127,004, U.S. Pat. No. 6,208,075, U.S. Pat. No. 6,208, 077), porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type, triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. No. 3,567,450 and U.S. Pat. No. 3,658,520), or tetraaryldiamines (the two tertiary amine units are connected via an aryl group). It is also possible for more triarylamino groups to be present in the molecule. Phthalocyanine derivatives, naphthalocyanine derivatives, butadiene derivatives or quinoline derivatives, such as, for example, dipyrazino[2,3-f:2',3'-h]quinoxalinehexacarbonitrile, are also suitable.

The HTM or HIM used can likewise be inorganic compounds, such as p-type Si and p-type SiC, or inorganic oxides, such as, for example, vanadium oxide ($VO_x$), molybdenum oxide ($MoO_x$) or nickel oxide ($NiO_x$).

Preference is given as HTM or HIM to aromatic tertiary amines containing at least two tertiary amine units (US 2008/0102311 A1, U.S. Pat. No. 4,720,432 and U.S. Pat. No. 5,061,569), such as, for example, NPD (α-NPD=4,4'-bis[N-(1-naphthyl)-N-phenylamino]biphenyl) (U.S. Pat. No. 5,061,569), TPD 232 (=N,N'-bis-(N,N'-diphenyl-4-aminophenyl)-N,N-diphenyl-4,4'-diamino-1,1'-biphenyl) or MTDATA (MTDATA or m-MTDATA=4, 4',4"-tris[3-methylphenyl)phenylamino]triphenylamine) (JP-A-4-308688), TBDB (=N,N,N',N'-tetra(4-biphenyl)diaminobiphenylene), TAPC (=1,1-bis(4-di-p-tolylaminophenyl)cyclohexane), TAPPP (=1,1-bis(4-di-p-tolylaminophenyl)-3-phenylpropane), BDTAPVB (=1,4-bis[2-[4-[N,N-di(p-tolyl)amino]phenyl]vinyl]benzene), TTB (=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'''-diamino-1,1',4',1''',4'',1'''-quaterphenyl, likewise tertiary amines containing carbazole units, such as, for example, TCTA (=4-(9H-carbazol-9-yl)-N,N-bis[4-(9H-carbazol-9-yl)phenyl]benzenamine). Preference is likewise given to hexaazatriphenylene compounds in accordance with US 2007/0092755 A1 and phthalocyanine derivatives (for example $H_2Pc$, CuPc (=copper phthalocyanine), CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O-GaPc).

formula (298)

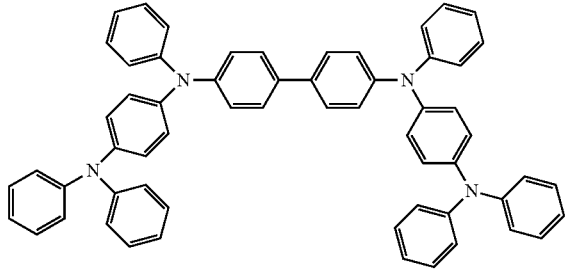

TPD 232

Particular preference is given to the following triarylamine compounds, consistency which may also be substituted (the source in which the compounds are published is in each case indicated below):

formula (299)

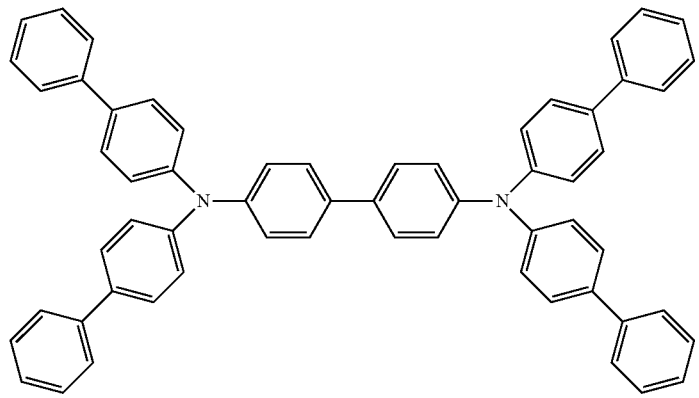

- TBDB: EP 1162193 B1 and EP 650955 B1 formula (300)
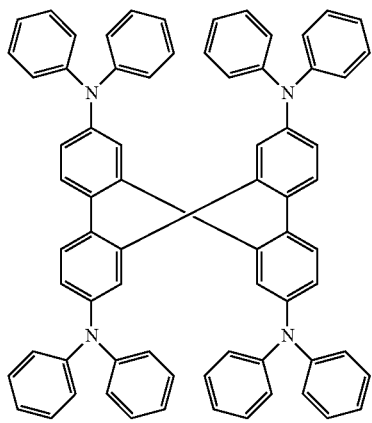
-Synth.Metals 1997, 91(1-3), 209 and DE 19646119 A1
formula (301)
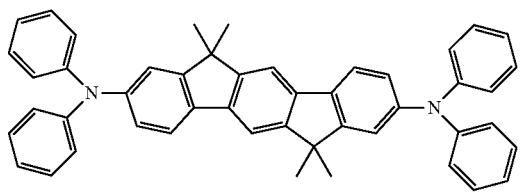
- WO 2006/122630 A1 and EP 1860097 A1
formula (302)
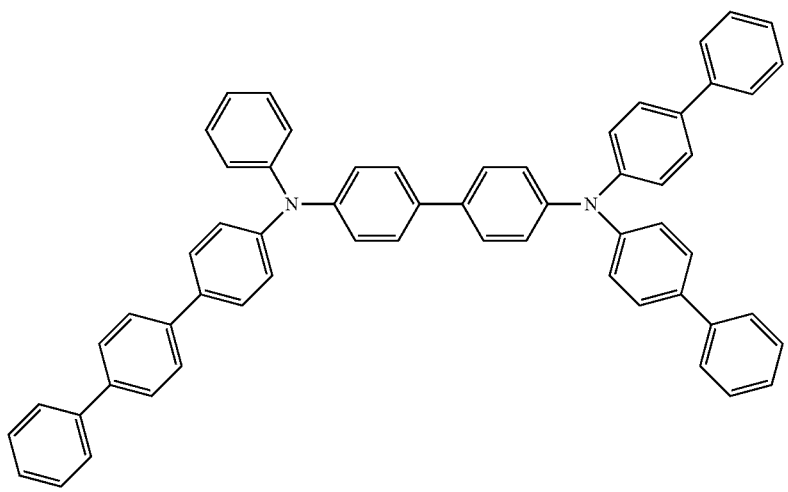
- EP 18349545 A1
formula (303)
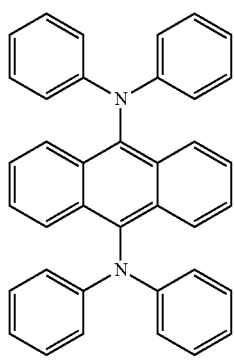
- JP 08053397 A and US 6251531 B1

-continued
formula (304)
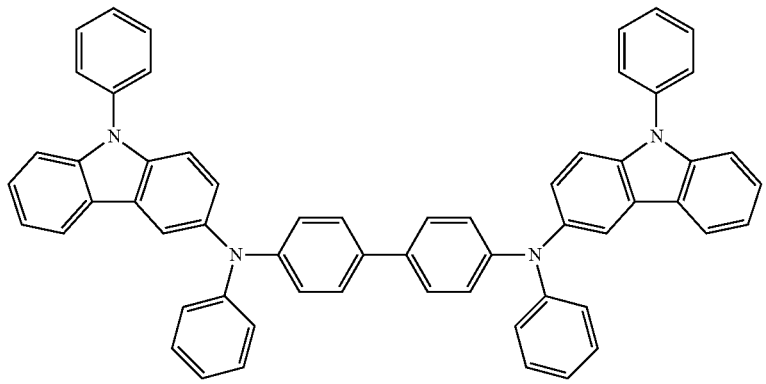
- EP 1661888
formula (305)
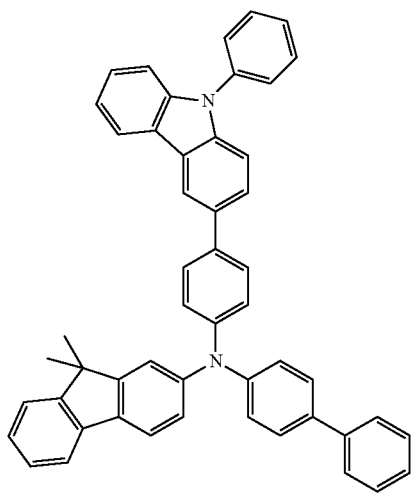
- US 2005/0221124, WO 09/041635
formula (306)
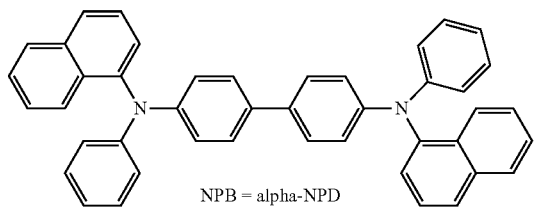
NPB = alpha-NPD
- NPB = 4,4'-bis[N-(1-naphthyl)-N-phenylamino]biphenyl
formula (307)
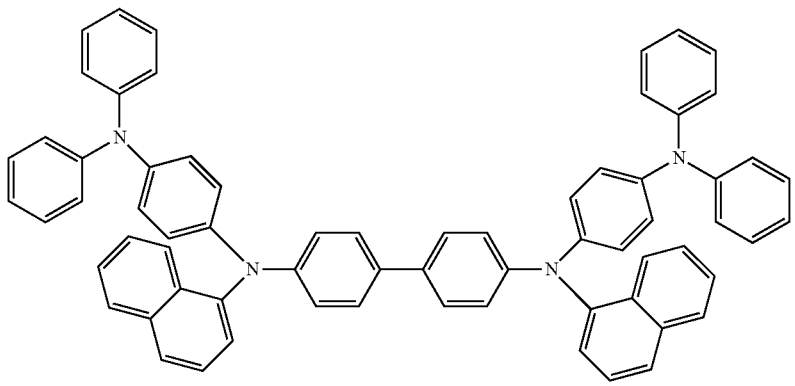
- US 7399537 B2, US 2006/0061265 A1

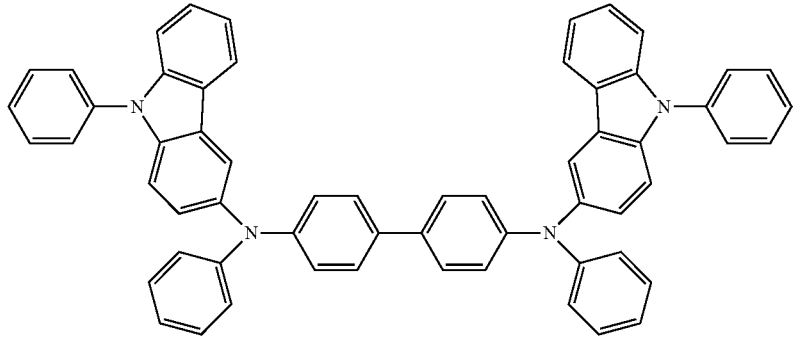

- EP 1661888 B1 formula (308)

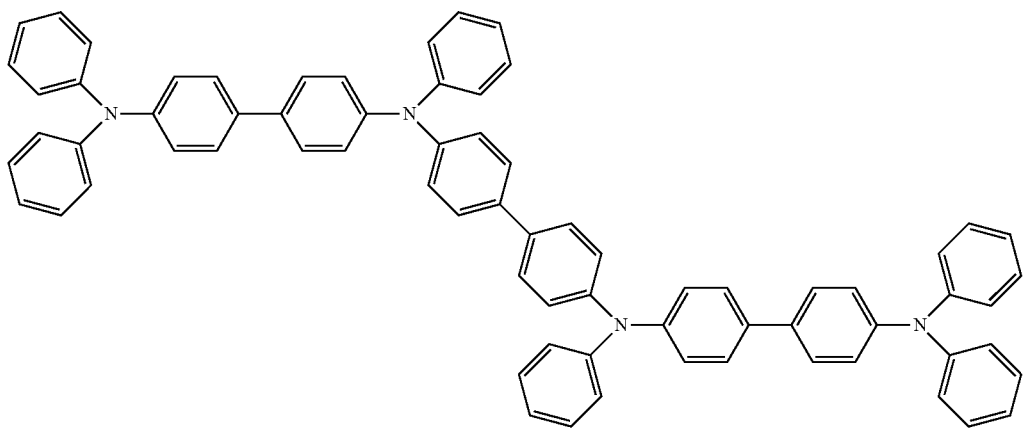

- JP 08292586 A formula (309)

Further hole-transporting materials as hole-injection materials are described in EP 0891121 A1 and EP 1029909 A1, injection layers in general in US 2004/0174116 A1.

Hole-transporting layers can be in the form of pure material or doped. Doping may improve the conductivity. Examples of intrinsic materials are pure α-NPB and TPD. An example of a doped layer is m-MTDATA doped with $F_4$-TCNQ, in accordance with US 2003-0230980.

Hole-transporting layers may be crosslinked, for example $N^4,N^{4'}$-di(naphthalen-1-yl)-$N^4,N^{4'}$-bis(4-vinylphenyl)biphenyl-4,4'-diamine has a low temperature for the crosslinking reaction. Fullerene derivatives, for example {6}-1-(3-(methoxycarbonyl)propyl)-{5}-1-phenyl-[6,6]-C61 in accordance with US 2008/0054783 A1, can also be employed as dopant. Further fullerene derivatives are described in Wang et. al., *Applied Physics Lett.* 80(20), (2002), 3847-3849.

Suitable compounds as ETM or EIM for preferably electron-transporting and electron-injecting layers are metal chelates of 8-hydroxyquinoline (for example LiQ, $AlQ_3$, $GaQ_3$, $MgQ_2$, $ZnQ_2$, $InQ_3$, $ZrQ_4$), BAIQ, Ga oxinoid complexes, 4-azaphenanthren-5-ol/Be complexes (U.S. Pat. No. 5,529,853 A),

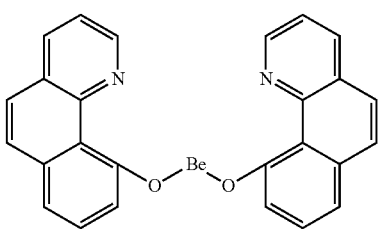

formula (310)

butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779), formula (311)

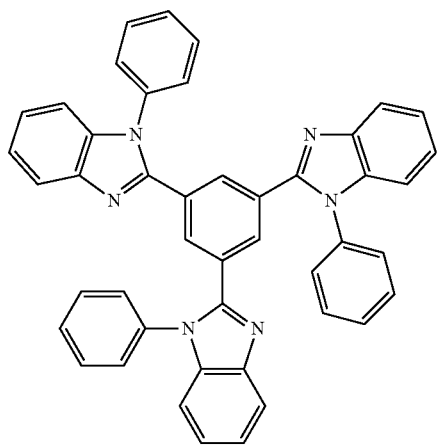

-TPBI (2,2′,2″-(1,3,5-benzenetriyl)tris(1-phanyl-1H-benz-imidazole)

1,3,5-triazines, for example spirobifluorenetriazine derivatives (for example in accordance with the unpublished application DE 102008064200.2) pyrenes, anthracenes, tetracenes, fluorenes, spirofluorenes, dendrimers, tetracenes (for example rubrene derivatives), 1,10-phenanthroline derivatives (JP 2003-115387, JP 2004-311184, JP-2001-267080, WO 2002-043449), silacyclopentadiene derivatives (EP 1480280, EP 1478032, EP 1469533), borane derivatives, such as, for example, triarylborane derivatives with Si, formula (312)

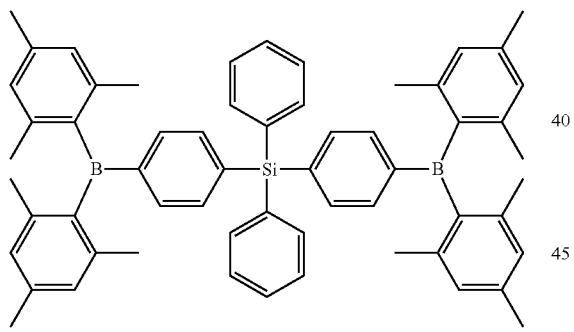

-US 2007/0087219 A1 pyridine derivatives (JP 2004-200162), phenanthrolines, especially 1,10-phenanthroline derivatives, such as, for example, BCP and Bphen, also a plurality of phenanthrolines connected via biphenyl or other aromatic groups (US 2007/0252517 A1) or phenanthrolines connected to anthracene (US 2007/0122656 A1).

formula (313)

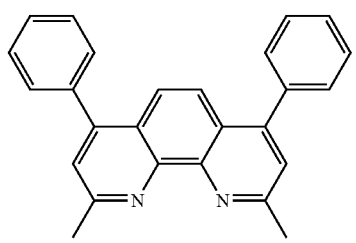

-bathocuproin formula (314)

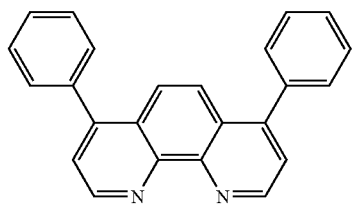

-Bphen

Likewise suitable as ETM or EIM are heterocyclic organic compounds, such as, for example, thiopyran dioxides, oxazoles, triazoles, imidazoles or oxadiazoles. For examples of the use of five-membered rings containing N, such as, for example, oxazoles, thiazoles, oxadiazoles, thiadiazoles, triazoles, inter alia, US 2008/0102311 A1 can be employed. Preferred compounds are the following (the source of the publication is given below): triazoles, for example formula (315)

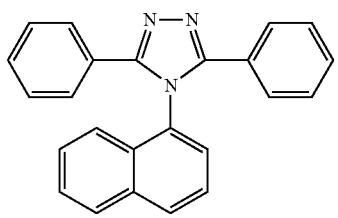

Y.A. Levin, M.S. Skorobogatova, Khimiya Geterotsiklicheskikh Soedinenii 1967 (2), 339-341.

1,3,4-oxadiazoles, for example formula (316)

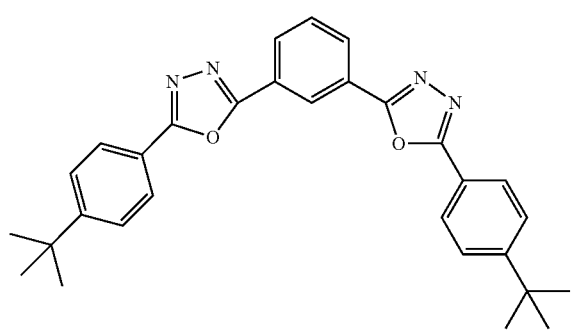

- OXD-7

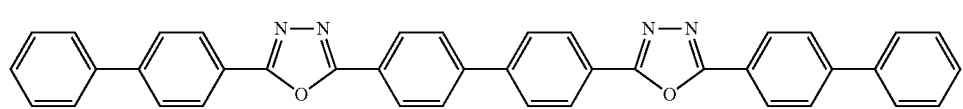

formula (317)

- US 2007/0273272 A

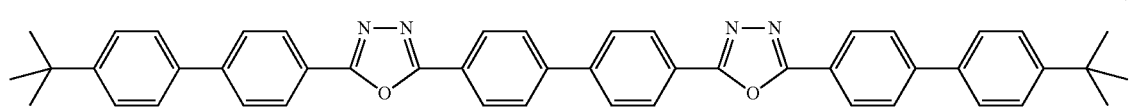

formula (318)

- US 2007/0273272 A1

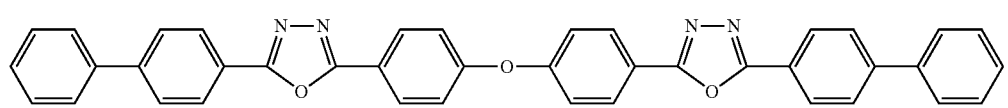

formula (319)

- US 2007/0273272 A1 formula (320)

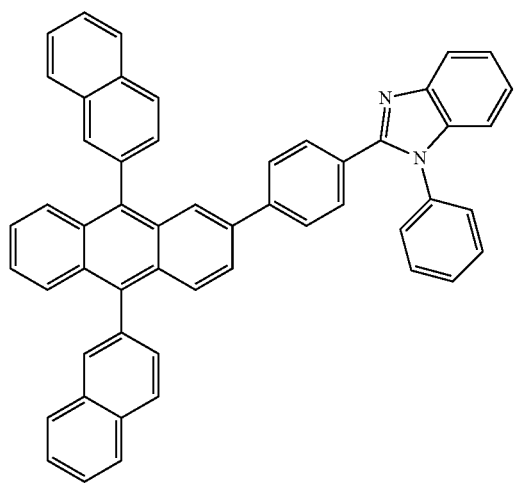

- US 6878469 B2

It is also possible to employ organic compounds, such as derivatives of fluorenone, fluorenylidenemethane, perylenetetracarbonic acid, anthraquinonedimethane, diphenoquinone, anthrone and anthraquinonediethylenediamine, as ETM or EIM.

Preference is given as ETM or EIM to 2,9,10-substituted anthracenes (with 1- or 2-naphthyl and 4- or 3-biphenyl) or molecules which contain two anthracene units (US2008/0193796 A1). Also very advantageous is the compound of 9,10-substituted anthracene units with benzimidazole derivatives.

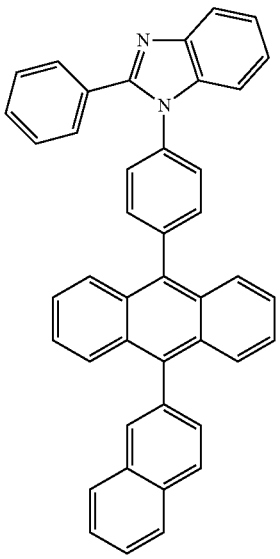

formula (321)

- US 2006/147747 A

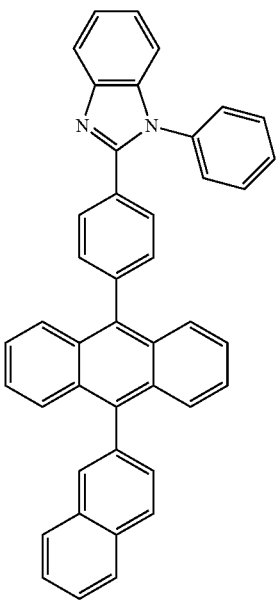

formula (322)

- EP 1551206-A1

The present invention furthermore relates to a non-conjugated polymer or dendrimer containing a phosphorescent emitter unit A1 and an emitting unit B1.

Emitting unit B1 can be a phosphorescent or fluorescent emitter unit, but is preferably a phosphorescent emitter unit.

Suitable phosphorescent and fluorescent emitter units have already been described above in connection with the mixture according to the invention. All preferred embodiments with respect to the phosphorescent and fluorescent emitter units in the mixture according to the invention also apply to the preferred variants of the non-conjugated polymer or dendrimer according to the invention. In the figurative sense, emitter unit A1 here corresponds to the above-mentioned emitter unit in compound A and emitter unit B1 corresponds to the above-mentioned emitting unit in compound B.

All features of the above-mentioned polymer in connection with compound B of the mixture according to the invention, the process for the preparation thereof and units optionally present therein also apply to the non-conjugated polymer or dendrimer according to the invention, with the proviso that the non-conjugated polymer according to the invention is always a non-conjugated polymer and, besides the one emitting unit B1, also contains the phosphorescent unit A1.

It is in addition preferred for units A1 and B1 in the non-conjugated polymer or dendrimer according to the invention not to be in conjugation with one another, i.e. the polymer contains at least one conjugation-interrupting unit between these units. A conjugation-interrupting unit is preferably taken to mean a unit as described above. Particularly preferred conjugation-interrupting units are those of the formula (265) to (279), and preferred forms thereof, as mentioned above.

In the non-conjugated polymer or dendrimer according to the invention, units A1 and B1 can be present as a recurring unit in the main chain of the polymer or also linked as side chains. The polymer or dendrimer may in addition contain further functional groups as recurring units in the main chain or in the side chain, as mentioned below.

In all embodiments mentioned, the non-conjugated polymer or dendrimer according to the invention is preferably one in which both phosphorescent emitter unit A1 and also emitting unit B1 is a metal-ligand coordination compound unit. The definition and preferred embodiments and examples of the metal-ligand coordination compound unit are indicated above.

In a preferred embodiment, the non-conjugated polymer corresponds to a polymer of the following formula (323):

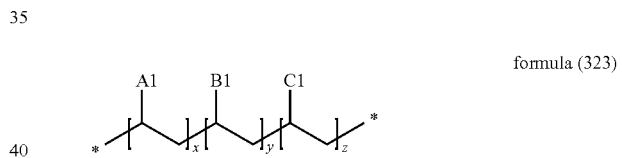

formula (323)

In formula (323), the symbols and indices used have the following meanings:

C1 is preferably a radical which is selected from the units which consists of hole-transport materials, electron-transport materials and matrix materials, particularly preferably the matrix materials as described above; the said hole-transport materials and electron-transport materials are as described above and below;

A1 and B1 have the meanings defined above, with the proviso that the above-mentioned emitting units/compounds do not carry a hydrogen atom at one position and are bonded to the polymer main-chain backbone at this position; and that x, y, z are mole percent (mol-%) of the respective unit, where x+y+z=1 with where x>0, y>0, and z≥0, preferably z>0.

In a furthermore preferred embodiment, the non-conjugated polymer corresponds to a polymer of the following formula (324):

formula (324)

In formula (324), the symbols and indices used have the following meaning:

BB, identically or differently on each occurrence, represents a main-chain backbone unit of the polymer which ensures the conjugation interruption of the polymer; BB is thus preferably a conjugation-interrupting unit as described above; and A1, B1,C1, x, y and z have the same meanings as defined for formula (323), with the proviso that the above-mentioned emitting units/compounds do not carry hydrogen atoms at two position and are bonded to BB at these positions.

In a furthermore preferred embodiment, the non-conjugated polymer corresponds to a polymer of the following formula (325):

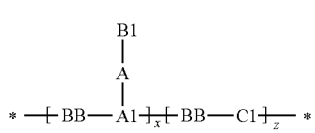

formula (325)

The symbols and indices used in formula (325) have the following meanings:

A is a conjugation-interrupting unit selected from the group consisting of linear or branched alkylene, cycloalkylene, alkylsilylene, silylene, arylsilylene, alkylalkoxyalkylene, arylalkoxyalkylene, alkylthioalkylene, sulfone, alkylene sulfone, sulfone oxide, alkylene sulfone oxide, where the alkylene groups in each case has, independently of one another, 1 to 12 C atoms and where one or more H atoms may be replaced by F, Cl, Br, I, alkyl, heteroalkyl, cycloalkyl, aryl or heteroaryl;

BB, identically or differently on each occurrence, represents a main-chain backbone unit of the polymer which ensures the conjugation interruption of the polymer;

A1, B1 and C1 have the same meanings as defined for formula (323), with the proviso that the above-mentioned emitting units/compounds in the case of B1 do not carry a hydrogen atom at one position and are bonded to A at this position and the above-mentioned emitting units/compounds in the case of A1 do not carry hydrogen atoms at three positions and are bonded to BB and A at these positions; and x, z are mole percent (mol-%) of the respective unit, x+z is 1, where x>0, and z≥0, preferably z>0.

In a furthermore preferred embodiment, the non-conjugated polymer corresponds to a polymer of the following formula (326):

formula (326)

The symbols and indices used in formula (326) have the following meanings:

BB represents a main-chain backbone unit of the polymer which ensures the conjugation interruption of the polymer;

A1, B1 and C1 have the same meanings as defined for formula (323), with the proviso that the above-mentioned emitting units/compounds in the case of B1 do not carry a hydrogen atom at one position and are bonded to BB at this position and the above-mentioned emitting units/compounds in the case of A1 do not carry hydrogen atoms at two positions and are bonded to BB at these positions; and x, z are mole percent (mol-%) of the respective unit, x+z is 1, where x>0, and z≥0, preferably z>0.

The bonding of two emitting units, by A as in formula (325) and by BB as in formula (326), in a polymer has the advantage over a mixture of emitter compounds and host that the two emitter units are not randomly distributed, and the requisite small separation of the two emitter molecules from one another (donor and acceptor) is thus guaranteed to the full extent.

The following copolymers are very particularly preferred in accordance with this invention:

a block copolymer of the formula (323) preferably contains two blocks of the general formula (327):

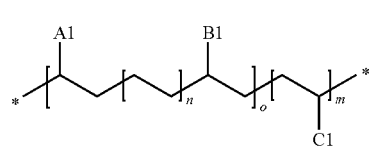

formula (327)

The symbols and indices used here have the following meanings:

n is identical or different on each occurrence, preferably identical, and preferably equal to 0, 1, 2 or 3; o and m are the recurring numbers of the units, of greater than or equal to 3, preferably greater than or equal to 10, particularly preferably of greater than or equal to 20. The other symbols used have the same meaning as defined above.

A block copolymer of the formula (324) preferably contains two blocks of the general formula (328):

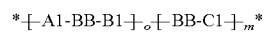

*–[–A1-BB-B1–]–$_o$[–BB-C1–]–$_m$*   formula (328)

The symbols and indices used in formula (328) have the same meanings as defined above.

For unit BB, preference is given to the use of units as indicated above in connection with the matrix materials for the polymers of the mixture according to the invention, with the proviso that it contains at least one conjugation-interrupting unit, such as, for example, an sp$^3$ atom.

A block copolymer of the formula (325) preferably contains two blocks of the general formula (329):

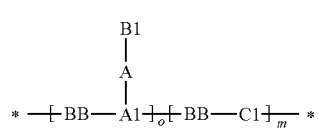

formula (329)

The symbols and indices used in formula (329) have the same meanings as defined above. For unit BB, preference is given to the use of units as indicated in connections with the matrix materials for the polymers of the mixture according to the invention, with the proviso that they contain at least one conjugation-interrupting unit, such as, for example, an sp$^3$ atom.

A block copolymer of the formula (326) preferably contains two blocks of the general formula (330):

formula (330)

The symbols and indices used in the formula (330) have the same meanings as defined above. For unit BB, preference is given to the use of units as indicated in connection with the matrix materials for the polymers of the mixture according to the invention, with the proviso that they contain at least one conjugation-interrupting unit, such as, for example, an $sp^3$ atom.

The present invention furthermore relates to a block copolymer containing two blocks (block1 and block2), where block1 contains at least one recurring unit which contains a functional group, which can be selected from HTM, HIM, ETM, EIM, host, phosphorescent emitter or fluorescent emitter; and block2 has an ion-transport property.

Block1 therein is preferably built up in accordance with the general formula (331):

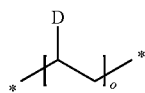

formula (331)

where D is a functional group, preferably selected, from HTM, HIM, ETM, EIM, host, phosphorescent emitter or fluorescent emitter; and o is the recurring numbers of the unit, and a natural number of greater than or equal to 3, preferably greater than or equal to 10, particularly preferably greater than or equal to 20;

Block2 preferably has an Li ion-transport property. In a preferred introduction form for block2, a block of the general formula (332) is:

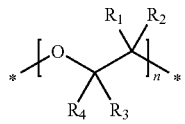

formula (332)

Such polymers PEO blocks containing, can be used in Li salt-containing OLEC. The OLEC, containing a PEO block copolymer according to the invention has the following advantages over a conventional OLEC, in which, apart from an emissive compound and Li salt, an additional Li ion conductor, such as, for example, polyethylene oxide, is also present.

Polyethylene oxide has a very low Tg, which can result in a considerable restriction during processing; These problems can be solved by the use of the PEO block copolymers according to the invention. In the case of the 3 components used in conventional OLECs, there are very often phase separations during printing or coating. The use of the PEO block copolymers according to the invention enables these problems to be minimised.

The bonds denoted by an asterisk in all general formulae for polymers depicted in this application represent bonds to further recurring units or to end groups of the polymer.

A "$C_{1-40}$-alkyl group" or "$C_{1-20}$-alkyl group" or "$C_{1-10}$-alkyl group" or "$C_{1-4}$-alkyl group" in the present invention is preferably taken to mean linear, branched or cyclic alkyl groups. The linear alkyl groups preferably have 1 to 40, ml to 20, 1 to 10 or 1 to 4 carbon atoms respectively. The branched or cyclic alkyl groups preferably have 3 to 40, 3 to 20, 3 to 10 or 3 to 40 carbon atoms respectively. Preference is given to alkyl groups having 1 to 4, or 3 or 6 carbon atoms respectively. One or more hydrogen atoms on these alkyl groups may be replaced by a fluorine atom. In addition, one or more of the $CH_2$ groups in these units may be replaced by NR, O or S(R here is a radical selected from the group consisting of H and $C_{1-6}$-alkyl). If one or more of the $CH_2$ groups is replaced by NR, O or S, it is particularly preferred for only one of these groups to be replaced; particularly preferably by an O atom. Examples of such compounds include the following: methyl, ethyl, n-propyl, i-propyl, n-butyl, i-butyl, s-butyl, t-butyl, 2-methylbutyl, n-pentyl, s-pentyl, n-hexyl, n-heptyl, n-octyl, 2-ethylhexyl, trifluoromethyl, pentafluoroethyl, 2,2,2-trifluoroethyl, cyclopentyl, cyclohexyl, cycloheptyl and cyclooctyl.

A "$C_{2-40}$-alkenyl group" is taken to mean a linear alkenyl group having 2 to 40 carbon atoms or a branched or cyclic alkenyl group having 3 to 40 carbon atoms. It is more preferably a group having 2 or 3 to 20, even more preferably a group having 2 or 3 to 10 and most preferably a group having 2 or 3 to 6 carbon atoms. One or more hydrogen atoms may be replaced by a fluorine atom. In addition, one or more of the $CH_2$ groups in these units may be replaced by NR, O or S(R here is a radical selected from the group consisting of H and $C_{1-6}$-alkyl). If one or more of the $CH_2$ groups is replaced by NR, O or S, it is particularly preferred for only one of these groups to be replaced. Examples thereof which may be mentioned are ethenyl, propenyl, butenyl, pentenyl, cyclopentenyl, hexenyl, cyclohexenyl, heptenyl, cycloheptenyl, octenyl and cyclooctenyl.

A "$C_{2-40}$-alkynyl group" is taken to mean a linear or branched alkynyl group having 2 to 40 carbon atoms. The alkynyl group more preferably has 2 to 20, even more preferably 2 to 10 and most preferably 2 to 6 carbon atoms. One or more hydrogen atoms may be replaced by a fluorine atom. In addition, one or more of the $CH_2$ groups in these units may be replaced by NR, O or S(R here is a radical selected from the group consisting of H and $C_{1-6}$-alkyl). If one or more of the $CH_2$ groups is replaced by NR, O or S, it is particularly preferred for only one of these groups to be replaced. Examples thereof which may be mentioned are ethynyl, propynyl, butynyl, pentynyl, hexynyl and octynyl.

A mono- or polycyclic aromatic or heteroaromatic hydrocarbon radical preferably contains 5 to 40, more preferably 5 to 20, most preferably 5 or 6 aromatic ring atoms. If the unit is an aromatic unit, it preferably contains 6 to 40, more preferably 6 to 20, most preferably 6 carbon atoms as ring atoms. If the unit is a heteroaromatic unit, it contains 5 to 40, more preferably 5 to 10, most preferably 5 aromatic ring atoms, at least one of which is a heteroatom. The heteroatoms are preferably selected from N, O and/or S. An aromatic or heteroaromatic unit here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, benzothiophene, benzofuran and indole, etc.

Examples according to the invention of the aromatic or heteroaromatic hydrocarbon radicals are accordingly: benzene, naphthalene, anthracene, phenanthrene, pyrene, chrysene, benzanthracene, perylene, naphthacene, pentacene, benzopyrene, furan, benzofuran, isobenzofuran, dibenzofuran, thiophene, benzothiophene, isobenzothiophene, dibenzothiophene, pyrrole, indole, isoindole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

A mono- or polycyclic aromatic ring system in the sense of this invention is preferably taken to mean an aromatic ring system having 6 to 60 carbon atoms, preferably 6 to 30, particularly preferably 6 to 10 carbon atoms. An aromatic ring system in the sense of the present invention is intended to be taken to mean a system which does not necessarily contain only aromatic groups, but instead in which, in addition, a plurality of aromatic may be interrupted by a short non-aromatic unit (<10% of the atoms other than H, preferably <5% of the atoms other than H), such as, for example, sp³-hybridised C, O, N, etc. These aromatic ring systems may be monocyclic or polycyclic, i.e. they may contain one ring (for example phenyl) or two or more rings, which may also be condensed (for example naphthyl) or covalently linked (for example biphenyl), or contain a combination of condensed and linked rings.

Preferred aromatic ring systems are, for example, phenyl, biphenyl, triphenyl, naphthyl, anthracyl, binaphthyl, phenanthryl, dihydrophenanthryl, pyrene, dihydropyrene, chrysene, perylene, tetracene, pentacene, benzopyrene, fluorene and indene.

A mono- or polycyclic heteroaromatic ring system in the sense of this invention is preferably taken to mean a heteroaromatic ring system having 5 to 60 ring atoms, preferably 5 to 30, particularly preferably 5 to 14 ring atoms. The heteroaromatic ring system contains at least one heteroatom selected from N, O and S (remaining atoms are carbon). A heteroaromatic ring system is additionally intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, sp³-hybridised C, O, N, etc. These heteroaromatic ring systems may be monocyclic or polycyclic, i.e. they may contain one ring (for example pyridyl) or two or more rings, which may also be condensed or covalently linked, or contain a combination of condensed and linked rings.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups. Particular preference is given to imidazole, benzimidazole and pyridine.

The term "aryl" or "aryl group" is taken to mean a mono- or polycyclic aromatic or heteroaromatic ring system, as defined above.

"Cycloalkyl" in the present invention is taken to mean a cyclic alkyl group as defined above, preferably having 3 to 8, more preferably 5 to 8 and most preferably 5 or 6 carbon atoms.

The term "alkylsilyl" is taken to mean mono($C_{1-12}$-alkyl) silyl groups, di($C_{1-12}$-alkyl)silyl groups and tri-($C_{1-12}$-alkyl) silyl groups.

A "mono($C_{1-12}$-alkyl)silyl group" in the present invention is taken to mean an ($SiH_2$) group which is linked to a linear or branched alkyl group (as defined above) having 1 or 3 to 12 carbon atoms respectively, more preferably 1 or 3 to 6 carbon atoms respectively. A "di($C_{1-12}$-alkyl)silyl group" in the present invention is taken to mean an (SiH) unit which is linked to two linear or branched alkyl groups (as defined above), on each occurrence identical or different, having 1 or 3 to 12 carbon atoms respectively, particularly preferably 1 or 3 to 6 carbon atoms respectively. A "tri($C_{1-12}$-alkyl)silyl group" in the present invention is taken to mean an (Si) unit which is linked to three linear or branched alkyl groups (as defined above), on each occurrence identical or different, having 1 or 3 to 12 carbon atoms respectively, more preferably 1 or 3 to 6 carbon atoms respectively. The examples indicated above in connection with "$C_{1-40}$-alkyl group" also apply to the alkyl groups present here, so long as they have the corresponding number of carbon atoms.

"Silyl" in the present compound is taken to mean a silyl group having 1 or 3 to 5 silicon atoms, which is linear or branched. Examples thereof are monosilyl, disilyl, trisilyl, tetrasilyl and pentasilyl.

"Arylsilyl" in the present invention is taken to mean an Si1-silyl group which is substituted by one, two or three, mono- or polycyclic, aromatic or heteroaromatic ring systems having 5 to 60 aromatic ring atoms.

"Alkoxyalkyl" in the present invention is taken to mean a monovalent ether unit having two linear or branched alkyl groups having 1 or 3 to 12, more preferably 1 or 3 to 6 carbon atoms respectively, which are bonded via an oxygen atom. The examples indicated above in connection with the definition of "$C_{1-40}$-alkyl" also apply here to the alkyl groups present, so long as they have the corresponding number of atoms.

"Arylalkoxyalkyl" in the present invention is taken to mean a monovalent unit as defined above for "alkoxyalkyl", where one alkyl group is substituted by an aryl which represents a mono- or polycyclic, aromatic or heteroaromatic ring system having 5 to 60 aromatic ring atoms as defined above.

"Alkylthioalkyl" in the present invention is taken to mean a monovalent thioether unit having two linear or branched alkyl groups having 1 or 3 to 12, more preferably 1 or 3 to 6 carbon atoms respectively, which are bonded via a sulfur atom. The examples indicated above in connection with the definition of "$C_{1-40}$-alkyl" also apply here to the alkyl groups present, so long as they have the corresponding number of atoms.

"Alkyl sulfone" in the present invention is taken to mean an $S(=O)_2$— unit which is substituted by an alkyl group having 1 to 12 carbon atoms. The examples indicated above in connection with the definition of "$C_{1-40}$-alkyl" also apply here to the alkyl groups present, so long as they have the corresponding number of atoms.

"$C_{1-12}$-alkyl sulfoxide" in the present invention is taken to mean an —S(=O)— unit which is substituted by an alkyl group having 1 to 12 carbon atoms.

The examples indicated above in connection with the definition of "$C_{1-40}$-alkyl" also apply here to the alkyl groups present, so long as they have the corresponding number of carbon atoms.

All polymers or dendrimers described in this invention may, besides the recurring units according to the invention, contain further structural units as recurring units in the main-chain backbone or as side chain, selected from groups 1 to 8 below. These are, inter alia, those as disclosed and extensively listed in WO 02/077060 A1 and in WO 2005/014689 A2. These are incorporated into the present invention by way of reference. The further structural units can originate, for example, from the following classes:

Group 1: units which enhance the hole-injection and/or hole-transport properties of the polymers;
Group 2: units which enhance the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve the transfer from the so-called singlet
state to the triplet state;
Group 6: units which influence the emission colour of the resultant polymers;
Group 7: units which are typically used as backbone;
Group 8: units which influence the film-morphological and/or the rheological properties of the resultant polymers.

Preferred host compounds according to the invention are those in which at least one structural unit has hole-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan units and further O-, S- or N-containing heterocycles having a high HOMO (HOMO=highest occupied molecular orbital). These arylamines and heterocycles preferably result in an HOMO in the host compound of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine units, but also triarylboranes and further O—, S- or N-containing heterocycles having a low LUMO (LUMO=lowest unoccupied molecular orbital). These units in the host compound preferably result in an LUMO of less than −1.5 eV (against vacuum level), particularly preferably less than −2.0 eV.

It may be preferred for the host compounds according to the invention to contain units from group 3 containing structures which increase the hole mobility and structures which increase the electron mobility (i.e. units from group 1 and 2) bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units according to group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from group 8 to 10 (Ru, Os, Rh, Ir, Pd, Pt). Suitable structural units for the host compounds according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve the transfer from the singlet state to the triplet state and which, employed in support of the structural units from group 3, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which do not fall under the above-mentioned groups, i.e. which have only little influence on the charge-carrier mobilities, which are not organometallic complexes or which do not influence the singlet-triplet transfer. Structural elements of this type may influence the emission colour. Depending on the unit, they can therefore also be employed as emitters. Preference is given here to aromatic structures having 6 to 40 C atoms or also tolan, stilbene or bisstyrylarylene units, each of which may be substituted by one or more radicals R. Particular preference is given here to the incorporation of 1,4 phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4" terphenylylene, 4,4'-bi-1,1'-naphthylylene, 4,4'-tolanylene, 4,4'-stilbenzylene, 4,4" bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9' spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological and/or the rheological properties of the host compounds, such as, for example, siloxanes, long alkyl chains or fluorinated groups, but also particularly rigid or flexible units, such as, for example, liquid crystal-forming units or crosslinkable groups.

Preference is given to polymers or dendrimers according to the invention or polymers or dendrimers of the mixtures according to the invention which, besides the structural units of the formula (1), simultaneously additionally contain one or more units selected from groups 1 to 8 which are different from the preferred structural units. It may likewise be preferred for more than one structural unit from one group to be present simultaneously.

Preference is given here to polymers according to the invention or polymers or dendrimers of the mixtures according to the invention which, besides at least one structural unit of the formula (1), also contain units from group 7, particularly preferably at least 50 mol % of these units, based on the total number of structural units of the polymer or dendrimer.

It is likewise preferred for the polymers according to the invention or the polymers or dendrimers of the mixtures according to the invention to contain units which improve charge transport or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention or the polymers or dendrimers of the mixtures according to the invention to contain structural units from group 7 and units from group 1 and/or 2, in particular at least 50 mol % of units from group 7 and 0.5 to 30 mol % of units from group 1 and/or 2.

In order to be able to polymerise the above-mentioned structural units, these preferably contain leaving groups which are accessible to a coupling reaction, preferably a metal-catalysed cross-coupling reaction. The compounds functionalised with the leaving groups represent the basis for a polymerisation. Thus, bromine derivatives can be reacted with arylboronic acids or arylboronic acid derivatives by Suzuki coupling or with organotin compounds by the Stille method to give the corresponding polymers or dendrimers.

These processes are known from the prior art. Thus, the Suzuki coupling is, for example, a cross-coupling reaction for the formation of diphenyl derivatives or vinylaromatic compounds, where arylboronic acids are preferably reacted with halogenated aromatic compounds with catalytic use of preferably palladium/phosphine complexes. The reactivity of the aromatic compounds increases from bromine via trifluoromethanesulfonic acid ester to iodine, where in the meantime even weakly reactive chlorinated aromatic compounds can be reacted with palladium/phosphine catalysts. The Stille cross-coupling reaction proceeds analogously, with recourse to organotin compounds instead of organoboron compounds, although these are not so preferred owing to their high toxicity.

For the purposes of the invention, particular preference is given to structural units which are substituted by reactive leaving groups, such as bromine, iodine, boronic acid, boronic acid ester, tosylate or triflate. These may also be used as comonomers for the production of corresponding conjugated, partially conjugated or non-conjugated polymers, oligomers or also as the core of dendrimers. The polymerisation here preferably takes place via the halogen functionality or the boronic acid functionality.

A further possibility for polymer synthesis consists in preparing vinyl group-containing or alkenyl group-containing monomers by acid-induced, baseinduced or free-radical chain polymerisation.

Further possible polymerisation processes for monomers are disclosed, for example, in WO2010/136111, WO 2010/136110, DE 102010027320.1 and DE 102010006377.0.

The present invention furthermore relates to a multilayer structure which comprises a layer which comprises a mixture according to the invention or a polymer or dendrimer according to the invention.

A multilayer structure in the present invention is taken to mean a multilayer structure comprising two or more layers, which are preferably applied successively to a glass support. The layers may comprise individual compounds according to the invention. It is preferred for the layers to comprise further compounds or polymers or dendrimers having different properties.

The present invention furthermore relates to a formulation, in particular a solution, dispersion or emulsion, comprising a mixture according to the invention or a polymer or dendrimer according to the invention and at least one solvent. Solvents which can be employed are all conceivable ones which are capable of dissolving the compounds according to the invention or forming a suspension with them. The following solvents are preferred here in accordance with the invention: dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methyl ethyl ketone, 1,2-dichloroethane, 1,1,1-trichloroethane, 1,1,2,2-tetrachloroethane, ethyl acetate, n-butyl acetate, dimethylformamide, dimethylacetamide, dimethyl sulfoxide, tetralin, decalin, indane and/or mixtures thereof.

The concentration of the mixture according to the invention or the polymer or dendrimer according to the invention in the solution is preferably 0.1 to 10% by weight, more preferably 0.5 to 5% by weight, based on the total weight of the solution. The solution optionally also comprises one or more binders in order to adjust the rheological properties of the solution correspondingly, as described, for example, in WO 2005/055248 A1.

After appropriate mixing and ageing of the solutions, these are divided into one of the following categories: "full" solution, "borderline" solution or insoluble. The border line is drawn between these categories with reference to the solubility parameters. The corresponding values can be obtained from the literature, such as, for example, from "Crowley, J. D., Teague, G. S. Jr. and Lowe, J. W. Jr., Journal of Paint Technology, 38, No. 496, 296 (1966)".

Solvent mixtures can also be used and are identified as described in "Solvents, W. H. Ellis, Federation of Societies for Coatings Technology, pp. 9 to 10, 1986". Processes of this type can result in a mixture of so-called "non"-solvents which dissolve the composition, although it is desirable to have at least one true solvent in the mixture.

A further preferred form of the formulation is an emulsion, and more preferably a miniemulsion, which are prepared, in particular, as heterophase systems, in which stable nanodroplets of a first phase are dispersed in a second continuous phase.

Both a miniemulsion, in which the continuous phase is a polar phase, and also an inverse miniemulsion, in which the continuous phase is a non-polar phase, can be used in the present invention. The preferred form is a miniemulsion. In order to increase the kinetic stability of the emulsion, surfactants can also be admixed. The choice of the solvents for two-phase systems, the surfactants and the processing to give a stable miniemulsion should be known to a person skilled in the art in this area on the basis of his expert knowledge or through numerous publications, such as, for example, a comprehensive article by Landfester in Annu. Rev, Mater. Res. (06), 36, p. 231.

For use of so-called thin layers in electronic or optoelectronic devices, the mixture according to the invention, the polymer or dendrimer according to the invention or a formulation thereof can be deposited by a correspondingly suitable process. Liquid coating of devices, such as, for example, of OLEDs, is more desirable than vacuum deposition techniques. Deposition methods from solution are particularly preferred. Preferred deposition techniques include, without correspondingly restricting the invention, dip coating, spin coating, ink-jet printing, letterpress printing, screen printing, doctor blade coating, roller printing, reverse roller printing, offset lithography, flexographic printing, web printing, spray coating, brush coating or pad printing and slot-die coating. Ink-jet printing is particularly preferred and enables the production of high-resolution displays.

The solutions according to the invention can be applied to prefabricated device substrates with the aid of ink-jet printing or by microdispensing. To this end, preference is given to the use of industrial piezoelectric print heads, such as from Aprion, Hitachi-Koki, Inkjet Technology, On Target Technology, Picojet, Spectra, Trident, Xaar, in order to apply the organic semiconductor layers to a substrate. In addition, semi-industrial print heads, such as those from Brother, Epson, Konika, Seiko Instruments, Toshiba TEC or single-nozzle microdispensing equipment, as manufactured, for example, by Mikrodrop and Mikrofab, can also be used.

In order that the compound according to the invention can be applied by ink-jet printing or microdispensing, it should first be dissolved in a suitable solvent. The solvents must meet the above-mentioned requirements and must not have any disadvantageous effects on the print head selected. In addition, the solvents should have a boiling point of above 100° C., preferably above 140° C. and more preferably above 150° C., in order to avoid processing problems caused by drying-out of the solution inside the print head.

Besides the above-mentioned solvents, the following solvents are also suitable: substituted and unsubstituted xylene derivatives, di-$C_{1-2}$-alkylformamides, substituted and unsubstituted anisoles and other phenol ether derivatives, substituted heterocycles, such as substituted pyridines, pyrapsines, pyrimidines, pyrrolidinones, substituted and unsubstituted N,N-di$C_{1-2}$-alkylanilines and other fluorinated or chlorinated aromatic compounds.

A preferred solvent for the deposition of the mixture according to the invention or the polymer according to the invention by ink-jet printing comprises a benzene derivative which contains a benzene ring which is substituted by one or more substituents, in which the total number of carbon atoms of the one or more substituents is at least three. Thus, for example, the benzene derivative may be substituted by a propyl group or three methyl groups, where in each case the total number of carbon atoms must be at least three. A solvent of this type enables the formation of an ink-jet liquid which comprises the solvent with the mixture according to the invention or the polymer or dendrimer according to the invention, and reduces or prevents clogging of the nozzles and separation of the components during spraying. The solvent(s) can be selected from the following example list: dodecylbenzene, 1-methyl-4-tert-butylbenzene, terpineollimonene, isodurol, terpinolene, cymol and dethylbenzene. The solvent may also be a solvent mixture comprising two or more solvents, where each of the solvents preferably has a boiling point of greater than 100° C., more preferably greater than 140° C. Solvents of this type promote film formation of the deposited layer and reduce layer errors.

The ink-jet liquid, (i.e. a mixture, preferably of solvent(s), binder and the compound according to the invention) preferably has a viscosity at 20° C. of 1 to 100 mPa·s, more preferably 1 to 50 mPa·s and most preferably 1 to 30 mPa·s.

The mixture, polymer or dendrimer or formulation according to the invention may additionally comprise one or more further components, such as, for example, surface-active substances, lubricants, wetting agents, dispersants, water-repellent agents, adhesives, flow improvers, antifoaming agents, air deposition agents, diluents, which may be reactive or unreactive substances, assistants, colorants, dyes or pigments, sensitisers, stabilisers or inhibitors.

The invention furthermore relates to the use of the above-mentioned mixtures, polymers or dendrimers according to the invention in an organic electroluminescent device. The mixtures, polymers or dendrimers according to the invention are preferably formed here as or in an electroluminescent layer. A layer is preferably formed by applying a formulation according to the invention to a support and subsequently removing the solvent.

The present invention furthermore relates to an electronic device containing a mixture, polymer, dendrimer or formulation according to the invention.

The electronic device is preferably an organic electroluminescent device, preferably comprising a cathode, an anode and at least one organic layer, where the organic layer comprises the mixture, polymer, dendrimer or formulation according to the invention.

As just stated, the organic layer which comprises the mixture, polymer, dendrimer or formulation according to the invention is preferably the emitting layer. In addition, the organic electroluminescent device may comprise further layers selected from in each case one or more hole-injection layers, hole-transport layers, hole-blocking layers, electron-transport layers, electron-injection layers, electron-blocking layers, charge-generation layers and/or layers which generate organic or inorganic P/N junctions. The electroluminescent device may in addition comprise further emitting layers. So-called interlayers, which have, for example, an exciton-blocking function, are preferably introduced between two emitting layers. However, it should be pointed out that each of these layers does not necessarily have to be present.

The organic electroluminescent device preferably has a planar shape and/or is in the form of a fibre.

A fibre in the sense of the present invention is taken to mean any shape in which the ratio between length to diameter is greater than or equal to 10:1, preferably 100:1, where the shape of the cross section along the longitudinal axis is not important. The cross section along the longitudinal axis may accordingly be, for example, round, oval, triangular, rectangular or polygonal. Light-emitting fibres have preferred properties with respect to their use. Thus, they are suitable, inter alia, for use in the area of therapeutic and/or cosmetic phototherapy. Further details in this respect are described in the prior art (for example in U.S. Pat. No.

6,538,375, US 2003/0099858, Brenndan O'Connor et al. (Adv. Mater. 2007, 19, 3897-3900 and the unpublished patent application EP 10002558.4).

If the organic electroluminescent device comprises a plurality of emitting layers, where at least one emitting layer comprises the mixture, polymer or dendrimer according to the invention, these plurality of layers preferably have in total a plurality of emission maxima between 380 nm and 750 nm, resulting overall in white emission, i.e. various emitting compounds which are able to fluoresce or phosphoresce are used in the emitting layers. Particular preference is given to three layer systems, where the three layers exhibit blue, green and orange or red emission, for the basic structure see, for example, WO 2005/011013.

The various layers can be applied differently for the purposes of the invention. For example, one or more layers in the electroluminescent device according to the invention can be applied from solution and one or more layers can be applied via a sublimation process, in which the materials are applied by vapour deposition in vacuum sublimation units at a pressure $<10^{-5}$ mbar, preferably $<10^{-6}$ mbar, particularly preferably $<10^{-7}$ mbar. It is likewise possible to apply one or more layers by means of OVPD (organic vapour phase deposition) processes or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., Appl. Phys. Lett. 2008, 92, 053301).

However, it is particularly preferred for one or more layers in the organic electroluminescent device to be applied from solution, for example by spin coating or by means of any desired printing process, such as, for example, screen printing, flexographic printing or offset printing. But particularly preferably LITI (light induced thermal imaging, thermal transfer printing), or ink-jet printing. These processes are generally known to the person skilled in the art and can be applied by him without problems to organic electroluminescent devices.

The device usually comprises a cathode and an anode (electrodes). The electrodes (cathode, anode) are selected for the purposes of this invention in such a way that their work function corresponds as well as possible to the potential of the adjacent organic layer in order to ensure the most efficient electron or hole injection possible.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm, more preferably 2-8 nm.

The anode preferably comprises materials having a high work function.

The anode preferably has a potential of greater than 4.5 eV vs. vacuum.

Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to enable either irradiation of the organic material (O—SCs) or the coupling-out of light (OLEDs/PLEDs, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers.

The device is correspondingly structured in a manner known per se, depending on the application, provided with contacts and finally hermetically sealed, since the lifetime of devices of this type is drastically shortened in the presence of water and/or air.

The organic electroluminescent device according to the invention is preferably selected from the group consisting of organic electroluminescent devices (OLEDs), organic field-effect transistors (O-FETs), organic thin-film transistors (O-TFTs), organic light-emitting transistors (O-LETs), organic integrated circuits (O-ICs), organic solar cells (O—SCs), organic field-quench devices (O-FQDs), organic light-emitting electrochemical cells (OLECs), light-emitting electrochemical transistors, organic photoreceptors, "organic plasmon diode", "organic plasmon emitting device" or organic laser diodes (O-lasers). Particular preference is given to organic electroluminescent devices.

It should be pointed out that variations of the embodiments described in the present invention fall within the scope of this invention. Each feature disclosed in the present invention can, unless explicitly excluded, be replaced by alternative features which serve the same, an equivalent or a similar purpose. Thus, each feature disclosed in the present invention should, unless stated otherwise, be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, should be regarded as inventive themselves and not merely as part of the embodiments of the present invention. Independent protection may be granted for these features in addition or as an alternative to each invention claimed at present.

The teaching regarding technical action disclosed with the present invention can be abstracted and combined with other examples.

The invention is explained in greater detail by the following examples without wishing it to be restricted thereby.

SYNTHESIS AND WORKING EXAMPLES

The following materials were used in this invention:

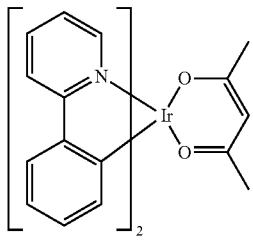

E1

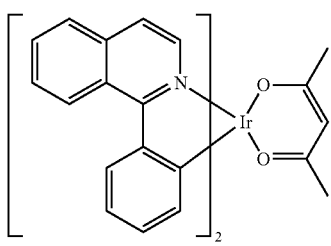

E2

E1 is a green triplet emitter, and was synthesised in accordance with J. Am. Chem. Soc. 2001, 123, 4304-4312. E2 is a red triplet emitter, and was synthesised in accordance with US 20030072964 A1.

The synthesis of further compounds is described below:

Example 1

Synthesis of 2,4-bisbiphenyl-3-yl-6-(3-bromophenyl)-1,3,5-triazine

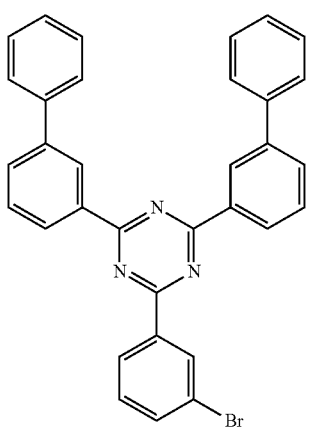 [SMILES: Brc1cccc(-c2nc(-c3cccc(-c4ccccc4)c3)nc(-c3cccc(-c4ccccc4)c3)n2)c1]

171 g (954 mmol) of biphenyl-3-carbonitrile [24973-50-0] are slowly added to a suspension of 60 ml (454 mmol) of 3-bromobenzoyl chloride [1711-09-7], 10 ml (137 mmol) of thionyl chloride and 60.6 g (454 mmol) of aluminium chloride in 800 ml of dichlorobenzene at 100° C. The temperature increases slightly and the reaction solution becomes an orange colour. The reaction is stirred at 115° C. until the cloudiness has disappeared. The reaction is cooled to 100° C., and aluminium chloride is added, and the mixture is stirred at 100° C. for 20 h. The solution is cooled to room temperature and poured into 3 liters of methanol, stirred for a further hour, and the resultant precipitate is filtered off with suction. The precipitate obtained in this way is washed in hot ethanol, filtered off with suction and dried in vacuo, giving 92 g (170 mmol) of a white solid.

Example 2

Synthesis of 2,4-bisbiphenyl-3-yl-6-(4'-vinylbiphenyl-3-yl)-1,3,5-triazine (M1)

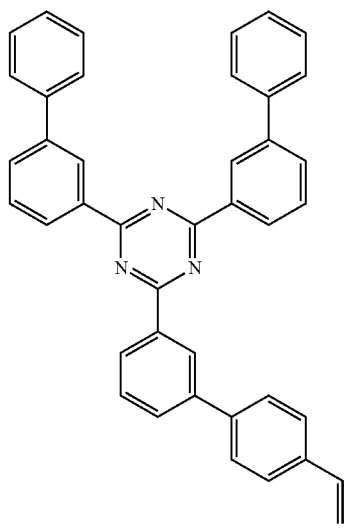 [SMILES: C=Cc1ccc(-c2cccc(-c3nc(-c4cccc(-c5ccccc5)c4)nc(-c4cccc(-c5ccccc5)c4)n3)c2)cc1]

50 g (92.5 mmol) of 2,4-bisbiphenyl-3-yl-6-(3-bromophenyl)-1,3,5-triazine and 13.8 g (93.2 mmol) of styreneboronic acid [2156-04-9] are dissolved in 300 ml of toluene, and 100 ml of a 2 M sodium carbonate solution are added. The reaction mixture is carefully degassed, and 200 mg of tetrakistriphenylphosphinepalladium are added, and the mixture is heated under reflux for 20 h. The solution is cooled to room temperature, and the phases are separated. The aqueous phase is extracted three times with toluene, the combined organic phases are subsequently washed twice with water, dried over magnesium sulfate, filtered, and the solvent is stripped off in vacuo. The residue is recrystallised from isopropanol, giving 18.8 g (33.3 mmol) (36%) of a white solid in a of purity 99.7%.

Example 3

Synthesis of 5'-p-vinylphenyl-1,1',3',5''-terphenyl (M2)

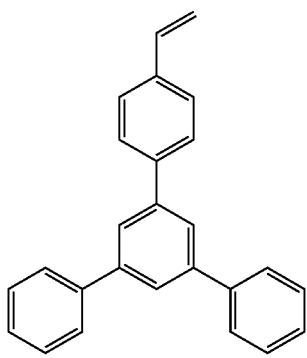 [SMILES: C=Cc1ccc(-c2cc(-c3ccccc3)cc(-c3ccccc3)c2)cc1]

35 g (113 mmol) of 5'-bromoterphenyl [103068-20-8] and 16.7 g (113 mmol) of styreneboronic acid [2156-04-9] are dissolved in 300 ml of toluene, and 100 ml of a 2 M sodium carbonate solution are added. The reaction mixture is carefully degassed, and 200 mg of tetrakistriphenylphosphinepalladium are added, and the mixture is heated under reflux for 20 h. The solution is cooled to room temperature, and the phases are separated. The aqueous phase is extracted three times with toluene, the combined organic phases are subsequently washed twice with water, dried over magnesium sulfate, filtered, and the solvent is stripped off in vacuo.

The residue is recrystallised from isopropanol, giving 14 g (42 mmol) (37%) of a white solid having a purity of 99.5%.

Example 4

Synthesis of [1,1';3',1'']terphenyl-5'-yl 4'-vinylbiphenyl-3-yl ketone (M3)

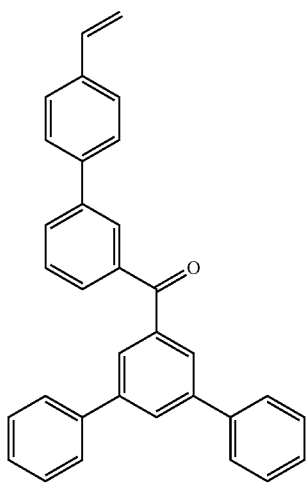 [SMILES: C=Cc1ccc(-c2cccc(C(=O)c3cc(-c4ccccc4)cc(-c4ccccc4)c3)c2)cc1]

25 g (60.5 mmol) of (3-bromophenyl)-[1';3',1'']terphenyl-5'-ylmethanone and 9 g (60.5 mmol) of styreneboronic acid [2156-04-9] are dissolved in 300 ml of toluene, and 100 ml of a 2 M sodium carbonate solution are added. The reaction mixture is carefully degassed, and 200 mg of tetrakistriphenylphosphinepalladium are added, and the mixture is heated under reflux for 20 h. The solution is cooled to room temperature, and the phases are separated. The aqueous phase is extracted three times with toluene, the combined organic phases are subsequently washed twice with water, dried over magnesium sulfate, filtered, and the solvent is stripped off in vacuo. The residue is recrystallised from heptane/acetonitrile 1:1, giving 12 g (27 mmol) (45%) of a white solid of purity 99.9%.

Example 5

Synthesis of diphenyl(4-vinylphenyl)amine (M4)

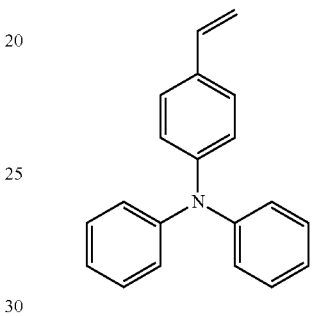

19 g (53 mmol) of methylphosphonium bromide is suspended in dried THF under protective gas, and 6 g (53 mmol) of potassium tert-butoxide are added in portions at 0° C.; an immediate colour change to orange takes place. 14 g (51.2 mmol) of N,N-diphenyl-p-aminobenzaldehyde are added to the reaction solution at 0° C. The mixture is warmed to room temperature and stirred for a further 20 h. The solvent is stripped off in vacuo, and the residue is taken up in dichloromethane, and the solution is extracted with water, dried over magnesium sulfate, filtered, and the solvent is stripped off in vacuo. The yellow oil obtained is chromatographed on silica gel, giving 12 g (44 mmol) (86%) of a white solid of purity 99.5%.

Further Monomers for Polymerisation by Means of Styryl Group

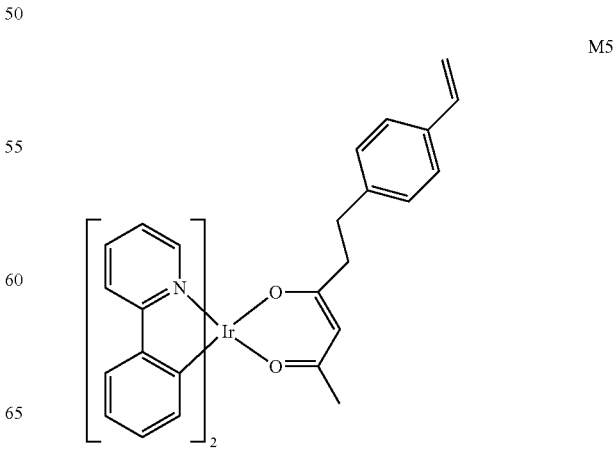

M5

M6

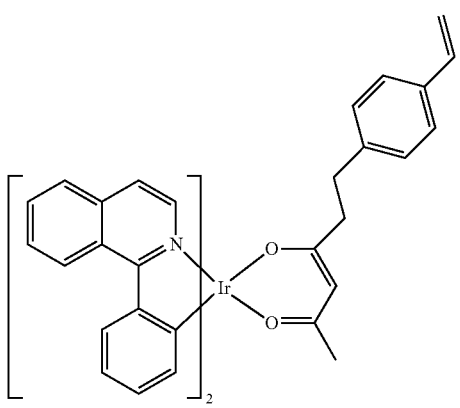

Synthesis of heteroleptic iridium complexes M5/M6

Step 1:

A mixture of 10 mmol of sodium bisacetylacetonatodichloroiridate(III) [770720-50-8] and 24 mmol of phenylpyridine or phenylisoquinoline is melted into a 50 ml glass ampoule in vacuo ($10^{-3}$ mbar). The ampoule is heated at the temperature indicated for the time indicated, with the melted mixture being stirred with the aid of a magnetic stirrer. After cooling (NOTE: the ampoules are usually under pressure!), the ampoule is opened, the sinter cake is stirred with 100 g of glass beads (diameter 3 mm) in 100 ml of dichloromethane for 3 h and mechanically digested in the process. The fine suspension is decanted off from the glass beads, the solid is filtered off with suction and dried in vacuo.

Step 2:

The crude chloro-bridged dimer of the formula [Ir(L)$_2$Cl]2 obtained in this way is suspended in 300 ml of acetone, 4.4 g (20 mmol) of silver(I) trifluoroacetate [2966-50-9] are added to the suspension, and the mixture is heated under reflux for 2 h. After cooling, the silver chloride precipitate is filtered off (P4), 4.8 g (22 mmol) of 6-(4-vinylphenyl)-2,4-hexanedione [59990-76-0], and 10 ml of triethylamine are added to the filtrate, and the mixture is stirred at room temperature for 20 h. After removal of the acetone in vacuo, the residue is taken up in 200 ml of dichloromethane and filtered through an aluminium oxide column (aluminium oxide, basic, activity grade 1) with a length of about 10 cm. After evaporation of the filtrate, the residue is chromatographed on aluminium oxide (aluminium oxide, basic, activity grade (1) with dichloromethane until a purity >99.5%, preferably greater than 99.9% (HPLC) has been reached.

Example 6

General Polymerisation Procedure for the Styryl Group as Polymerisable Group

Monomers M1-M4 and styrene (M5 and M6) in the composition indicated in Table 1 are dissolved in 20 ml of toluene in a concentration of 1 mol/l at 80° C. under protective gas. 64 mg of AIBN are subsequently added, and the mixture is stirred at 80° C. for a further 2 h. The reaction solution is cooled to room temperature, and the polymer is obtained by precipitation in 100 ml of methanol (slowly using Pasteur pipette). The white precipitate is filtered off with suction and subsequently re-dissolved in toluene and re-precipitated in methanol and filtered off with suction. The polymer is dried in a vacuum drying cabinet (VDC).

The molecular weights and yield of the polymers are listed in Table 2, where P2-P4 and P6-P8 are polymers according to the invention, and P1 and P5 are comparative polymers.

TABLE 1

Composition of the polymers in mol %

| Polymer | M1 | M2 | M3 | M4 | M5 | M6 |
|---------|----|----|----|----|----|----|
| P1 | 40 | 40 | 0 | 20 | 0 | 0 |
| P2 | 40 | 35 | 0 | 20 | 5 | 0 |
| P3 | 40 | 35 | 0 | 20 | 0 | 5 |
| P4 | 35 | 35 | 0 | 20 | 5 | 5 |
| P5 | 0 | 40 | 40 | 20 | 0 | 0 |
| P6 | 0 | 35 | 40 | 20 | 5 | 0 |
| P7 | 0 | 35 | 40 | 20 | 0 | 5 |
| P8 | 0 | 35 | 35 | 20 | 5 | 5 |

TABLE 2

Molecular weights and yield of the polymers

| Polymer | Mn [gmol$^{-1}$] | Mw [gmol$^{-1}$] | PD | Yield |
|---------|------------------|------------------|------|-------|
| P1 | 47.000 | 15.400 | 3.05 | 48% |
| P2 | 133.000 | 49.300 | 2.70 | 61% |
| P3 | 125.000 | 82.700 | 1.51 | 58% |
| P4 | 123.000 | 71.200 | 1.73 | 58% |
| P5 | 66.200 | 28.600 | 2.31 | 53% |
| P6 | 76.800 | 39.300 | 2.95 | 55% |
| P7 | 153.000 | 88.300 | 1.73 | 63% |
| P8 | 105.200 | 62.700 | 1.68 | 55% |

Example 7

4-[2-(2,5-Dibromophenyl)ethyl]phenyl}diphenylamine (S1)

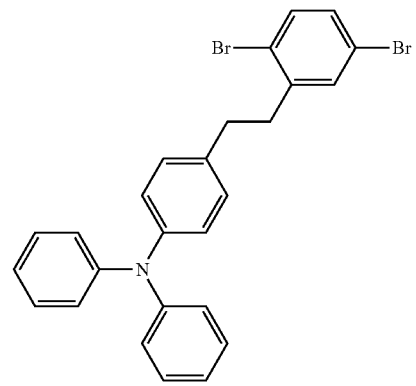 [SMILES: Brc1ccc(Br)c(CCc2ccc(N(c3ccccc3)c3ccccc3)cc2)c1]

13.1 g (48 mmol) of diphenyl(4-vinylphenyl)amine and 12 g (25 mmol) of 9-BBN dimer are dissolved in 200 ml of toluene at room temperature under protective gas and stirred for 20 h. During the reaction, the suspension of 9-BBN slowly dissolves. 17 g (48 mmol) of 1,4-dibromo-2-iodobenzene [89284-52-6] and 50 ml of a 1M NaOH solution are subsequently added to the reaction solution. The reaction mixture is carefully degassed, and 200 mg of tetrakistriphenylphosphinepalladium are added, and the mixture is heated under reflux for 20 h. The solution is cooled to room temperature, and the phases are separated. The aqueous phase is extracted three times with toluene, the combined organic phases are subsequently washed twice with water, dried over magnesium sulfate, filtered, and the solvent is stripped off in vacuo. The residue is recrystallised from ethanol/toluene 3:1, giving 23.6 g (46.6 mmol) (97%) of a white solid having a purity of 99.8%.

The following monomers S2-S4 are prepared analogously to the synthesis of monomer S1 (4-[(2,5-dibromophenyl)ethyl]phenyl}diphenylamine) from their corresponding vinyl compound.

Example 8

4'-[2-(2,5-Dibromophenyl)ethyl]biphenyl-3-yl}-[1,1'; 3',1"]terphenyl-5'-ylmethanone (S2)

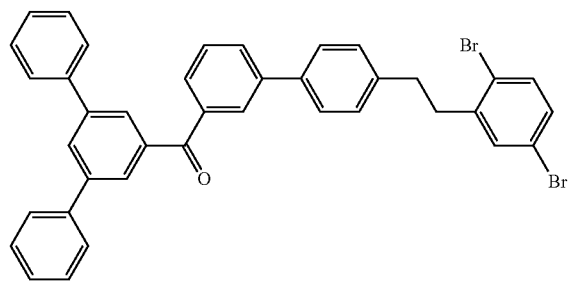 [SMILES: O=C(c1cccc(-c2ccc(CCc3cc(Br)ccc3Br)cc2)c1)c1cc(-c2ccccc2)cc(-c2ccccc2)c1]

Example 9

4-[2-(2,5-Dibromophenyl)ethyl]-[5'-phenyl][1,1'; 3',1"]terphenyl (S3)

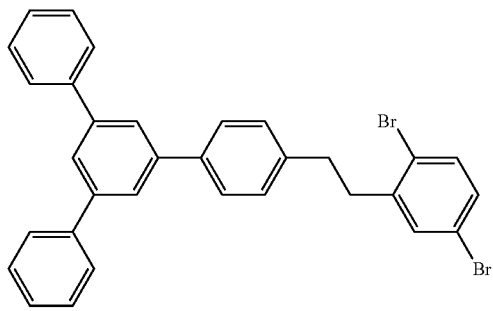 [SMILES: Brc1ccc(Br)c(CCc2ccc(-c3cc(-c4ccccc4)cc(-c4ccccc4)c3)cc2)c1]

Example 10

2,4-Bisbiphenyl-3-yl-6-{4'-[2-(2,5-dibromophenyl)ethyl]biphenyl-3-yl}-1,3,5-triazine (S4)

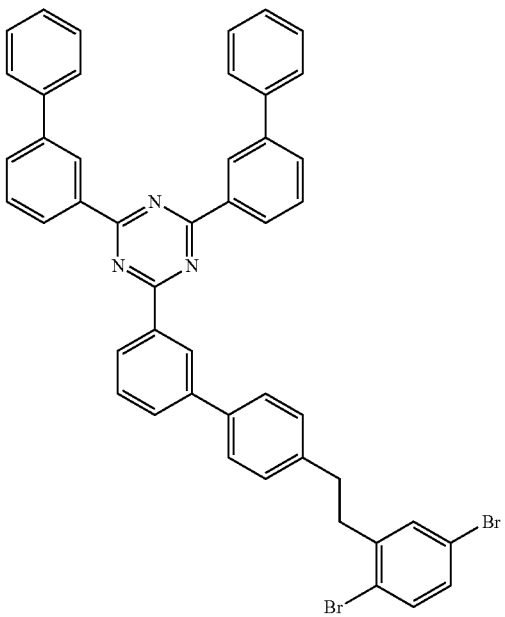 [SMILES: Brc1ccc(Br)c(CCc2ccc(-c3cccc(-c4nc(-c5cccc(-c6ccccc6)c5)nc(-c5cccc(-c6ccccc6)c5)n4)c3)cc2)c1]

Bis-(4-bromophenyl)diphenylsilane

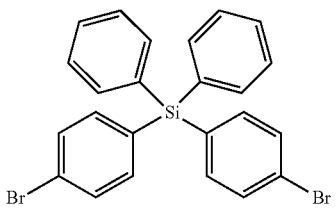 [SMILES: Brc1ccc([Si](c2ccccc2)(c2ccccc2)c2ccc(Br)cc2)cc1]

33.9 g (144 mmol) of 1,4-dibromobenzene are dissolved in 300 ml of absolute THF in a heat-dried 1000 ml four-necked flask with internal thermometer, stirrer bar, argon blanket and dropping funnel and cooled to −75° C. 90 ml (144 mmol) of n-butyllithium (1.6 M in hexane fraction) are added dropwise over the course of 30 minutes, the mixture is subsequently stirred at this temperature for 1 h. 15.3 ml (18.3 g, 72 mmol) of diphenyldichlorosilane in 60 ml of THF are then added dropwise at −75° C., and the mixture is warmed to room temperature overnight. The solvent is removed, the residue is suspended in dichloromethane and filtered. The solvent is removed from the filtrate, and the product is recrystallised twice from butanol and twice from heptane/toluene, giving 16.8 g (47% of theory) in a purity of 99.9% according to HPLC.

Bis-(4-borolanphenyl)diphenylsilane (S7)

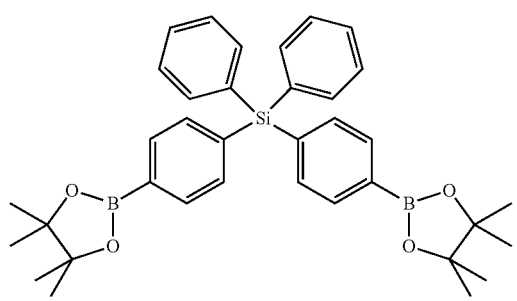

25.2 g (51 mol) of bis-(4-bromophenyl)diphenylsilane are dissolved in 250 ml of dioxane, and 25.9 g (102 mol) of bis(pinacolato)diborane and 10.83 g (2.9 molar equivalents, 0.11 mol) of potassium acetate are added. 1.11 g (1.4 mmol) of 1,1-bis(diphenylphosphino)ferrocenepalladium(II) chloride (complex with dichloromethane (1:1), Pd 13%) are subsequently added, and the batch is warmed to 110° C. After a TLC check, the batch is cooled to room temperature, and 200 ml of water are added, the phases are separated. The organic phase is washed water, and the aqueous phase is extracted with ethyl acetate, the combined organic phases are then dried over magnesium sulfate, filtered, and the solvent is stripped off in vacuo. The residue is recrystallised from ethanol, giving 12 g (27 mmol) (45%) of a white solid of purity 99.9%

Example 11

Further Monomers for the Suzuki Polymerisation

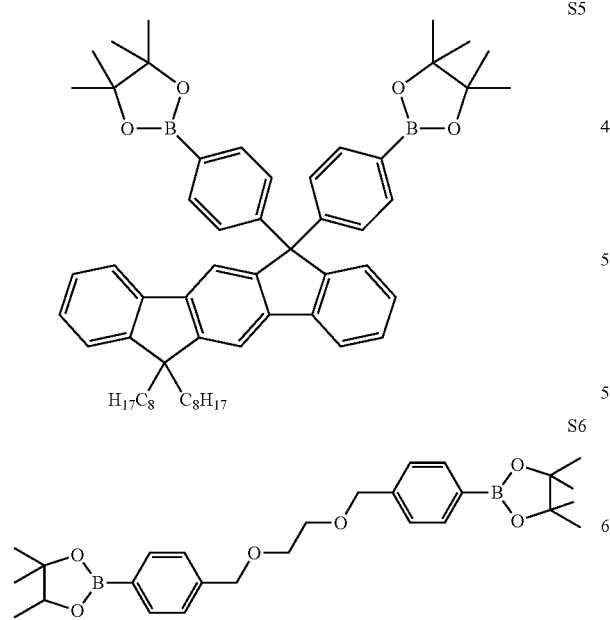

S5 and S6 are prepared in accordance with DE 102009023154.

General Synthesis for the Brominated Ir(Acac) Complexes S8 and S9

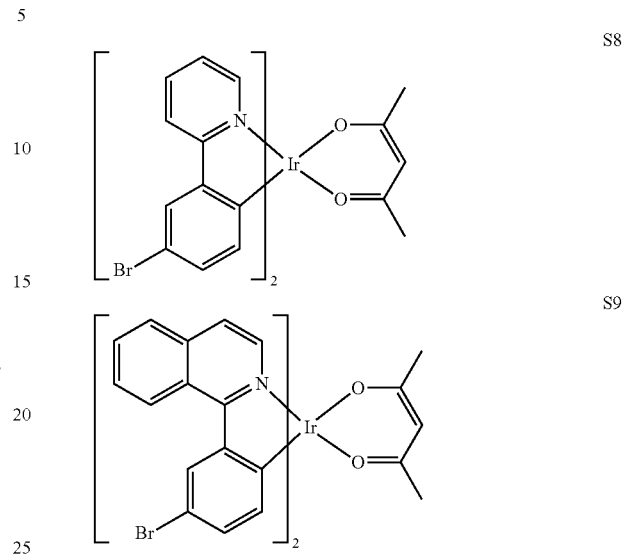

The chloro-bridged dimer of the formula $[Ir(L)_2Cl]2$ (18 mmol) is suspended in 300 ml of acetone, 4.4 g (45 mmol) of acetyl acetonate and 200 mg of sodium carbonate are added to the suspension, and the mixture is heated under reflux under an inert-gas atmosphere for 12-15 h. After cooling to room temperature, the precipitate is filtered off, and the filtrate is washed with water, heptane and acetone. The crude product is chromatographed on aluminium oxide (aluminium oxide, basic, activity grade (1) with dichloromethane until a purity >99.5%, preferably greater than 99.9% (HPLC) has been reached.

Example 12

General Polymerisation Procedure for the Suzuki Polymerisation of Monomers S1-S9 as Polymerisable Group Polymers P10-P12 and P14-P20 according to the invention and comparative polymer P9 and P13 are synthesised by SUZUKI coupling in accordance with WO 03/048225 A2 using the following monomers (percentages=mol %).

TABLE 3

| Composition of the polymers in mol % | | | | | | | | | |
|---|---|---|---|---|---|---|---|---|---|
| Polymer | S1 | S2 | S3 | S4 | S5 | S6 | S7 | S8 | S9 |
| P9 | 10 | 0 | 20 | 20 | 50 | 0 | 0 | 0 | 0 |
| P10 | 10 | 0 | 15 | 20 | 50 | 0 | 0 | 5 | 0 |
| P11 | 10 | 0 | 15 | 20 | 50 | 0 | 0 | 0 | 5 |
| P12 | 10 | 0 | 15 | 15 | 50 | 0 | 0 | 5 | 5 |
| P13 | 10 | 0 | 20 | 20 | 0 | 50 | 0 | 0 | 0 |
| P14 | 10 | 0 | 15 | 20 | 0 | 50 | 0 | 5 | 0 |
| P15 | 10 | 0 | 15 | 20 | 0 | 50 | 0 | 0 | 5 |
| P16 | 10 | 0 | 15 | 15 | 0 | 50 | 0 | 5 | 5 |
| P17 | 10 | 0 | 15 | 20 | 0 | 0 | 50 | 5 | 0 |
| P18 | 10 | 0 | 15 | 20 | 0 | 0 | 50 | 0 | 5 |
| P19 | 10 | 20 | 15 | 0 | 50 | 0 | 0 | 5 | 0 |
| P20 | 10 | 20 | 15 | 0 | 50 | 0 | 0 | 0 | 5 |

Example 13

Production of OLEDs

The production of an organic light-emitting diode (OLED) has already been described many times in the literature (for example in WO 2004/037887 A2). In order to explain the present invention by way of example, an OLED comprising polymers P1 to P20 from Tables 1-3 are produced by spin coating.

To this end, use is made of substrates from Technoprint (soda-lime glass) to which the ITO structure (indium tin oxide, a transparent, conductive anode) is applied.

The substrates are cleaned in a clean room with deionised (DI) water and a detergent (Deconex 15 PF) and then activated by UV/ozone plasma treatment. An 80 nm layer of PEDOT (PEDOT is a polythiophene derivative (Baytron P VAI 4083 sp.) from H. C. Starck, Goslar, which is supplied as an aqueous dispersion) is then applied as buffer layer by spin coating, likewise in the clean room. The requisite spin rate depends on the degree of dilution and the specific spin-coater geometry (typical for 80 nm: 4500 rpm). In order to remove residual water from the layer, the substrates are dried by heating on a hotplate at 180° C. for 10 minutes. Then, under inert-gas atmosphere (nitrogen or argon), firstly 20 nm of an interlayer (typically a hole-dominated polymer, here HIL-012 from Merck) and then 80 nm of the emitting layers (EML) are applied from toluene solutions (concentration of interlayer 5 g/l). The EML compositions in OLEDs is indicated in table. The two layers are dried by heating at 180° C. for at least 10 minutes. The Ba/Al cathode is then applied by vapour deposition (high-purity metals from Aldrich, particularly barium 99.99% (Order No. 474711); vapour-deposition units from Lesker or others, typical vapour-deposition pressure $5 \times 10^6$ mbar). In order to protect, in particular, the cathode against air and atmospheric moisture, the device is finally encapsulated and then characterised.

TABLE 4

The EML compositions in various OLEDs

| Device | EML compositions [wt %] | Solvent | Concentration [g/l] |
| --- | --- | --- | --- |
| OLED1 | 90% P1:5% E1:5% E2 | Toluene | 10 |
| OLED2 | 95% P2:5% E2 | Toluene | 10 |
| OLED3 | 95% P3:5% E1 | Toluene | 10 |
| OLED4 | 100% P4 | Toluene | 10 |
| OLED5 | 90% P5:5% E1:5% E2 | Toluene | 10 |
| OLED6 | 95% P6:5% E2 | Toluene | 10 |
| OLED7 | 95% P7:5% E1 | Toluene | 10 |
| OLED8 | 100% P8 | Toluene | 10 |
| OLED9 | 90% P9:5% E1:5% E2 | Toluene | 10 |
| OLED10 | 95% P10:5% E2 | Toluene | 10 |
| OLED11 | 95% P11:5% E1 | Toluene | 10 |
| OLED12 | 100% P12 | Toluene | 10 |
| OLED13 | 90% P13:5% E1:5% E2 | Toluene | 10 |
| OLED14 | 95% P14:5% E2 | Toluene | 10 |
| OLED15 | 95% P15:5% E1 | Toluene | 10 |
| OLED16 | 100% P16 | Toluene | 10 |
| OLED17 | 95% P17:5% E2 | Toluene | 10 |
| OLED18 | 95% P18:5% E1 | Toluene | 10 |
| OLED19 | 95% P19:5% E2 | Toluene | 10 |
| OLED20 | 95% P20:5% E1 | Toluene | 10 |

To this end, the devices are clamped into holders manufactured especially for the substrate size and provided with spring contacts. A photodiode with eye response filter can be attached directly to the measurement holder in order to exclude influences by extraneous light.

The voltages are typically increased from 0 to max. 20 V in 0.2 V steps and reduced again. For each measurement point, the current through the device and the photocurrent obtained from the photodiode is measured. In this way, the IVL data of the test devices are obtained. Important characteristic quantities are the measured maximum efficiency ("eff." in cd/A) and the voltage $U_{100}$ required for 100 cd/m².

In order, in addition, to know the colour and the precise electroluminescence spectrum of the test devices, the voltage required for 100 cd/m² is again applied after the first measurement, and the photodiode is replaced by a spectrum measuring head. This is connected to a spectrometer (Ocean Optics) by an optical fibre. The colour coordinates (CIE: Commission International de l'éclairage, 1931 standard observer) can be derived from the measured spectrum.

TABLE 5

Device results of the devices according to the invention and comparison thereof

| Device | CIE [x:y] | U [V] @ 100 nits | Max. eff. [cd/A] | EQE [%] |
| --- | --- | --- | --- | --- |
| OLED1 | 0.68:0.32 | 5.8 | 5.1 | 7.6% |
| OLED2 | 0.68:0.32 | 5.4 | 7.2 | 10.7% |
| OLED3 | 0.68:0.31 | 5.5 | 6.6 | 9.1% |
| OLED4 | 0.67:0.32 | 5.2 | 8.5 | 9.8% |
| OLED5 | 0.68:0.32 | 5.2 | 5.7 | 8.7% |
| OLED6 | 0.68:0.32 | 5.1 | 6.7 | 10.0% |
| OLED7 | 0.67:0.32 | 5.2 | 7.5 | 8.6% |
| OLED8 | 0.68:0.31 | 4.9 | 6.6 | 9.3% |
| OLED9 | 0.68:0.32 | 5.8 | 5.4 | 8.3% |
| OLED10 | 0.68:0.32 | 5.5 | 8.6 | 9.7% |
| OLED11 | 0.68:0.31 | 5.6 | 7.5 | 10.4% |
| OLED12 | 0.67:0.31 | 5.4 | 7.4 | 9.8% |
| OLED13 | 0.68:0.32 | 6.1 | 4.4 | 6.6% |
| OLED14 | 0.67:0.32 | 5.6 | 7.4 | 8.5% |
| OLED15 | 0.68:0.33 | 5.7 | 6.8 | 11.6% |
| OLED16 | 0.67:0.33 | 5.4 | 9.6 | 10.7% |
| OLED17 | 0.68:0.32 | 6.1 | 5.8 | 8.9% |
| OLED18 | 0.67:0.32 | 6.2 | 6.1 | 7.0% |
| OLED19 | 0.68:0.32 | 5.3 | 6.1 | 9.3% |
| OLED20 | 0.67:0.31 | 5.1 | 7.1 | 9.4% |

As can be seen from the results, OLED2 and OLED3 represent a significant improvement with respect to the efficiency over OLED1, as do OLED4 and OLED6 over OLED5, OLED10 and OLED11 over OLED9, OLED14 and OLED15 over OLED13. OLED1, OLED5, OLED9 and OLED13 are devices in accordance with the prior art in which two separate triplet emitters E1 and E2 are simultaneously doped into the matrix. And OLED2, OLED3, OLED4, OLED6, OLED10, OLED11, OLED14, OLED15 and OLED17-20 are devices according to the invention in which at least one of the emitters is covalently bonded to the matrix (polymer).

OLED4, OLED8, OLED12 and OLED16 are likewise devices according to the invention in which two emitters are covalently bonded to the matrix (polymer). These likewise exhibit a significant improvement over OLEDs in accordance with the prior art with respect to the efficiency.

The cause of the efficient energy transfer of the OLEDs according to the invention is thought to be the covalent bonding of emitting units in the matrix. On the basis of the present technical teaching according to the invention, it will be possible to achieve further optimisations by means of different possibilities without being inventive. Thus, a further optimisation can be achieved, for example through the use of another E™, and or HTM, and/or emitter units in the matrices.

Example 14

Synthesis of 9-(4-vinylphenyl)-10-(2'-naphthyl)anthracene (M7)

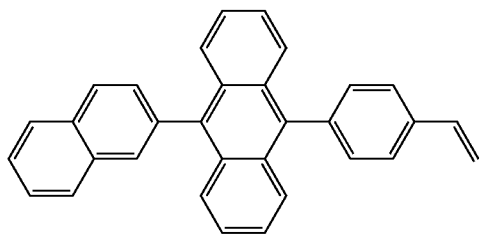 [SMILES: C=Cc1ccc(-c2c3ccccc3c(-c3ccc4ccccc4c3)c3ccccc23)cc1]

25 g (65.2 mmol) of (9-bromo-10-naphthylphenyl)anthracene [474688-73-8] and 9.7 g (60.5 mmol) of styreneboronic acid [2156-04-9] are dissolved in 300 ml of toluene, and 100 ml of a 2 M sodium carbonate solution are added. The reaction mixture is carefully degassed, and 200 mg of tetrakistriphenylphosphinepalladium are added, and the mixture is heated under reflux for 20 h. The solution is cooled to room temperature, and the phases are separated. The aqueous phase is extracted three times with toluene, the combined organic phases are subsequently washed twice with water, dried over magnesium sulfate, filtered, and the solvent is stripped off in vacuo. The residue is recrystallised from heptane/acetonitrile 1:1, giving 11.1 g (27.4 mmol) (42%) of a pale-green solid of purity 99.9%.

Example 15

General Polymerisation Procedure for the PS-PEO Block Copolymers

The PS-PEO block copolymers in accordance with the following general formula

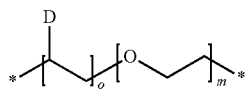

are synthesised in accordance with the following general procedures, where D can be different functional groups.

General Polymerisation Procedure:

Monomers M1-M4 and M7 in the composition indicated in Table 6 are dissolved in 20 ml of toluene in a concentration of 1 mol/l at room temperature under protective gas. 5 mol/% of sec butyllithium (2 M in hexane) are subsequently added, and the mixture is stirred at room temperature for a further 2 h. The amount of ethylene oxide indicated in Table 6 is subsequently added to the reaction solution for end-group functionalisation. The polymerisation is re-initiated by the addition of potassium tert-butoxide and 0.5 eq of DMSO, based on the toluene employed. The polymerisation is stopped by the addition of 0.1M methanolic HCl solution. and the polymer is obtained by precipitation in 100 ml of methanol (slowly using Pasteur pipette). The white precipitate is filtered off with suction and subsequently re-dissolved in toluene and re-precipitated in methanol and filtered off with suction. The polymer is dried in a VDC.

The molecular weights and yield of the polymers are listed in Table 7.

TABLE 6

Composition of the polymers in mol %

| Polymer | M1 | M2 | M3 | M4 | M7 | Ethylene oxide |
|---|---|---|---|---|---|---|
| P21 | 80 | | | | | 20 |
| P22 | 40 | 40 | | | | 20 |
| P23 | | | 80 | | | 20 |
| P24 | | | | 80 | | 20 |
| P25 | | | | | 80 | 20 |

TABLE 7

Molecular weights and yield of the polymers

| Polymer | Mn [gmol$^{-1}$] | Mw [gmol$^{-1}$] | PD | Yield |
|---|---|---|---|---|
| P21 | 47.000 | 15.400 | 1.05 | 48% |
| P22 | 133.000 | 49.300 | 1.37 | 61% |
| P23 | 125.000 | 82.700 | 1.31 | 58% |
| P24 | 123.000 | 71.200 | 1.34 | 58% |
| P25 | 66.200 | 28.600 | 1.12 | 53% |

Example 16

Formulations Comprising PS-PEO Block Copolymers and Other Functional Compounds

Solutions, as summarised in Table 8, are prepared as follows, where LiTrf stands for lithium trifluoromethanesulfonate (LiTf, 99.995% metal basis; Aldrich), and E3 in the following formula is a singlet blue emitter. E3 is synthesised in accordance with WO 2008/006449.

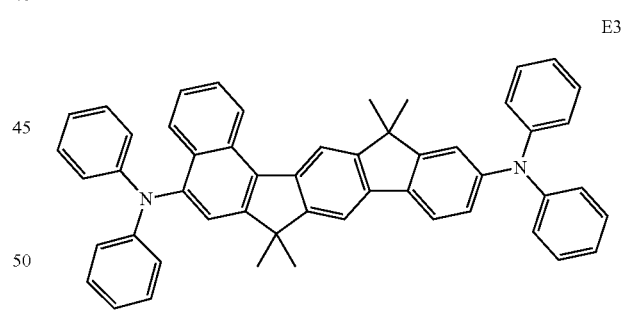

E3

Firstly, the polymers and the emitters in accordance with the composition indicated in Table 8 are dissolved in cyclohexanone in a concentration of 10 mg/ml and stirred until the solution is clear. The solution is filtered using a Millipore Millex LS, hydrophobic PTFE 5.0 μm filter. The solutions are the first master solutions.

The second master solution is prepared as follows: the LiTrf is dissolved in cyclohexanone in a concentration of 5 mg/l ml and stirred until the solution is clear. The solution is filtered using a "Millipore Millex HV, 0.45 μm, PVDF" filter.

Solutions OLEC1 to 4 are prepared by mixing the first master solution and the second master solution in a volume ratio of 1:0.066. The solutions are then stirred for 3 h.

Solutions OLEC1 to 4 are used in order to coat the emitting layer of OLECs. The corresponding solids composition can be obtained by evaporating the solvent of the solutions. This can be used for the preparation of further formulations.

TABLE 8

The EML compositions in various OLECs

| Device | EML compositions [wt %] | Solvent | Concentration [g/l] |
|---|---|---|---|
| OLEC1 | P21:20% E1:2.5% LiTrf | cyclohexanone | 10 |
| OLEC2 | P22:20% E1:2.5% LiTrf | cyclohexanone | 10 |
| OLEC3 | P23:20% E1:2.5% LiTrf | cyclohexanone | 10 |
| OLEC4 | P25:7% E3:2.5% LiTrf | cyclohexanone | 10 |

Example 17

Production of OLECs

OLEC1-4 having the layer structure: ITO/PEDOT/interlayer/EML/cathode are built as follows. Apart from the interlayer, the production is identical to that of the OLEDs as described above in Example 13.

The EML compositions in various OLECs is indicated in Table 8. The EML layer is applied by spin coating, and dried by heating at 50° C. for at least 30 minutes. The 100 nm Al cathode is then applied by vapour deposition (high-purity metals from Aldrich, particularly barium 99.99% (Order No. 474711); vapour-deposition equipment from Lesker amongst others, typical vapour-deposition pressure $5 \times 10^{-6}$ mbar). In order to protect, in particular, the cathode against air and atmospheric moisture, the device is finally encapsulated and then characterised.

OLEC1-4 are characterised using the method as described in Examples 13.

TABLE 9

Device results of the devices according to the invention and comparison thereof

| Device | CIE [x:y] | U [V] @ 100 nits | Max. eff. [cd/A] | EQE [%] |
|---|---|---|---|---|
| OLEC1 | 0.32:0.63 | 3.2 | 12.97 | 3.6% |
| OLEC2 | 0.31:0.63 | 3.4 | 10.01 | 2.8% |
| OLEC3 | 0.32:0.62 | 3.1 | 15.16 | 4.3% |
| OLEC4 | 0.14:0.18 | 3.7 | 2.34 | 1.9% |

The invention claimed is:
1. A mixture comprising
 (a) a compound A which contains at least one phosphorescent emitter unit, and
 (b) a compound B which contains at least one emitting unit,
 wherein
 compound A is a polymer which comprises in the side chain a hole injection/hole transport unit that is triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole or furan derivatives or further O-, S- or N-containing heterocycles having a high highest occupied molecular orbital (HOMO)
 and compound B is a low molecular weight compound having a molecular weight of less than 4000 g/mol and in which the at least one emitting unit of compound B is a phosphorescent emitter unit
 wherein the phosphorescence emitter units are compounds which comprise copper, molybdenum, tungsten, rhenium, ruthenium, osmium, rhodium, iridium, palladium, platinum, silver, gold or europium.

2. The mixture according to claim 1, in which the polymer contains at least one recurring unit selected from the group of the host materials.

3. The mixture according to claim 1, in which the at least one emitting unit of compound B is a fluorescent emitter unit.

4. The mixture according to claim 1, in which the phosphorescent emitter unit is a unit which contains a metal-ligand coordination compound.

5. The mixture according to claim 1, in which compound A is a polymer which contains a main-chain backbone.

6. The mixture according to claim 5, in which the polymer has a side chain.

7. The mixture according to claim 5, in which the polymer is a conjugated or non-conjugated polymer.

8. The mixture according to claim 7, in which the emitting unit is present either as a recurring unit in the main-chain backbone or in a side chain.

9. The mixture according to claim 6, in which a charge-transport unit is present in a side chain.

10. The mixture according to claim 9, in which the charge-transport unit is a hole-transport unit or an electron-transport unit.

11. The mixture according to claim 9, in which charge-transport units are present in two side chains, where one charge-transport unit is a hole-transport unit and the other charge-transport unit is an electron-transport unit.

12. The mixture according to claim 5, in which the main-chain backbone has a triplet level having a higher energy than the triplet level of the phosphorescent emitter unit of compound A and the emitter unit of compound B.

13. The mixture according to claim 1, in which the maximum of the emission band of one of compounds A and B is at a shorter wavelength than the maximum of the emission band of the other compound.

14. The mixture according to claim 1, in which the emission band of compound A is in a wavelength range which overlaps with the wavelength range of the absorption band of compound B.

15. The mixture according to claim 1, in which the maximum of the emission band of compound A is in the wavelength region of blue light and the maximum of the emission band of compound B is in the wavelength region of green or red light.

16. The mixture according to claim 1, in which the maximum of the emission band of compound A is in the wavelength region of green light and the maximum of the emission band of compound B is in the wavelength region of red light.

17. An electronic device comprising the mixture according to claim 1.

18. The electronic device according to claim 17, wherein the device is selected from the group consisting of an organic light-emitting diode, an organic light-emitting electrochemical cell, an organic light-emitting transistor, an organic integrated circuit, an organic field-effect transistor, an organic thin-film transistor, an organic solar cell, a dye-sensitised organic solar cell, an organic optical detector, an organic photoreceptor, an organic field-quench device, an organic laser diode and an organic plasmon emitting device.

19. A formulation comprising at least one mixture according to claim 1 and at least one solvent.

20. The mixture according to claim 1, wherein compound B is a low molecular weight compound having a molecular weight of less than or equal to 3500 g/mol.

21. The mixture according to claim 1, wherein compound B is a low molecular weight compound having a molecular weight of less than or equal to 3000 g/mol.

22. The mixture as claimed in claim 1, wherein the polymer contains a phosphorescent emitter unit A1 and an emitting unit B1, where units A1 and B1 are not in conjugation with one another and the polymer contains recurring units of the formula (265)-(296):

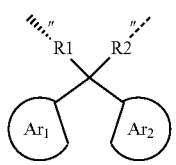
formula (265)

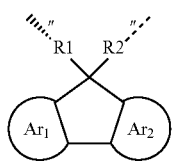
formula (266)

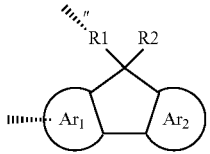
formula (267)

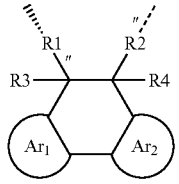
formula (268)

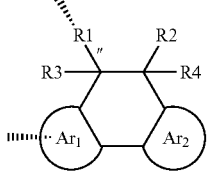
formula (269)

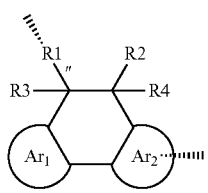
formula (270)

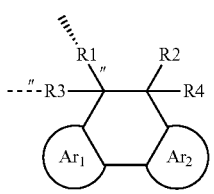
formula (271)

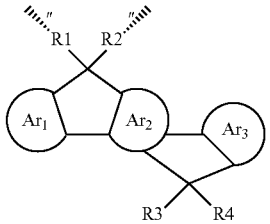
formula (272)

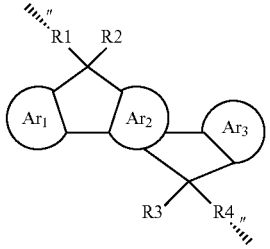
formula (273)

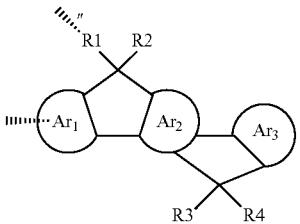
formula (274)

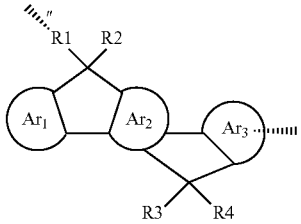
formula (275)

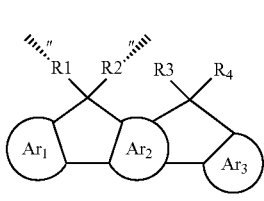
formula (276)

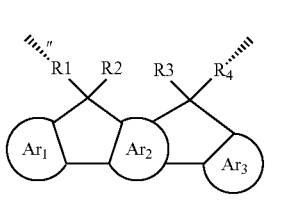
formula (277)

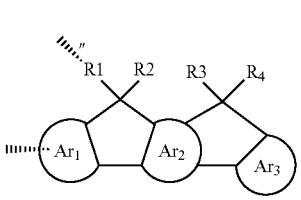
formula (278)

formula (279)
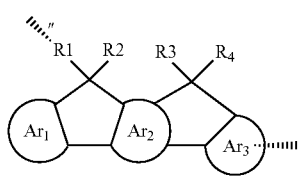
formula (280)
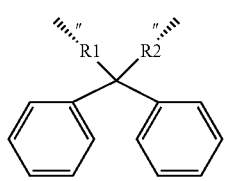
formula (281)
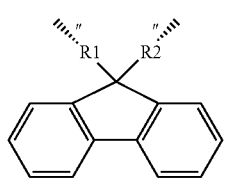
formula (282)
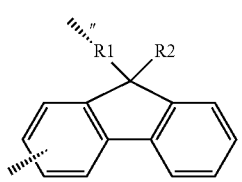
formula (283)
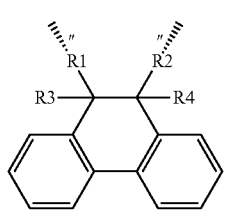
formula (284)
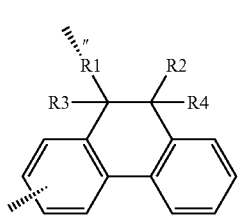
formula (285)
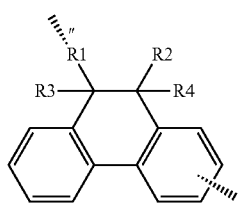
formula (286)
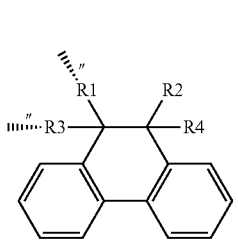
formula (287)
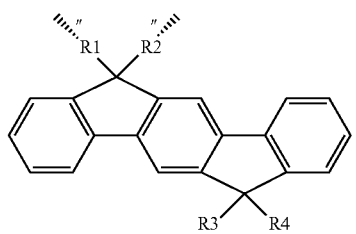
formula (288)
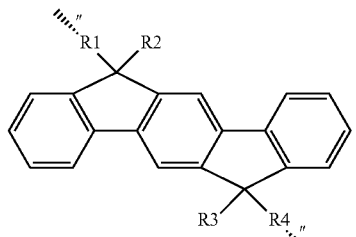
formula (289)
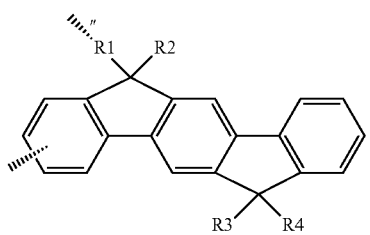
formula (290)
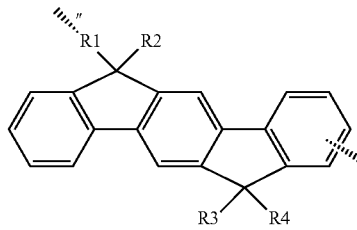
formula (291)
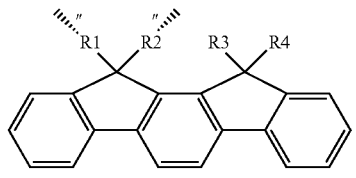
formula (292)
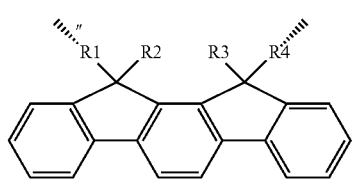
formula (293)
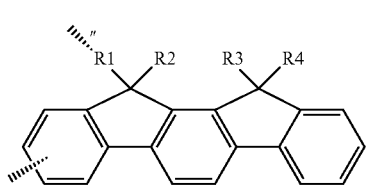

-continued formula (294)

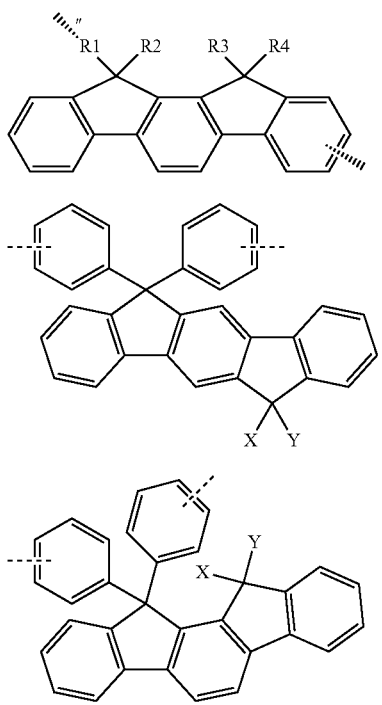

formula (295)

formula (296)

wherein
where $Ar_1$, $Ar_2$ and $Ar_3$ each, independently of one another, denote an aromatic or heteroaromatic group having 5 to 60 ring atoms;
R1, R2, R3, and R4 each, independently of one another, denote alkyl(ene), cycloalkyl(ene), alkylsilyl(ene), silyl(ene), arylsilyl(ene), alkylalkoxyalkyl(ene), arylalkoxyalkyl(ene), alkylthioalkyl(ene), phosphine, phosphine oxide, sulfone, alkylene sulfone, sulfone oxide, alkylene sulfone oxide, where the alkylene) group in each case has, independently of one another, 1 to 12 C atoms and where one or more H atoms is optionally replaced by F, Cl, Br, I, alkyl, heteroalkyl, cycloalkyl, an aryl or heteroaryl group; and
X and Y are each selected, independently of one another, from H, F, an alkyl group having 1 to 40 carbon atoms, an alkenyl group having 2 to 40 carbon atoms, an alkynyl group having 2 to 40 carbon atoms, a substituted or unsubstituted aromatic hydrocarbon radical having 6 to 40 ring atoms and a substituted or unsubstituted heteroaromatic hydrocarbon radical having 5 to 25 ring atoms.

23. The mixture according to claim 22, in which unit A1 is a recurring unit in the main-chain backbone of the polymer and unit B1 is bonded as side chain to the main-chain backbone.

24. The mixture according to claim 22, in which units A1 and B1 are recurring units in the main-chain backbone of the polymer.

* * * * *